United States Patent
Bai et al.

(10) Patent No.: US 11,307,431 B2
(45) Date of Patent: Apr. 19, 2022

(54) LASER PROJECTION MODULES AND METHODS FOR DETECTING FRACTURE THEREOF, DEPTH CAMERAS AND ELECTRONIC DEVICES

(71) Applicant: GUANGDONG OPPO MOBILE TELECOMMUNICATIONS CORP., LTD., Guangdong (CN)

(72) Inventors: Jian Bai, Guangdong (CN); Jie Lyu, Guangdong (CN); Xueyong Zhang, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 239 days.

(21) Appl. No.: 16/546,880

(22) Filed: Aug. 21, 2019

(65) Prior Publication Data
US 2020/0004037 A1   Jan. 2, 2020

Related U.S. Application Data

(63) Continuation of application No. PCT/CN2019/074610, filed on Feb. 2, 2019.

(30) Foreign Application Priority Data

Feb. 27, 2018 (CN) .......... 201810164311.X
Feb. 27, 2018 (CN) .......... 201810164313.9
(Continued)

(51) Int. Cl.
*G02B 27/30* (2006.01)
*G02B 27/42* (2006.01)
*H01S 5/00* (2006.01)

(52) U.S. Cl.
CPC ......... *G02B 27/4205* (2013.01); *G02B 27/30* (2013.01); *H01S 5/005* (2013.01)

(58) Field of Classification Search
CPC .... G02B 27/42; G02B 27/4205; G02B 27/30; G03B 21/2033; G03B 15/02
(Continued)

(56) References Cited

U.S. PATENT DOCUMENTS

2004/0027564 A1   2/2004   Some
2014/0168536 A1*  6/2014   Guo ............... G06F 3/0443
                                                349/12
(Continued)

FOREIGN PATENT DOCUMENTS

CN   1363946      8/2002
CN   101084457    12/2007
(Continued)

OTHER PUBLICATIONS

SIPO, Fourth Office Action for CN Application No. 201810164311X, dated May 22, 2020.
(Continued)

*Primary Examiner* — Audrey Y Chang
(74) *Attorney, Agent, or Firm* — Hodgson Russ LLP

(57) ABSTRACT

A laser projection module (100) and a method for detecting a fracture thereof, a depth camera (1000) and an electronic device (3000). The laser projection module (100) includes a laser emitter (10) and an optical assembly (80). The laser emitter (10) is configured to emit laser light. The laser light passes through the optical assembly (80) to form a laser pattern.

9 Claims, 32 Drawing Sheets

(30) Foreign Application Priority Data

Feb. 27, 2018 (CN) .......................... 201810164314.3
Apr. 3, 2018 (CN) .......................... 201810297801.7

(58) Field of Classification Search
USPC ......................................... 359/566; 372/38.1
See application file for complete search history.

(56) References Cited

U.S. PATENT DOCUMENTS

| | | | | |
|---|---|---|---|---|
| 2014/0313123 | A1 | 10/2014 | Park et al. | |
| 2017/0062379 | A1* | 3/2017 | Zhang | ................... H01L 24/29 |
| 2019/0121226 | A1* | 4/2019 | Wu | ................... G03B 21/2033 |
| 2019/0317333 | A1* | 10/2019 | Li | ................... G06K 9/00255 |

FOREIGN PATENT DOCUMENTS

| | | |
|---|---|---|
| CN | 101193472 | 6/2008 |
| CN | 101640220 | 2/2010 |
| CN | 201522712 | 7/2010 |
| CN | 201867785 | 6/2011 |
| CN | 201946950 | 8/2011 |
| CN | 103309509 | 9/2013 |
| CN | 103679056 | 3/2014 |
| CN | 104007497 | 8/2014 |
| CN | 104882404 | 9/2015 |
| CN | 105890511 | 8/2016 |
| CN | 104007866 | 12/2016 |
| CN | 107102506 | 8/2017 |
| CN | 107167997 | 9/2017 |
| CN | 107357118 | 11/2017 |
| CN | 107357123 | 11/2017 |
| CN | 107515503 | 12/2017 |
| CN | 107608167 | 1/2018 |
| CN | 206877030 | 1/2018 |
| CN | 108196418 | 6/2018 |
| CN | 108375864 | 8/2018 |
| CN | 108388064 | 8/2018 |
| CN | 108594563 | 9/2018 |
| EP | 3121649 | 1/2017 |
| TW | 201629464 | 8/2016 |
| WO | 2016126587 | 8/2016 |

OTHER PUBLICATIONS

SIPO, Rejection Decision for CN Application No. 201810164313.9, dated May 21, 2020.
SIPO, First Office Action for CN Application No. 201810164313, dated May 22, 2019.
SIPO, First Office Action for CN Application No. 201810164311, dated May 20, 2019.
WIPO, English Translation of the ISR and WO for PCT/CN2019/074610, dated Apr. 29, 2019.
SIPO, Rejection Decision for CN Application No. 201810164311.X, dated Sep. 9, 2020.
IPI, Office Action for IN Application No. 201917026414, dated Oct. 25, 2020.
SIPO, Second Office Action for CN Application No. 201810164313.9, dated Sep. 24, 2019.
SIPO, First Office Action for CN Application No. 201810164314.3, dated Jun. 17, 2019.
SIPO, Second Office Action for CN Application No. 201810164314.3, dated Sep. 9, 2019.
SIPO, First Office Action for CN Application No. 201810297801.7, dated Jun. 17, 2019.
SIPO, Second Office Action for CN Application No. 201810297801.7, dated Sep. 9, 2019.
EPO, Office Action for EP Application No. 19737647.8, dated Mar. 12, 2020.
TIPO, Office Action for TW Application No. 108106937, dated Jan. 13, 2020.
CNIPA, Notice of Review for CN Application No. 201810164313.9, dated Dec. 22, 2021.
CNIPA, Rejection Decision for CN Application No. 201810297801.7, dated Apr. 26, 2020.
CNIPA, Rejection Decision for CN Application No. 201810164314.3, dated Apr. 26, 2020.

* cited by examiner

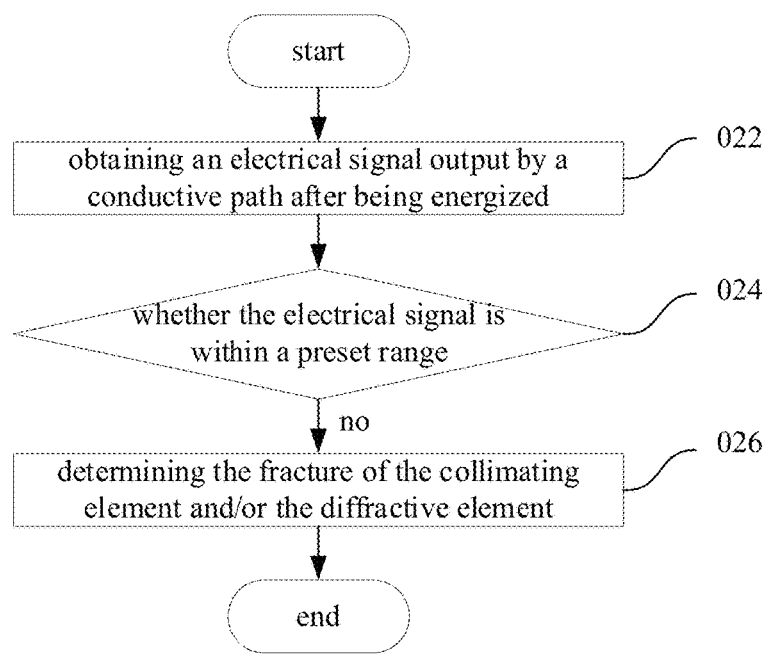
FIG. 36
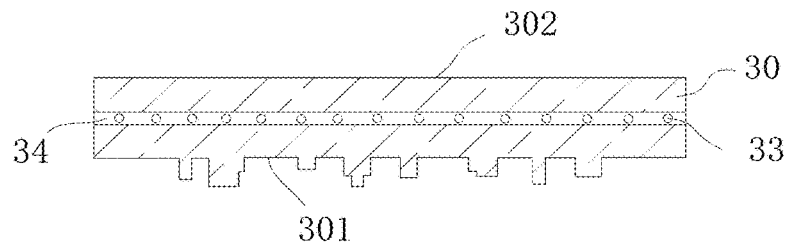
FIG. 37
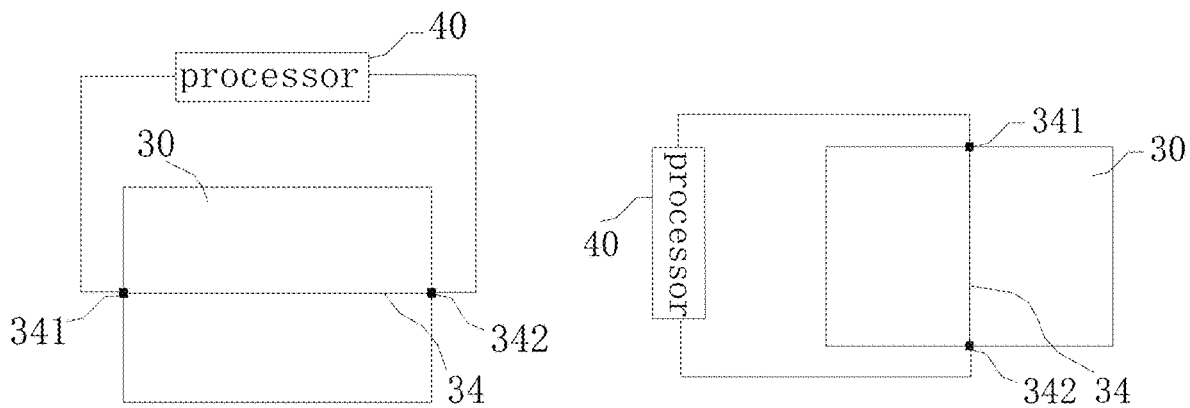
FIG. 38
FIG. 39

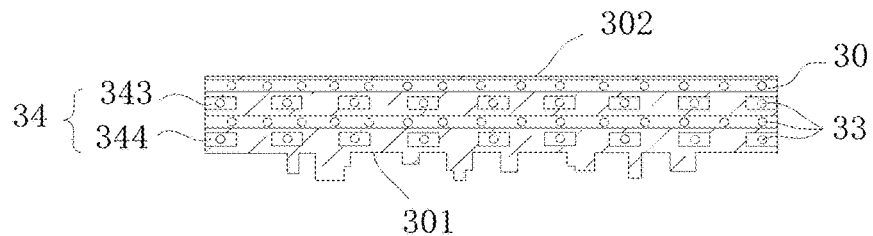
FIG. 49
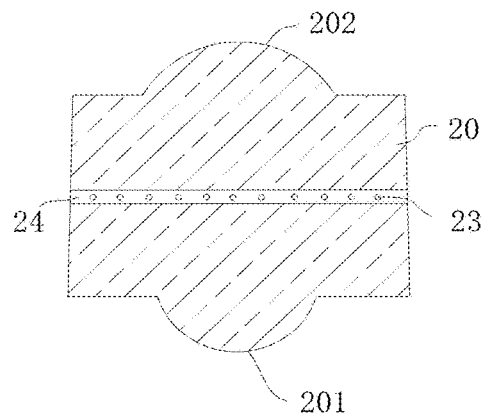
FIG. 50
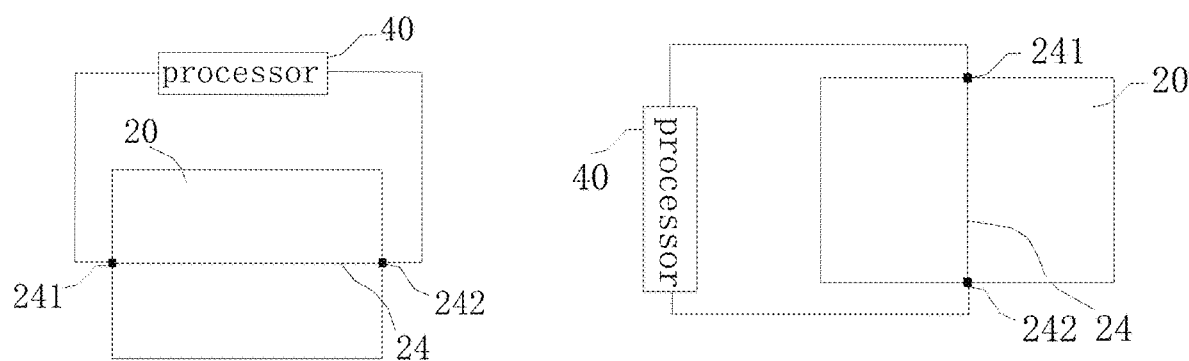
FIG. 51
FIG. 52

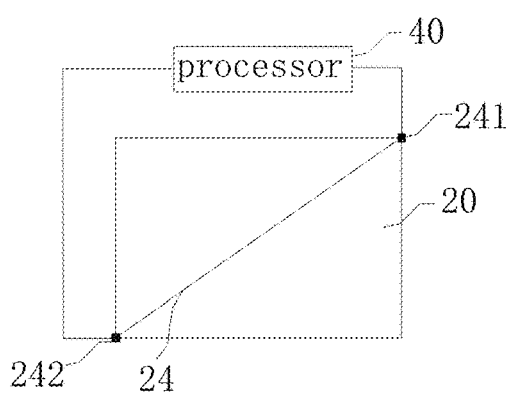
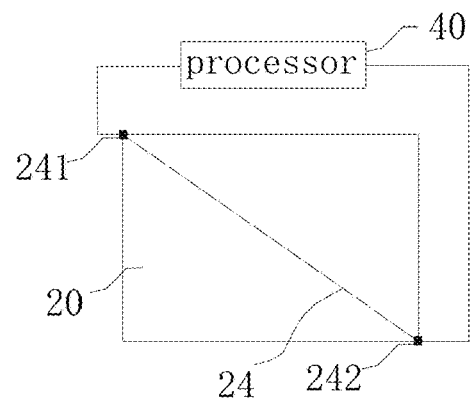
FIG. 53
FIG. 54
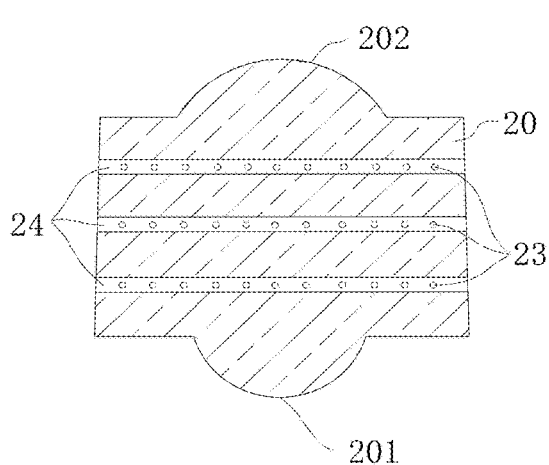
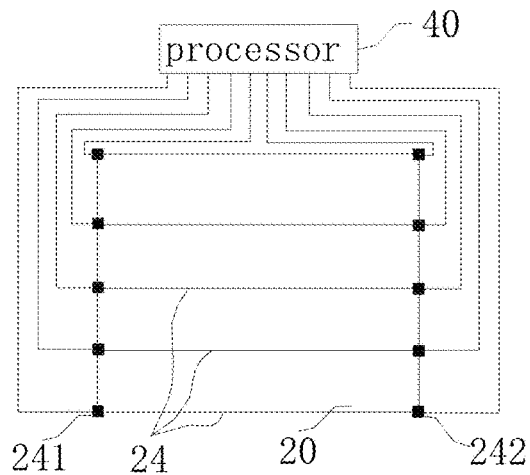
FIG. 55
FIG. 56
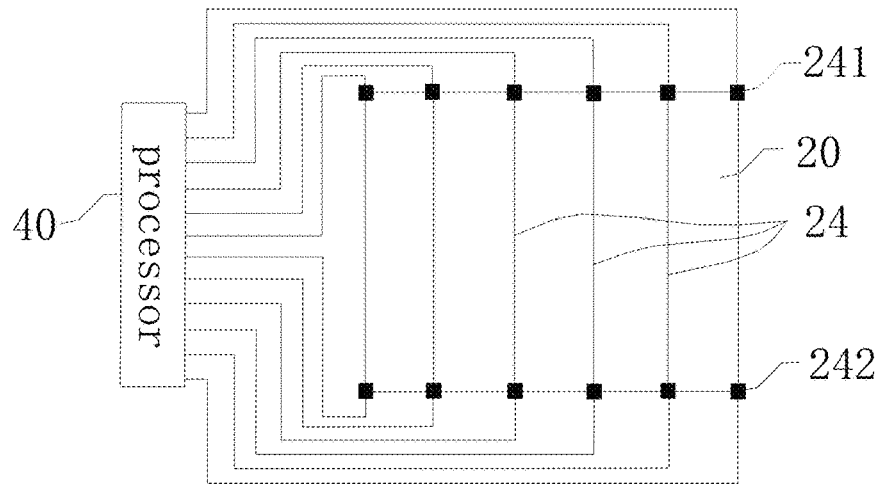
FIG. 57

LASER PROJECTION MODULES AND METHODS FOR DETECTING FRACTURE THEREOF, DEPTH CAMERAS AND ELECTRONIC DEVICES

CROSS-REFERENCE TO RELATED APPLICATION

This application is a continuation application of an International Application No. PCT/CN2019/074610, filed on Feb. 2, 2019, which claims priority to and benefits of Chinese patent application Nos. 201810164313.9, 201810164314.3 and 201810164311.X filed on Feb. 27, 2018, and application No. 201810297801.7 filed on Apr. 3, 2018, the entire contents of which are hereby incorporated herein by reference.

FIELD

The present disclosure relates to the field of imaging technologies, and more particularly, to a laser projection module, a method for detecting a fracture of a laser projection module, a depth camera, and an electronic device.

BACKGROUND

Some laser emitters (e.g. vertical-cavity surface-emitting lasers (VCSEL)) in the related art may emit laser light with strong focusing. The energy of the laser light is reduced when the laser light passes through a collimating element and a diffractive element, such that the signal strength may be below a damage threshold of the human body. These laser emitters are generally composed of glass or other components that are easily broken.

SUMMARY

Embodiments of the present disclosure provide a laser projection module, a method for detecting a fracture of a laser projection module, a depth camera, and an electronic device.

The present disclosure provides a laser projection module. The laser projection module includes a laser emitter and an optical assembly. The laser emitter is configured to emit laser light. The laser light passes through the optical assembly to form a laser pattern.

The present disclosure provides an electronic device. The electronic device includes a laser projection module, an image collector and a processor. The laser projection module includes a laser emitter, configured to emit laser light, and an optical assembly. The laser light passes through the optical assembly to form a laser pattern. The optical assembly includes: a collimating element, configured to collimate the laser light; and a diffractive element, configured to diffract the laser light collimated by the collimating element to form the laser pattern. The collimating element and/or the diffractive element is provided with a transparent conductive film, a conductive electrode is disposed on the transparent conductive film, and the conductive electrode is configured to output an electrical signal after being energized. The image collector is configured to collect the laser pattern projected by the laser projection module into a target space. The processor is configured to obtain the electrical signal, to determine whether the electrical signal is within a preset range, and to determine fracture of the collimating element and/or the diffractive element in response to the electrical signal being not within the preset range, and to process the laser pattern to obtain a depth image.

The present disclosure provides a method for detecting a fracture of a laser projection module. The laser projection module includes a laser emitter, a collimating element and a diffractive element. The laser emitter is configured to emit laser light. The collimating element is configured to collimate the laser light. The diffractive element is configured to diffract the laser light collimated by the collimating element to form a laser pattern. The collimating element and/or the diffractive element is provided with a transparent conductive film. A conductive electrode is disposed on the transparent conductive film. The conductive electrode is configured to output an electrical signal after being energized. Or, the collimating element and/or the diffractive element includes conductive particles doped in the collimating element and/or the diffractive element. The conductive particles form a conductive path. The conductive path is configured to output an electrical signal after being energized. The method includes the following acts. The electrical signal output by the conductive electrode or the conductive path after being energized is obtained. It is determined whether the electrical signal is within a preset range. The fracture of the collimating element and/or the diffractive element is determined in response to the electrical signal being not within the preset range.

Additional aspects and advantages of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the accompanying drawings, in which:

FIG. 36 illustrates a flow chart of a method for detecting a fracture of a laser projection module according to some embodiments of the present disclosure.

FIG. 37 illustrates a cross-sectional view of a diffractive element according to some embodiments of the present disclosure.

FIGS. 38 to 41 illustrate schematic diagrams of a conductive path of a diffractive element according to some embodiments of the present disclosure.

FIG. 49 illustrates a cross-sectional view of a diffractive element according to some embodiments of the present disclosure.

FIG. 50 illustrates a cross-sectional view of a collimating element according to some embodiments of the present disclosure.

FIGS. 51 to 54 illustrate schematic diagrams of a conductive path of a collimating element according to some embodiments of the present disclosure.

FIG. 55 illustrates a cross-sectional view of a collimating element according to some embodiments of the present disclosure.

FIGS. 56 to 59 illustrate schematic diagrams of conductive paths of a collimating element according to some embodiments of the present disclosure.

DETAILED DESCRIPTION

Figure 1:
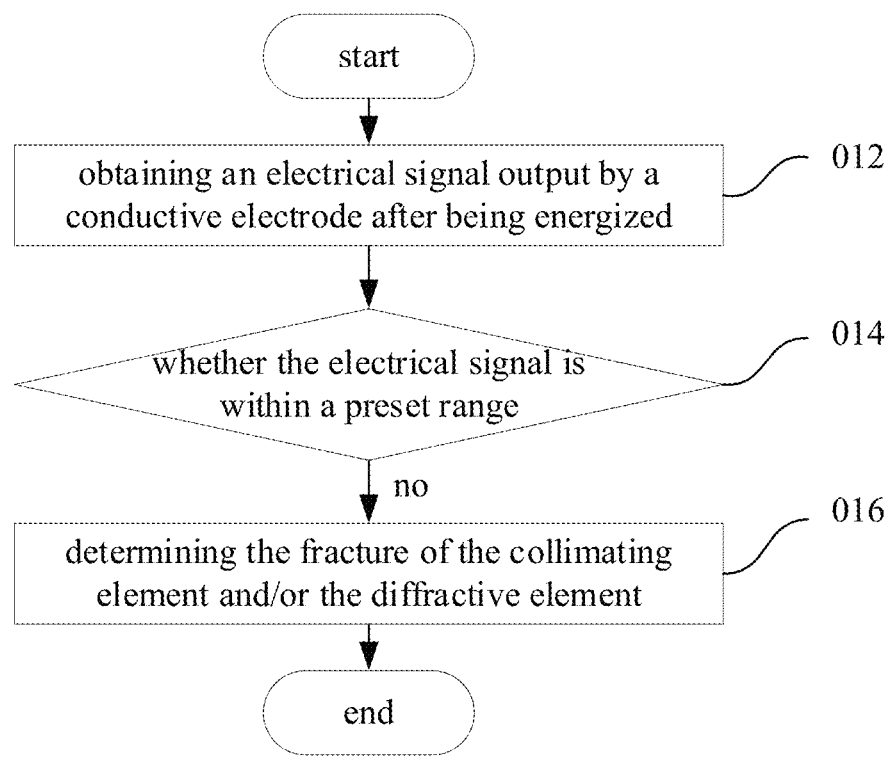
FIG. 1 illustrates a flow chart of a method for detecting a fracture of a laser projection module according to some embodiments of the present disclosure.

Embodiments of the present disclosure will be described in detail and examples of embodiments are illustrated in the drawings. The same or similar elements and the elements having the same or similar functions are denoted by like reference numerals throughout the descriptions. Embodiments described herein with reference to drawings are explanatory, serve to explain the present disclosure, and are not construed to limit embodiments of the present disclosure.

Figure 2:
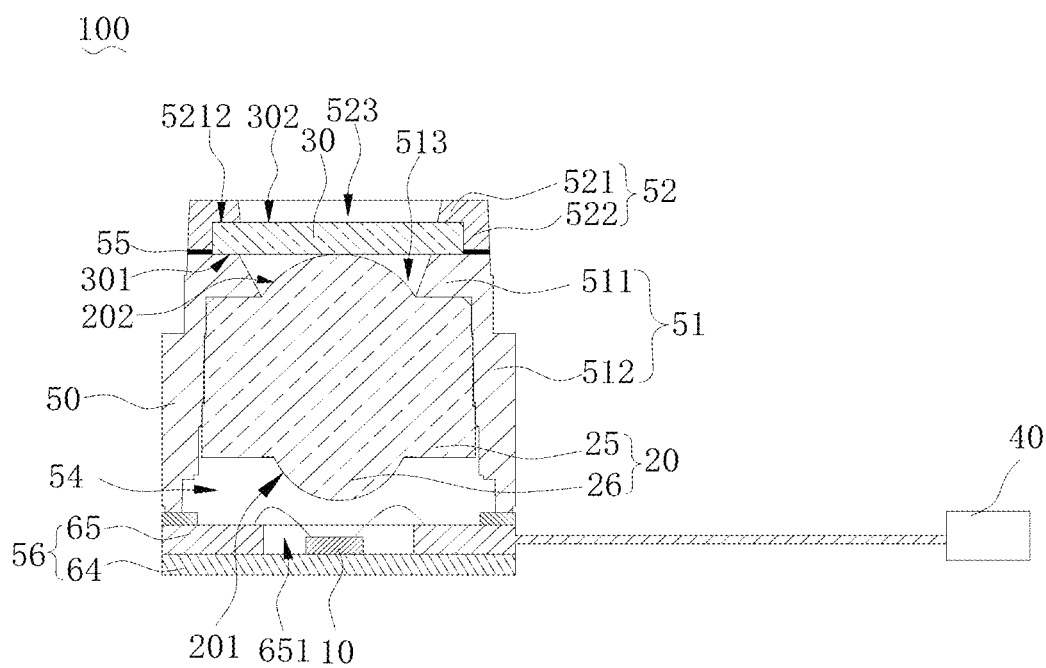
FIG. 2 illustrates a schematic diagram of a laser projection module according to some embodiments of the present disclosure.
Figure 3:
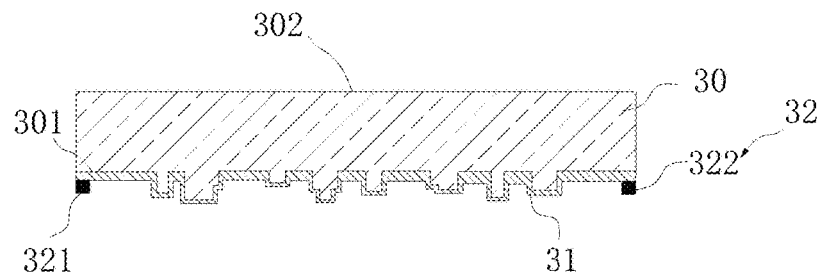
FIGS. 3 and 4 illustrate cross-sectional views of a diffractive element according to some embodiments of the present disclosure.

Referring to FIGS. 1 and 2, the present disclosure provides a method for detecting a fracture of a laser projection module 100. The laser projection module 100 includes a laser emitter 10, a collimating element 20, a diffractive element 30 and a processor 40. The laser emitter 10 is configured to emit laser light. The collimating element 20 is configured to collimate the laser light emitted by the laser emitter 10. The diffractive element 30 is configured to diffract the laser light collimated by the collimating element 20 to form a laser pattern. A transparent conductive film 21/31 (illustrated in FIGS. 3 and 16) is formed on the collimating element 20 and/or the diffractive element 30. A transparent collimation conductive film 21 is formed on the collimating element 20 (illustrated in FIG. 16) only. Alternatively, a transparent diffraction conductive film 31 is formed on the diffractive element 30 (as illustrated in FIG. 3) only. Alternatively, a transparent collimation conductive film 21 is formed on the collimating element 20, and a transparent diffraction conductive film 31 is formed on the diffractive element 30. The transparent collimation conductive film 21 is provided with a collimation conductive electrode 22 (illustrated in FIG. 16). The transparent diffraction conductive film 31 is provided with a diffraction conductive electrode 32 (illustrated in FIG. 3). The collimation conductive electrode 22 and the diffraction conductive electrode 32 may output electrical signals after being energized.

The method includes acts in the following blocks.

At block 012: an electrical signal output by the collimation conductive electrode 22 and/or the diffraction conductive electrode 32 after being energized is obtained.

At block 014: it is determined whether the electrical signal is within a preset range.

At block 016: the fracture of the collimating element 20 and/or the diffractive element 30 is determined in response to the electrical signal being not within the preset range.

The present disclosure also provides the laser projection module 100. The acts in blocks 012, 014, and 016 may be performed by the processor 40 in the laser projection module 100. That is, the processor 40 is configured to obtain the electrical signal output by the collimation conductive electrode 22 and/or the diffraction conductive electrode 32 after being energized, to determine whether the electrical signal is within the preset range, and to determine the fracture of the collimating element 20 and/or the diffractive element 30 in response to the electrical signal being not within the preset range.

In detail, the transparent collimation conductive film 21 is formed on the collimating element 20. A resistance of the transparent collimation conductive film 21 is related to the collimating element 20. For example, when the collimating element 20 is intact, the transparent collimation conductive film 21 is also intact, and the resistance of the transparent collimation conductive film 21 is relatively small, such as less than a first preset value. When the collimating element 20 is fractured, the transparent collimation conductive film 21 is also damaged, and the resistance of the transparent collimation conductive film 21 at a damaged position is close to infinity.

Based on the above features, it may be detected whether the collimating element 20 is fractured. For example, when the collimation conductive electrode 22 on the transparent collimation conductive film 21 is energized, i.e., when the voltage of a certain magnitude is applied to the collimation conductive electrode 22, the current output by the collimation conductive electrode 22 may be obtained by the processor 40. It may be detected whether the collimating element 20 is fractured based on the current output by the collimation conductive electrode 22 and obtained by the processor 40.

Therefore, in the first mode, it is determined whether the transparent collimation conductive film 21 is damaged according to a difference between the present electrical signal (i.e., current) and the electrical signal (i.e., current) detected when the collimating element 20 is intact, and further determined whether the collimating element 20 is fractured based on a state of the transparent collimation conductive film 21. That is, when the transparent collimation conductive film 21 is damaged, the collimating element 20 is also fractured, and when the transparent collimation conductive film 21 is intact, the collimating element 20 is also intact.

In the second mode, it is determined whether the transparent collimation conductive film 21 is damaged directly according to the present electrical signal (i.e., current) output by the collimation conductive electrode 22 on the collimating element 20, and further determined whether the collimating element 20 is fractured based on a state of the transparent collimation conductive film 21. In detail, when the present electrical signal (i.e., current) output by the collimation conductive electrode 22 is not within the preset range, it is determined that the transparent collimation conductive film 21 is damaged, and further determined that the collimating element 20 is also fractured. When the present electrical signal (i.e., current) output by the collimation conductive electrode 22 is within the preset range, it is determined that the transparent collimation conductive film 21 is intact, and further determined that the collimating element 20 is also intact.

Similarly, the transparent diffraction conductive film 31 is formed on the diffractive element 30. A resistance of the transparent diffraction conductive film 31 is related to the diffractive element 30. For example, when the diffractive element 30 is intact, the transparent diffraction conductive film 31 is also intact, and the resistance of the transparent diffraction conductive film 31 is relatively small, such as less than a second preset value. When the diffractive element 30 is fractured, the transparent diffraction conductive film 31 is also damaged, and the resistance of the transparent diffraction conductive film 31 at a damaged position is close to infinity.

Based on the above features, it may be detected whether the diffractive element 30 is fractured. For example, when the diffraction conductive electrode 32 on the transparent diffraction conductive film 31 is energized, i.e., when the voltage of a certain magnitude is applied to the diffraction conductive electrode 32, the current output by the diffraction conductive electrode 32 may be obtained by the processor 40. It may be detected whether the diffractive element 30 is fractured based on the current output by the diffraction conductive electrode 32 and obtained by the processor 40.

Therefore, in the first mode, it is determined whether the transparent diffraction conductive film 31 is damaged according to a difference between the present electrical signal (i.e., current) and the electrical signal (i.e., current) detected when the diffractive element 30 is intact, and further determined whether the diffractive element 30 is fractured based on a state of the transparent diffraction conductive film 31. That is, when the transparent diffraction conductive film 31 is damaged, the diffractive element 30 is also fractured, and when the transparent diffraction conductive film 31 is intact, the diffractive element 30 is also intact.

In the second mode, it is determined whether the transparent diffraction conductive film 31 is damaged directly according to the present electrical signal (i.e., current) output by the diffraction conductive electrode 32 on the diffractive element 30 after being energized, and further determined whether the diffractive element 30 is fractured based on a state of the transparent diffraction conductive film 31. In detail, when the present electrical signal (i.e., current) output by the diffraction conductive electrode 32 is not within the preset range, it is determined that the transparent diffraction conductive film 31 is damaged, and further determined that the diffractive element 30 is also fractured. When the present electrical signal (i.e., current) output by the diffraction conductive electrode 32 is within the preset range, it is determined that the transparent diffraction conductive film 31 is intact, and further determined that the diffractive element 30 is also intact.

When the transparent collimation conductive film 21 is formed on the collimating element 20, and the transparent diffraction conductive film 31 is formed on the diffractive element 30, the processor 40 may distinguish the transparent collimation conductive film 21 and the transparent diffraction conductive film 31, thereby determining whether the collimating element 20 or the diffractive element 30 is fractured, or both are fractured.

Further, the transparent collimation conductive film 21 may be formed on the surface of the collimating element 20 by plating or the like, and the transparent diffraction conductive film 31 may also be formed on the surface of the diffractive element 30 by plating or the like. The material of the transparent collimation conductive film 21 and the transparent diffraction conductive film 31 may be any of indium tin oxide (ITO), Nano silver wire and metal silver wire. The above materials having good transmissivity and conductive properties, may realize the output of the electrical signal after energization, without blocking the outgoing optical path of the collimating element 20 and the diffractive element 30.

With the laser projection module 100, and the method for detecting the fracture of the laser projection module 100, provided in the embodiments of the present application, by disposing the transparent collimation conductive film 21 and the collimation conductive electrode 22 on the collimating element 20, and/or disposing the transparent diffraction conductive film 31 and the diffraction conductive electrode 32 on the diffractive element 30, and determining whether the collimating element 20 and/or the diffractive element 30 is fractured according to the electrical signal output by the collimation conductive electrode 22 and/or the diffraction conductive electrode 32. In this way, it may be detected whether the laser projection module 100 is intact. When it is detected that the laser projection module 100 is fractured, it may choose not to turn on the laser projection module 100, or turn off the laser light projected by the laser projection module 100 in time, or reduce the emission power of the laser projection module 100, such that the user's eyes may be protected from the high energy of the laser light projected by the fractured laser projection module 100, thereby improving the safety of the user.

Figure 4:
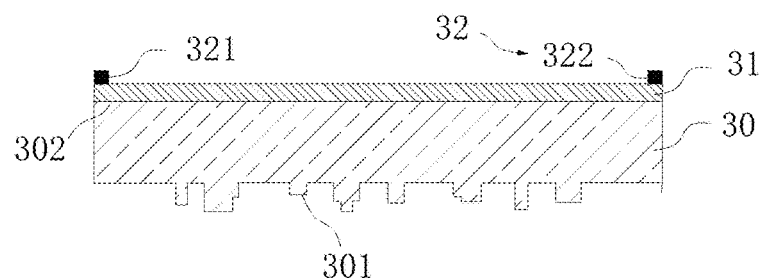

Referring to FIGS. 3 and 4, in some embodiments, the diffractive element 30 includes a diffractive incident surface 301 and a diffractive exit surface 302. The diffractive incident surface 301 is opposed to the diffractive exit surface 302. When the transparent diffraction conductive film 31 is formed on the diffractive element 30, the transparent diffraction conductive film 31 is a single layer, and may be disposed on the diffractive incident surface 301 (as illustrated in FIG. 3) or the diffractive exit surface 302 (as illustrated in FIG. 4). Since the diffractive incident surface 301 of the diffractive element 30 is uneven, it is relatively easy to dispose the transparent diffraction conductive film 31 on the diffractive exit surface 302. In addition, the diffractive incident surface 301 of the diffractive element 30 is a diffraction grating. When the diffraction grating is fractured, the laser energy emitted may be too strong to endanger the user's eyes, but there is also a case where the laser energy emitted is low. The laser pattern diffracted by the diffractive element 30 has changed due to the fracture of the diffraction grating, and the laser projection module 100 does not function at this time. Therefore, the transparent diffraction conductive film 31 may be disposed on the diffractive incident surface 301, such that the transparent diffraction conductive film 31 directly contacts the diffraction grating, thereby improving the accuracy of detecting the fracture of the diffractive element 30.

Figure 5:
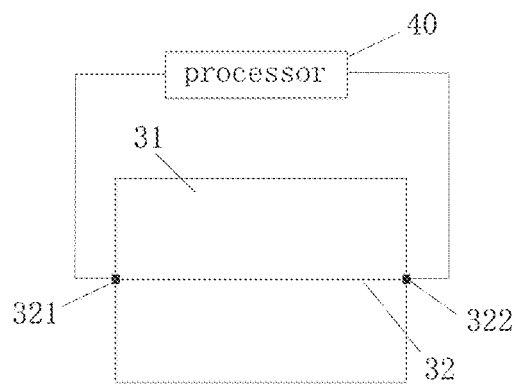
FIGS. 5 to 8 illustrate schematic diagrams of a conductive electrode of a diffractive element according to some embodiments of the present disclosure.
Figure 6:
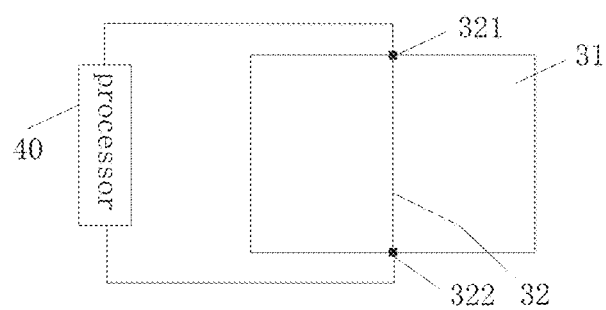
Figure 7:
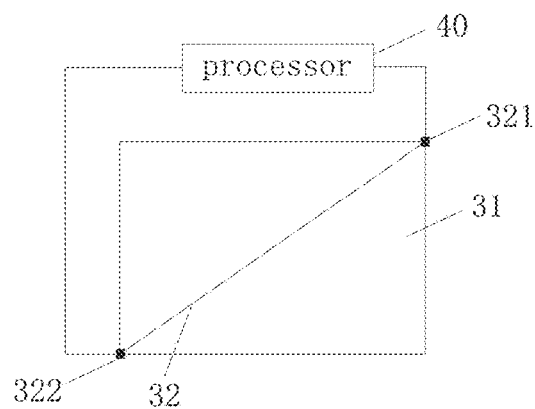
Figure 8:
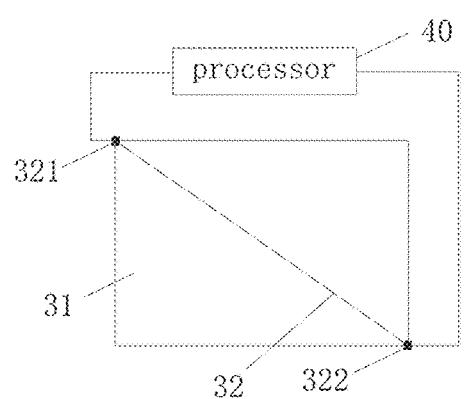

Further, referring to FIGS. 5 to 8, the transparent diffraction conductive film 31 is a single layer and is provided on the diffractive incident surface 301 or the diffractive exit surface 302 of the diffractive element 30. One diffraction conductive electrode 32 is disposed on the transparent diffraction conductive film 31. The diffraction conductive electrode 32 includes a diffraction input end 321 and a diffraction output end 322. The diffraction input end 321 and the diffraction output end 322 are coupled to the processor 40 to form a conductive loop. The diffraction conductive electrode 32 may be arranged in various manners. For example, the wiring direction of the diffraction input end 321 and the diffraction output end 322 (i.e., the extending direction of the diffraction conductive electrode 32) may be the longitudinal direction of the transparent diffraction conductive film 31 (as illustrated in FIG. 5). Or the wiring direction of the diffraction input end 321 and the diffraction output end 322 may be the width direction of the transparent diffraction conductive film 31 (as illustrated in FIG. 6). Or the wiring direction of the diffraction input end 321 and the diffraction output end 322 may be the diagonal direction of the transparent diffraction conductive film 31 (as illustrated in FIGS. 7 and 8). Regardless of the way it is managed, the diffraction conductive electrode 32 may span the entire transparent diffraction conductive film 31, and it is accurately detected whether the transparent diffraction conductive film 31 is damaged.

Figure 9:
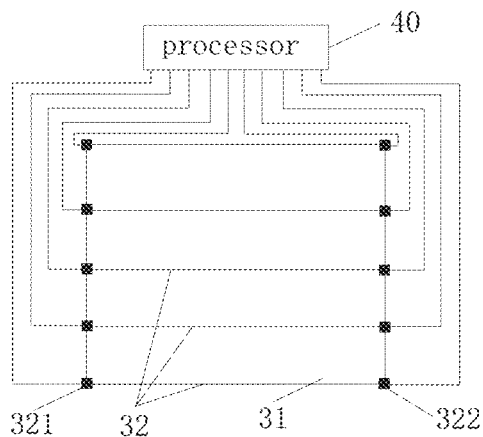
FIGS. 9 to 12 illustrate schematic diagrams of conductive electrodes of a diffractive element according to some embodiments of the present disclosure.
Figure 10:
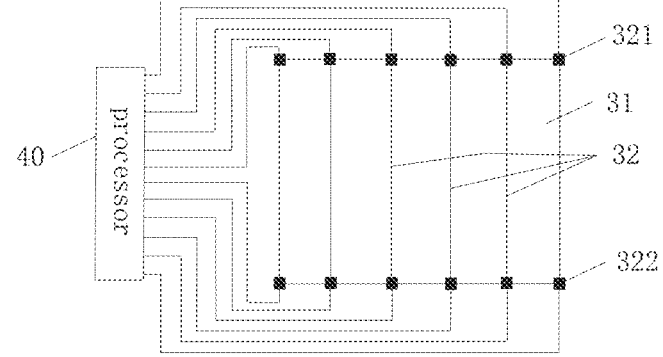
Figure 11:
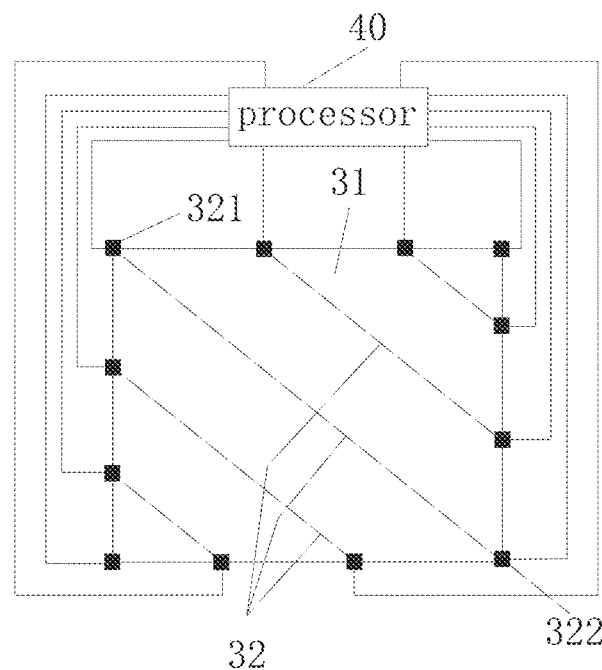
Figure 12:
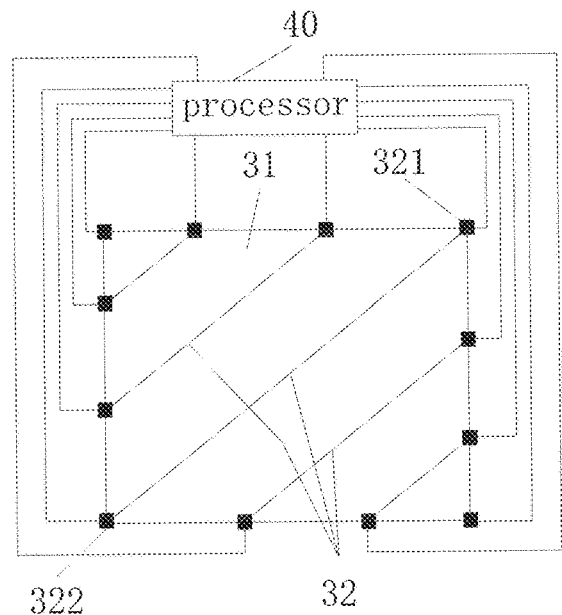

Alternatively, referring to FIGS. 9 to 12, the transparent diffraction conductive film 31 is a single layer and is provided on the diffractive incident surface 301 or the diffractive exit surface 302 of the diffractive element 30. A plurality of diffraction conductive electrodes 32 is disposed on the transparent diffraction conductive film 31. The plurality of diffraction conductive electrodes 32 does not intersect with each other. Each of the plurality of diffraction conductive electrodes 32 includes a diffraction input end 321 and a diffraction output end 322. Each of the plurality of diffraction input ends 321 and each of the plurality of diffraction output ends 322 are coupled to the processor 40 to form a conductive loop. In this way, the plurality of diffraction input ends 321 and the plurality of diffraction output ends 322 of the plurality of diffraction conductive electrodes 32 are coupled to the processor 40 to form a plurality of conductive loops. The plurality of diffraction conductive electrodes 32 may be arranged in various manners. For example, the wiring direction of each of the plurality of diffraction input ends 321 and each of the plurality of diffraction output ends 322 (i.e., the extending direction of each of the plurality of diffraction conductive electrodes 32) may be the longitudinal direction of the transparent diffraction conductive film 31, and the plurality of diffraction conductive electrodes 32 may be arranged in parallel at intervals along the width direction of the transparent diffraction conductive film 31 (as illustrated in FIG. 9). Or the wiring direction of each of the plurality of diffraction input ends 321 and each of the plurality of diffraction output ends 322 may be the width direction of the transparent diffraction conductive film 31, and the plurality of diffraction conductive electrodes 32 may be arranged in parallel at intervals along the longitudinal direction of the transparent diffraction conductive film 31 (as illustrated in FIG. 10). Or the wiring direction of each of the plurality of diffraction input ends 321 and each of the plurality of diffraction output ends 322 may be the diagonal direction of the transparent diffraction conductive film 31, and the plurality of diffraction conductive electrodes 32 may be arranged in parallel at intervals along the other diagonal direction of the transparent diffraction conductive film 31 (as illustrated FIGS. 11 and 12). Regardless of the way the plurality of diffraction conductive electrodes 32 is arranged, the plurality of diffraction conductive electrodes 32 may occupy a larger area of the transparent diffraction conductive film 31 compared to one diffraction conductive electrode 32, and output more electrical signals correspondingly. When only one diffraction conductive electrode 32 is provided, there is a possibility that the fracture position of the diffractive element 30 is far from the one diffraction conductive electrode 32, which has little effect on the one diffraction conductive electrode 32, and the electrical signal output by the one diffraction conductive electrode 32 is still within the preset range, thus the detection accuracy is low. In the present embodiment, the plurality of diffraction conductive electrodes 32 may occupy a larger area of the transparent diffraction conductive film 31, and correspondingly, it may output more electrical signals, and the processor 40 may more accurately determine whether the transparent diffraction conductive film 31 is damaged, according to more electrical signals, and further determine whether the diffractive element 30 is fractured, thereby improving the accuracy of detecting the fracture of the diffractive element 30.

Figure 13:
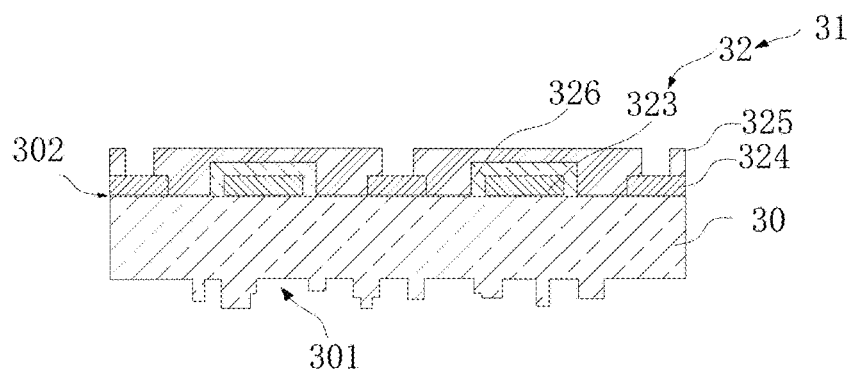
FIG. 13 illustrates a schematic diagram of a diffractive element according to some embodiments of the present disclosure.
Figure 14:
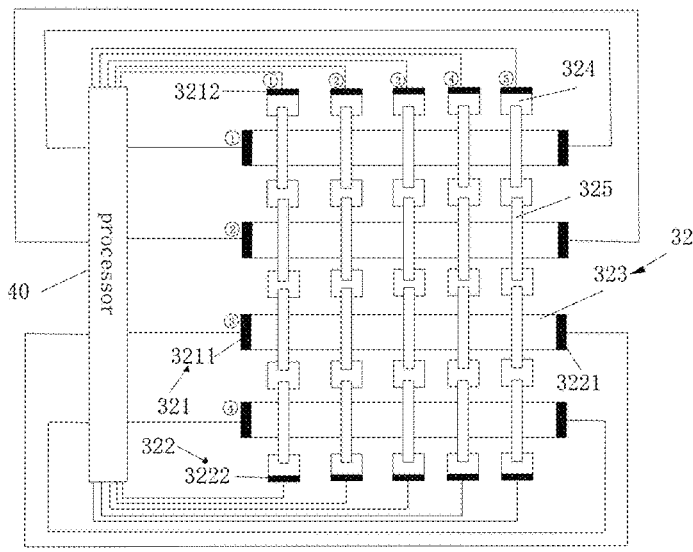
FIG. 14 illustrates a schematic diagram of conductive electrodes of a diffractive element according to some embodiments of the present disclosure.

Alternatively, referring to FIGS. 13 and 14, the transparent diffraction conductive film 31 having a single-layer bridge structure, is disposed on the diffractive incident surface 301 (not illustrated) or the diffractive exit surface 302 (as illustrated in FIG. 13) of the diffractive element 30. In detail, the plurality of diffraction conductive electrodes 32 includes a plurality of first diffraction conductive electrodes 323 arranged in parallel, a plurality of second diffraction conductive electrodes 324 arranged in parallel, and a plurality of bridging diffraction conductive electrodes 325. The plurality of first diffraction conductive electrodes 323 and the plurality of second diffraction conductive electrodes 324 are crisscrossed. Each of the plurality of first diffraction conductive electrodes 323 is continuous without interruption. Each of the plurality of second diffraction conductive electrodes 324 is interrupted with the plurality of first diffraction conductive electrodes 323 at crisscross points, and insulated from the plurality of first diffraction conductive electrodes 323. Each of the plurality of bridging diffraction conductive electrodes 325 is coupled to a corresponding and interrupted second diffraction conductive electrode 324 at breakpoints. A diffraction insulator 326 is provided at a crisscross position between each of the plurality of bridging diffraction conductive electrodes 325 and each of the plurality of first diffraction conductive electrodes 323. Both ends of each of the plurality of first diffraction conductive electrodes 323 are coupled to the processor 40 to form a conductive loop, and both ends of each of the plurality of second diffraction conductive electrodes 324 are coupled to the processor 40 to form a conductive loop. Therefore, both ends of the plurality of first diffraction conductive electrodes 323 and the processor 40 are coupled to form a plurality of conductive loops, and both ends of the plurality of second diffraction conductive electrodes 324 and the processor 40 are coupled to form a plurality of conductive loops. The material of the diffraction insulator 326 may be an organic material having good transmissivity and insulation properties. The diffraction insulator 326 may be formed by a silk screen printing, or a photolithographic process. The plurality of diffraction conductive electrodes 32 may be arranged in parallel, and the plurality of diffraction conductive electrodes 32 penetrates through and is provided in the transparent diffraction conductive film 31 to form the plurality of first diffraction conductive electrodes 323 and the plurality of second diffraction conductive electrodes 324. The plurality of first diffraction conductive electrodes 323 and the plurality of second diffraction conductive electrodes 324 are crisscrossed, meaning that the plurality of first diffraction conductive electrodes 323 and the plurality of second diffraction conductive electrodes 324 are vertically interlaced. That is, the angle between each of the plurality of first diffraction conductive electrodes 323 and each of the plurality of second diffraction conductive electrodes 324 is 90 degrees. In other embodiments, the plurality of first diffraction conductive electrodes 323 and the plurality of second diffraction conductive electrodes 324 may be crisscrossed, also meaning that the plurality of first diffraction conductive electrodes 323 and the plurality of second diffraction conductive electrodes 324 are slantingly interlaced. In use, the processor 40 may simultaneously energize the plurality of first diffraction conductive electrodes 323 and the plurality of second diffraction conductive electrodes 324 to obtain electrical signals, or the processor 40 may sequentially energize the plurality of first diffraction conductive electrodes 323 and the plurality of second diffraction conductive electrodes 324 to obtain electrical signals. Then the processor 40 determines whether the transparent diffraction conductive film 31 is damaged according to the electrical signals. Referring to FIG. 14, when it is detected that the electrical signal output by the first diffraction conductive electrode 323 numbered ① is not within the preset range, and the electrical signal output by the second diffraction conductive electrode 324 numbered ③ is not within the preset range, the transparent diffraction conductive film 31 is damaged at the crisscross point between the first diffraction conductive electrode 323 numbered ① and the second diffraction conductive electrode 324 numbered ③, and the position of the diffractive element 30 corresponding to the fracture position of the transparent diffraction conductive film 31 is also damaged. Thus, whether the diffractive element 30 is fractured and the specific fracture position may be accurately detected through the transparent diffraction conductive film 31 having the single-layer bridge structure.

Figure 15:
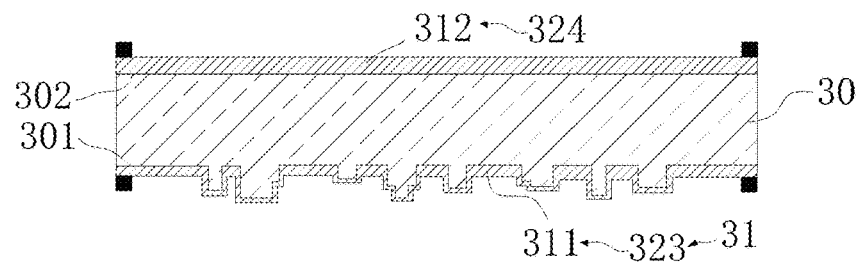
FIG. 15 illustrates a schematic diagram of a diffractive element according to some embodiments of the present disclosure.

Referring to FIGS. 14 and 15, in some embodiments, the diffractive element 30 includes a diffractive incident surface 301 and a diffractive exit surface 302 which are opposed. When the transparent diffraction conductive film 31 is formed on the diffractive element 30, the transparent diffraction conductive film 31 includes a first diffraction conductive film 311 disposed on the diffractive incident surface 301 and a second diffraction conductive film 312 disposed on the diffractive exit surface 302. The first diffraction conductive film 311 is provided with a plurality of first diffraction conductive electrodes 323 disposed in parallel, and the second diffraction conductive film 312 is provided with a plurality of second diffraction conductive electrodes 324 disposed in parallel. Projections of the plurality of first diffraction conductive electrodes 323 on the diffractive exit surface 302 are crisscrossed with the plurality of second diffraction conductive electrodes 324. Both ends of each of the plurality of first diffraction conductive electrodes 323 are coupled to the processor 40 to form a conductive loop, and both ends of each of the plurality of second diffraction conductive electrode 324 are coupled to the processor 40 to form a conductive loop. Therefore, both ends of the plurality of first diffraction conductive electrodes 323 and the processor 40 are coupled to form a plurality of conductive loops, and both ends of the plurality of second diffraction conductive electrodes 324 and the processor 40 are coupled to form a plurality of conductive loops. The projections of the plurality of first diffraction conductive electrodes 323 on the diffractive exit surface 302 are crisscrossed with the plurality of second diffraction conductive electrodes 324, meaning that the plurality of first diffraction conductive electrodes 323 and the plurality of second diffraction conductive electrodes 324 are vertically interlaced in space. That is, the angle between each of the projections of the plurality of first diffraction conductive electrodes 323 on the diffractive exit surface 302 and each of the plurality of second diffraction conductive electrodes 324 is 90 degrees. In other embodiments, the projections of the plurality of first diffraction conductive electrodes 323 on the diffractive exit surface 302 are crisscrossed with the plurality of second diffraction conductive electrodes 324, also meaning that the plurality of first diffraction conductive electrodes 323 and the plurality of second diffraction conductive electrodes 324 are slantingly interlaced in space. In use, the processor 40 may simultaneously energize the plurality of first diffraction conductive electrodes 323 and the plurality of second diffraction conductive electrodes 324 to obtain electrical signals, or the processor 40 may sequentially energize the plurality of first diffraction conductive electrodes 323 and the plurality of second diffraction conductive electrodes 324 to obtain electrical signals. Then the processor 40 determines whether the transparent diffraction conductive film 31 is damaged according to the electrical signals, and further determines whether the diffractive element 30 is fractured. Thus, whether the diffractive element 30 is fractured and the specific fracture position may be accurately detected according to the electrical signals output by the plurality of first diffraction conductive electrodes 323 and the plurality of second diffraction conductive electrodes 324.

Figure 16:
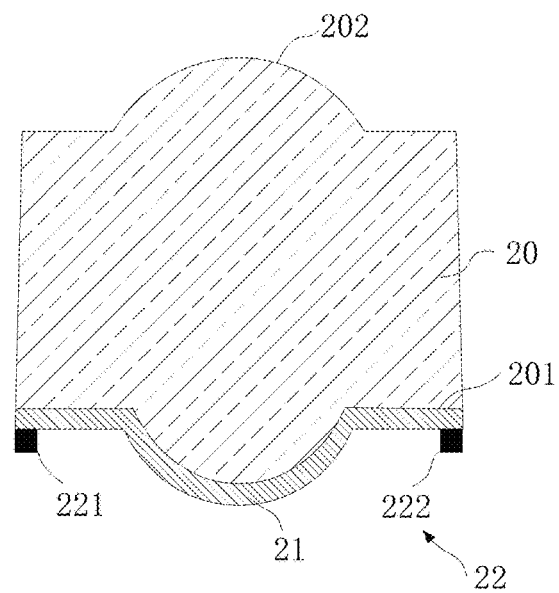
FIGS. 16 and 17 illustrate schematic diagrams of a collimating element according to some embodiments of the present disclosure.
Figure 17:
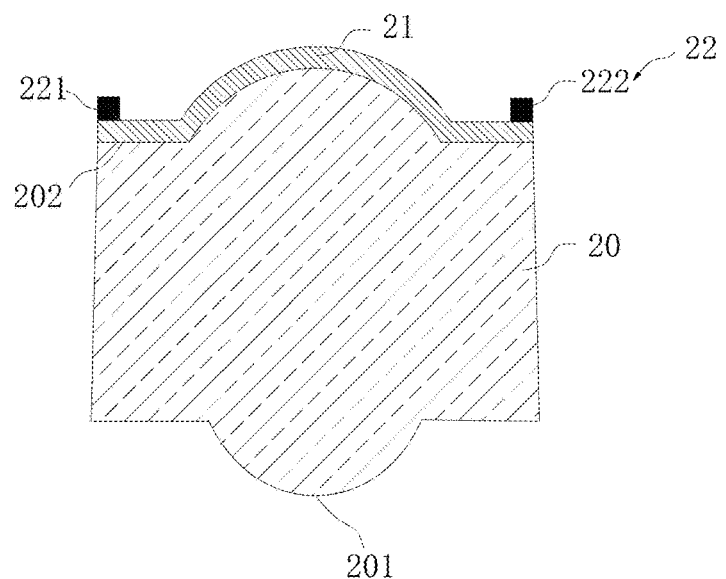

Referring to FIGS. 16 and 17, in some embodiments, the collimating element 20 includes a collimating incident surface 201 and a collimating exit surface 202. The collimating incident surface 201 is opposed to the collimating exit surface 202. When the transparent collimation conductive film 21 is formed on the collimating element 20, the transparent collimation conductive film 21 is a single layer, and may be disposed on the collimating incident surface 201 (as illustrated in FIG. 16), or the collimating exit surface 202 (as illustrated in FIG. 17).

Figure 18:
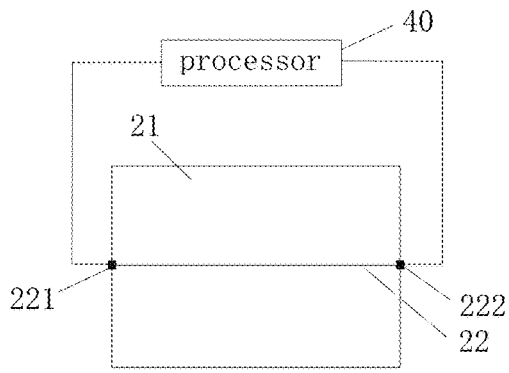
FIGS. 18 to 21 illustrate schematic diagrams of a conductive electrode of a collimating element according to some embodiments of the present disclosure.
Figure 19:
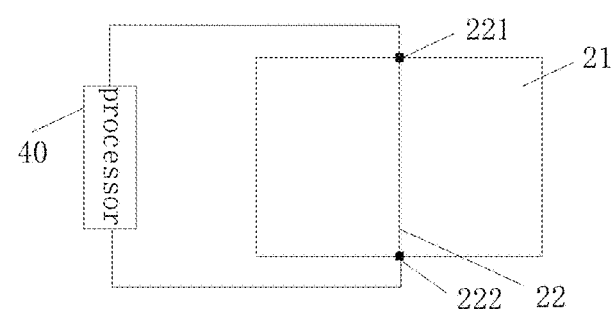
Figure 20:
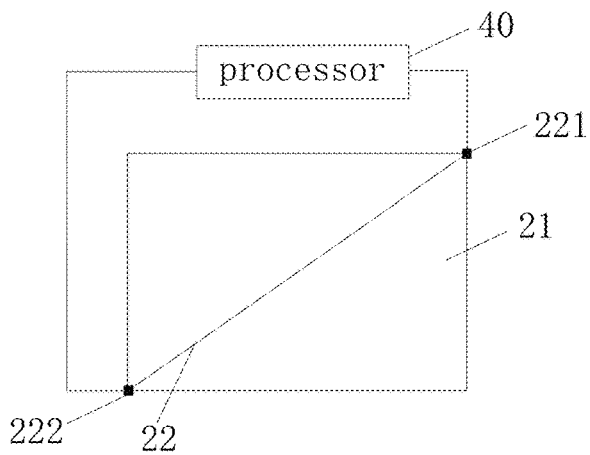
Figure 21:
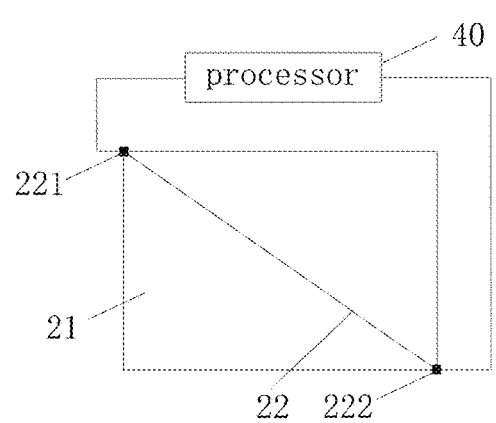

Further, referring to FIGS. 18 to 21, the transparent collimation conductive film 21 is a single layer and is provided on the collimating incident surface 201 or the collimating exit surface 202 of the collimating element 20. One collimation conductive electrode 22 is disposed on the transparent collimation conductive film 21. The collimation conductive electrode 22 includes a collimation input end 221 and a collimation output end 222. The collimation input end 221 and the collimation output end 222 are coupled to the processor 40 to form a conductive loop. The collimation conductive electrode 22 may be arranged in various manners. For example, the wiring direction of the collimation input end 221 and the collimation output end 222 (i.e., the extending direction of the collimation conductive electrode 22) may be the longitudinal direction of the transparent collimation conductive film 21 (as illustrated in FIG. 18). Or the wiring direction of the collimation input end 221 and the collimation output end 222 may be the width direction of the transparent collimation conductive film 21 (as illustrated in FIG. 19). Or the wiring direction of the collimation input end 221 and the collimation output end 222 may be the diagonal direction of the transparent collimation conductive film 21 (as illustrated in FIGS. 20 and 21). Regardless of the way it is managed, the collimation conductive electrode 22 may span the entire transparent collimation conductive film 21, and it is accurately detected whether the transparent collimation conductive film 21 is damaged.

Figure 22:
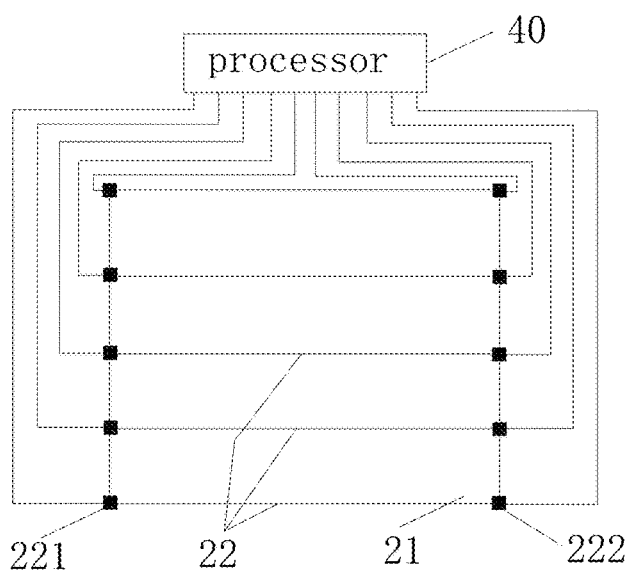
FIGS. 22 to 25 illustrate schematic diagrams of conductive electrodes of a collimating element according to some embodiments of the present disclosure.
Figure 23:
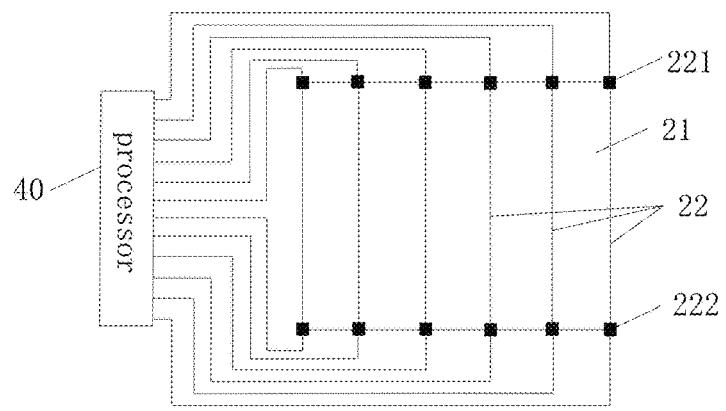

Alternatively, referring to FIGS. 22 to 25, the transparent collimation conductive film 21 is a single layer and is provided on the collimating incident surface 201 or the collimating exit surface 202 of the collimating element 20. A plurality of collimation conductive electrodes 22 is disposed on the transparent collimation conductive film 21. The plurality of collimation conductive electrodes 22 does not intersect with each other. Each of the plurality of collimation conductive electrodes 22 includes a collimation input end 221 and a collimation output end 222. Each of the plurality of collimation input ends 221 and each of the plurality of collimation output ends 222 is coupled to the processor 40 to form a conductive loop. In this way, the plurality of collimation input ends 221 and the plurality of collimation output ends 222 of the plurality of collimation conductive electrodes 22 are coupled to the processor 40 to form a plurality of conductive loops. The plurality of collimation conductive electrodes 22 may be arranged in various manners. For example, the wiring direction of each of the plurality of collimation input ends 221 and each of the plurality of collimation output ends 222 (i.e., the extending direction of each of the plurality of collimation conductive electrodes 22) may be the longitudinal direction of the transparent collimation conductive film 21, and the plurality of collimation conductive electrodes 22 may be arranged in parallel at intervals along the width direction of the transparent collimation conductive film 21 (as illustrated in FIG. 22). Or the wiring direction of each of the plurality of collimation input ends 221 and each of the plurality of collimation output ends 222 may be the width direction of the transparent collimation conductive film 21, and the plurality of collimation conductive electrodes 22 may be arranged in parallel at intervals along the longitudinal direction of the transparent collimation conductive film 21 (as illustrated in FIG. 23). Or the wiring direction of each of the plurality of collimation input ends 221 and each of the plurality of collimation output ends 222 may be the diagonal direction of the transparent collimation conductive film 21, and the plurality of collimation conductive electrodes 22 may be arranged in parallel at intervals along the other diagonal direction of the transparent collimation conductive film 21 (as illustrated FIGS. 24 and 25). Regardless of the way the plurality of collimation conductive electrodes 22 is arranged, the plurality of collimation conductive electrodes 22 may occupy a larger area of the transparent collimation conductive film 21 compared to the one collimation conductive electrode 22, and output more electrical signals correspondingly. When only the one collimation conductive electrode 22 is provided, there is a possibility that the fracture position of the collimating element 20 is far from the one collimation conductive electrode 22, which has little effect on the one collimation conductive electrode 22, and the electrical signal output by the one collimation conductive electrode 22 is still within the preset range, thus the detection accuracy is low. In the present embodiment, the plurality of collimation conductive electrodes 22 may occupy a larger area of the transparent collimation conductive film 21, and correspondingly, it may output more electrical signals, and the processor 40 may more accurately determine whether the transparent collimation conductive film 21 is damaged, according to more electrical signals, and further determine whether the collimating element 20 is fractured, thereby improving the accuracy of detecting the fracture of the collimating element 20.

Figure 26:
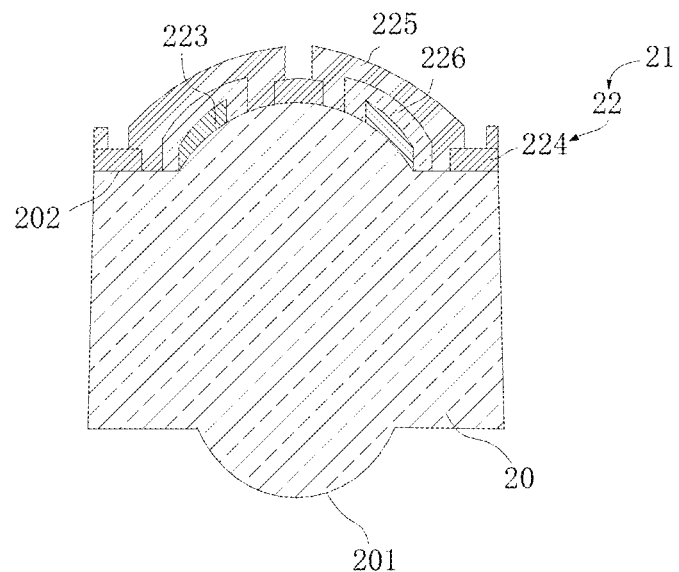
FIG. 26 illustrates a schematic diagram of a collimating element according to some embodiments of the present disclosure.
Figure 27:
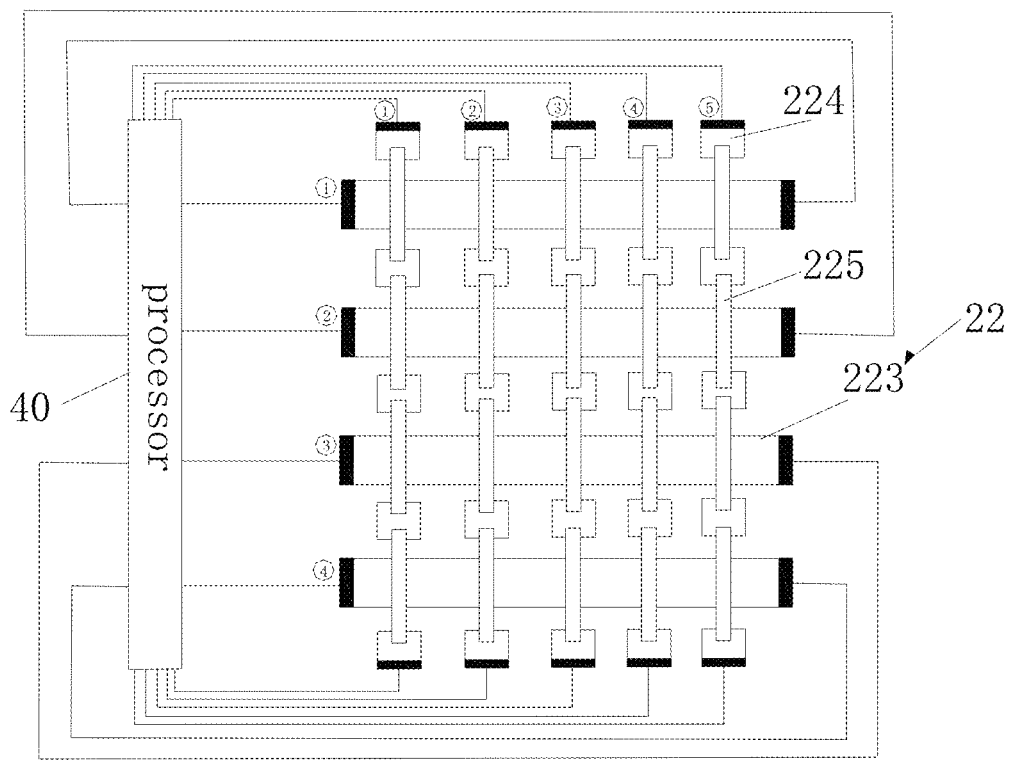
FIG. 27 illustrates a schematic diagram of conductive electrodes of a collimating element according to some embodiments of the present disclosure.

Alternatively, referring to FIGS. 26 and 27, the transparent collimation conductive film 21 having a single-layer bridge structure, is disposed on the collimating incident surface 201 (not illustrated) or the collimating exit surface 202 (as illustrated in FIG. 26) of the collimating element 20. In detail, the plurality of collimation conductive electrodes 22 includes a plurality of first collimation conductive electrodes 223 arranged in parallel, a plurality of second collimation conductive electrodes 224 arranged in parallel, and a plurality of bridging collimation conductive electrodes 225. The plurality of first collimation conductive electrodes 223 and the plurality of second collimation conductive electrodes 224 are crisscrossed. Each of the plurality of first collimation conductive electrodes 223 is continuous without interruption. Each of the plurality of second collimation conductive electrodes 224 is interrupted with the plurality of first collimation conductive electrodes 223 at crisscross points, and insulated from the plurality of first collimation conductive electrodes 223. Each of the plurality of bridging collimation conductive electrodes 225 is coupled to a corresponding and interrupted second collimation conductive electrode 224 at breakpoints. A collimation insulator 226 is provided at a crisscross position between each of the plurality of bridging collimation conductive electrodes 225 and each of the plurality of first collimation conductive electrodes 223. Both ends of each of the plurality of first collimation conductive electrodes 223 are coupled to the processor 40 to form a conductive loop, and both ends of each of the plurality of second collimation conductive electrodes 224 are coupled to the processor 40 to form a conductive loop. Therefore, both ends of the plurality of first collimation conductive electrodes 223 and the processor 40 are coupled to form a plurality of conductive loops, and both ends of the plurality of second collimation conductive electrodes 224 are coupled to the processor 40 to form a plurality of conductive loops. The material of the collimation insulator 226 may be an organic material having good transmissivity and insulation properties. The collimation insulator 226 may be formed by a silk screen printing, or a photolithographic process. The plurality of collimation conductive electrodes 22 may be arranged in parallel, and the plurality of collimation conductive electrodes 22 penetrates through and is provided in the transparent collimation conductive film 21 to form the plurality of first collimation conductive electrodes 223 and the plurality of second collimation conductive electrodes 224. The plurality of first collimation conductive electrodes 223 and the plurality of second collimation conductive electrodes 224 are crisscrossed, meaning that the plurality of first collimation conductive electrodes 223 and the plurality of second collimation conductive electrodes 224 are vertically interlaced. That is, the angle between each of the plurality of first collimation conductive electrodes 223 and each of the plurality of second collimation conductive electrodes 224 is 90 degrees. In other embodiments, the plurality of first collimation conductive electrodes 223 and the plurality of second collimation conductive electrodes 224 may be crisscrossed, also meaning that the plurality of first collimation conductive electrodes 223 and the plurality of second collimation conductive electrodes 224 are slantingly interlaced. In use, the processor 40 may simultaneously energize the plurality of first collimation conductive electrodes 223 and the plurality of second collimation conductive electrodes 224 to obtain electrical signals, or the processor 40 may sequentially energize the plurality of first collimation conductive electrodes 223 and the plurality of second collimation conductive electrodes 224 to obtain electrical signal. Then the processor 40 determines whether the transparent collimation conductive film 21 is damaged according to the electrical signals. Referring to FIG. 27, when it is detected that the electrical signal output by the first collimation conductive electrode 223 numbered ③ is not within the preset range, and the electrical signal output by the second collimation conductive electrode 224 numbered ③ is not within the preset range, the transparent collimation conductive film 21 is damaged at the crisscross point between the first collimation conductive electrode 223 numbered ① and the second collimation conductive electrode 224 numbered ③, and the position of the collimating element 20 corresponding to the fracture position of the transparent collimation conductive film 21 is also damaged. Thus, whether the diffractive element 30 is fractured and the specific fracture position may be accurately detected through the transparent collimation conductive film 21 having the single-layer bridge structure.

Figure 28:
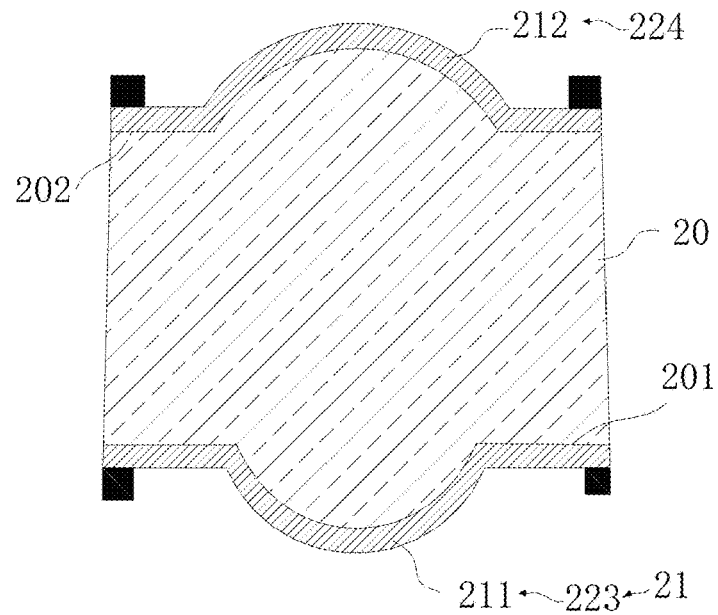
FIG. 28 illustrates a schematic diagram of a collimating element according to some embodiments of the present disclosure.

Referring to FIGS. 27 and 28, in some embodiments, the collimating element 20 includes a collimating incident surface 201 and a collimating exit surface 202 which are opposed. When the transparent collimation conductive film 21 is formed on the collimating element 20, the transparent collimation conductive film 21 includes a first collimation conductive film 211 disposed on the collimating incident surface 201 and a second collimation conductive film 212 disposed on the collimating exit surface 202. The first collimation conductive film 211 is provided with a plurality of first collimation conductive electrodes 223 disposed in parallel, and the second collimation conductive film 212 is provided with a plurality of second collimation conductive electrodes 224 disposed in parallel. Projections of the plurality of first collimation conductive electrodes 223 on the collimating exit surface 202 are crisscrossed with the plurality of second collimation conductive electrodes 224. Both ends of each of the plurality of first collimation conductive electrodes 223 are coupled to the processor 40 to form a conductive loop, and both ends of each of the plurality of second collimation conductive electrodes 224 are coupled to the processor 40 to form a conductive loop. Therefore, both ends of the plurality of first collimation conductive electrodes 223 and the processor 40 are coupled to form a plurality of conductive loops, and both ends of the plurality of second collimation conductive electrodes 224 and the processor 40 are coupled to form a plurality of conductive loops. The projections of the plurality of first collimation conductive electrodes 223 on the collimating exit surface 202 are crisscrossed with the plurality of second collimation conductive electrodes 224, meaning that the plurality of first collimation conductive electrodes 223 and the plurality of second collimation conductive electrodes 224 are vertically interlaced in space. That is, the angle between each of the projections of the plurality of first collimation conductive electrodes 223 on the collimating exit surface 202 and each of the plurality of second collimation conductive electrodes 224 is 90 degrees. In other embodiments, the projections of the plurality of first collimation conductive electrodes 223 on the collimating exit surface 202 are crisscrossed with the plurality of second collimation conductive electrodes 224, also meaning that the plurality of first collimation conductive electrodes 223 and the plurality of second collimation conductive electrodes 224 are slantingly interlaced in space. In use, the processor 40 may simultaneously energize the plurality of first collimation conductive electrodes 223 and the plurality of second collimation conductive electrodes 224 to obtain electrical signals, or the processor 40 may sequentially energize the plurality of first collimation conductive electrodes 223 and the plurality of second collimation conductive electrodes 224 to obtain electrical signals. Then the processor 40 determines whether the transparent collimation conductive film 21 is damaged according to the electrical signals, and further determines whether the collimating element 20 is fractured. Thus, whether the collimating element 20 is fractured and the specific fracture position may be accurately detected according to the electrical signals output by the plurality of first collimation conductive electrodes 223 and the plurality of second collimation conductive electrodes 224.

In some embodiments, in the act at block 012, the electrical signal output by the collimation conductive electrode 22 and/or the diffraction conductive electrode 32 after being energized may be obtained before turning on the laser projection module 100. In detail, each time before turning on the laser projection module 100, the processor 40 sequentially or simultaneously energizes the diffraction conductive electrode 32 on the diffractive element 30 and the collimation conductive electrode 22 on the collimating element 20, obtains the electrical signals output by the collimation conductive electrode 22 and the diffraction conductive electrode 32, and determines whether the diffractive element 30 and the collimating element 20 are fractured according to the electric signals. When it is detected that any of the diffractive element 30 and the collimating element 20 is fractured, the laser projection module 100 cannot be turned on, thereby avoiding this case that the energy of the laser light projected by the laser projection module 100 is too high to jeopardize the user's eyes.

Figure 29:
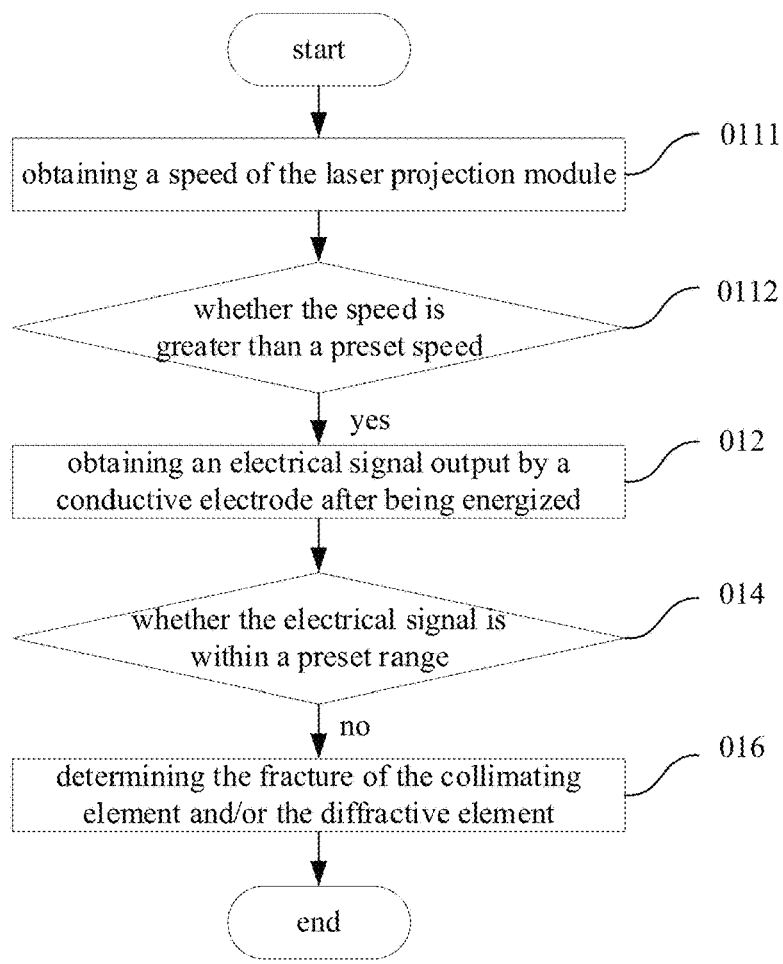
FIG. 29 illustrates a flow chart of a method for detecting a fracture of a laser projection module according to some embodiments of the present disclosure.

Referring to FIG. 29, in some embodiments, the method for detecting the fracture of the laser projection module 100 further includes acts in the following blocks.

At block 0111: a speed of the laser projection module 100 is detected.

At block 0112: it is determined whether the speed is greater than a preset speed, and an electrical signal outputted by the collimation conductive electrode 22 and/or the diffraction conductive electrode 32 after being energized is obtained in response to the speed of the laser projection module 100 being greater than the preset speed.

Referring to FIG. 2, in some embodiments, both the act in block 0111 and the act in block 0112 may be implemented by the processor 40. That is, the processor 40 may be configured to detect the speed of the laser projection module 100, and to determine whether the speed is greater than the preset peed, and to obtain the electrical signal output by the collimation conductive electrode 22 and/or the diffraction conductive electrode 32 after being energized in response to the speed of the laser projection module 100 being greater than the preset speed.

The speed sensor may be configured to detect the speed of the laser projection module 100. The speed sensor may be installed in the laser projection module 100, or may be installed together with the laser projection module 100 in the electronic device 3000 (illustrated in FIG. 35). The speed sensor detects the speed of the electronic device 3000, and further obtains the speed of the laser projection module 100. When the speed of the laser projection module 100 is large, it indicates that the laser projection module 100 may fall down. At this time, the processor 40 sequentially or simultaneously energizes the diffraction conductive electrode 32 on the diffractive element 30 and the collimation conductive electrode 22 on the collimating element 20, obtains the electrical signals output by the collimation conductive electrode 22 and the diffraction conductive electrode 32, and determines whether the diffractive element 30 and the collimating element 20 are fractured according to the electric signals. Upon detecting that any of the diffractive element 30 and the collimating element 20 is fractured, it is determined that the laser projection module 100 is fractured. In this way, it is not necessary to detect the fracture of the laser projection module 100 every time the laser projection module 100 is used, and the power consumption of the laser projection module 100 may be reduced.

Referring to FIG. 2, in some embodiments, the laser projection module 100 provided in the embodiments of the present disclosure further includes a lens barrel assembly 50 and a substrate assembly 56. The lens barrel assembly 50 is disposed on the substrate assembly 56 and forms an accommodating cavity 54 together with the substrate assembly 56. The substrate assembly 56 includes a substrate 64 and a circuit board 65 carried on the substrate 64. The lens barrel assembly 50 includes a lens barrel 51 and a protective cover 52. The lens barrel 51 includes a top wall 511 and an annular peripheral wall 512 extending from the top wall 511. The peripheral wall 512 is disposed on the substrate assembly 56, and the top wall 511 is provided with a through hole 513 communicating with the accommodating cavity 54. The protective cover 52 is disposed on the top wall 511. The protective cover 52 includes a baffle 521 having a light-emitting through hole 523 and an annular peripheral wall 522 extending from the baffle 521. The diffractive element 30 is carried on the top wall 511 and accommodated in the protective cover 52. The opposite sides of the diffractive element 30 are respectively in contact with the protective cover 52 and the top wall 511. The baffle 521 includes an abutting surface 5212 adjacent to the through hole 513, and the diffractive element 30 is in contact with the abutting surface 5212.

In detail, the diffractive element 30 includes a diffractive incident surface 301 and a diffractive exit surface 302 that are disposed oppositely. The diffractive element 30 is carried on the top wall 511, and the diffractive exit surface 302 is in contact with the surface (the abutting surface 5212) of the baffle 521 close to the through hole 513, and the diffractive incident surface 301 is in contact with the top wall 511. The through hole 513 is aligned with the accommodating cavity 54, and the light-emitting through hole 523 is aligned with the through hole 513. The top wall 511, the peripheral wall 522, and the baffle 521 are in contact with the diffractive element 30, thereby preventing the diffractive element 30 from coming off the protective cover 52 in the light emission direction. In some embodiments, the protective cover 52 is adhered to the top wall 511 by glue 55.

Reference to FIG. 2, in some embodiments, the collimating element 20 includes an optical portion 26 and a mounting portion 25 disposed around the optical portion 26. The collimating element 20 includes a collimating incident surface 201 and a collimating exit surface 202 disposed on the opposite sides of the collimating element 20. The optical portion 26 includes two curved surfaces on the opposite sides of the collimating element 20. The mounting portion 25 is in contact with the top wall 511. One of the curved surfaces of the optical portion 26 extends into the through hole 513.

When the laser projection module 100 described above is assembled, the collimating element 20 and the substrate assembly 56 on which the laser emitter 10 is mounted are placed in turn in the accommodating cavity 54 from the bottom end of the peripheral wall 512 along the optical path. The laser emitter 10 may be mounted on the substrate assembly 56 first, and the substrate assembly 56 on which the laser emitter 10 is mounted is coupled to the lens barrel assembly 50. The diffractive element 30 is carried on the top wall 511 against the direction of the optical path, and the protective cover 52 is mounted on the top wall 511, so that the diffractive element 30 is accommodated in the protective cover 52. Thus, the laser projection module 100 is simple to install. In other embodiments, the diffractive element 30 may be reversely disposed in the protective cover 52, and then the diffractive element 30 and the protective cover 52 may be mounted together on the top wall 511. At this time, the diffractive exit surface 302 of the diffractive element 30 is in contact with the abutting surface 5212, and the diffractive incident surface 301 is in contact with the top wall 511 and faces the collimating exit surface 202 of the optical portion 26, and the collimating incident surface 201 of the optical portion 26 faces the laser emitter 10. Thus, the installation of the laser projection module 100 is simpler.

In some embodiments, the laser emitter 10 may be a vertical-cavity surface-emitting laser (VCSEL) or an edge-emitting laser (EEL). The edge-emitting laser may be a distributed feedback laser (DFB).

Figure 30:
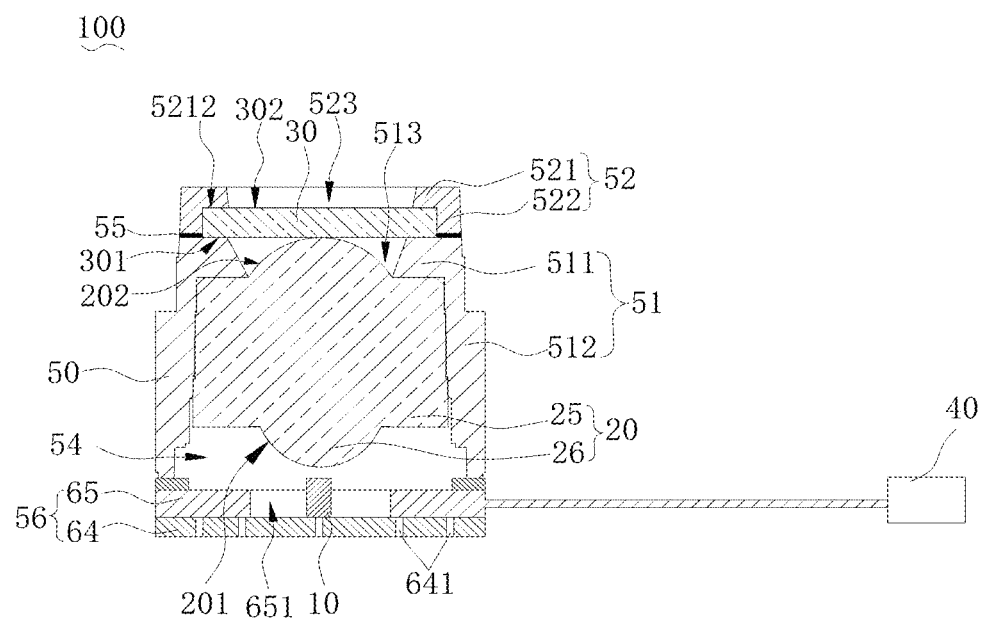
FIG. 30 illustrates a schematic diagram of a laser projection module according to some embodiments of the present disclosure.
Figure 31:
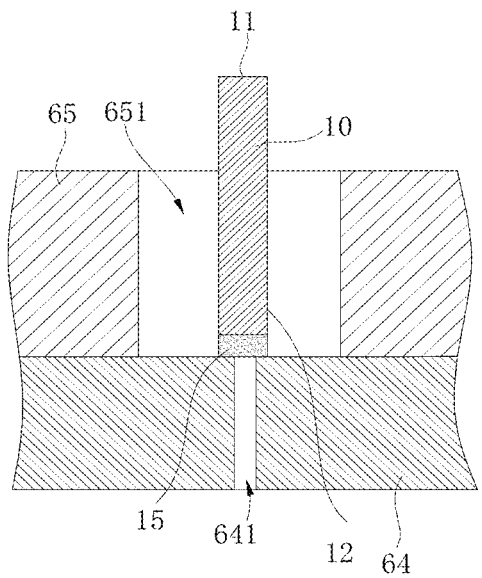
FIGS. 31 to 33 illustrate schematic diagrams of a part of a laser projection module according to some embodiments of the present disclosure.
Figure 32:
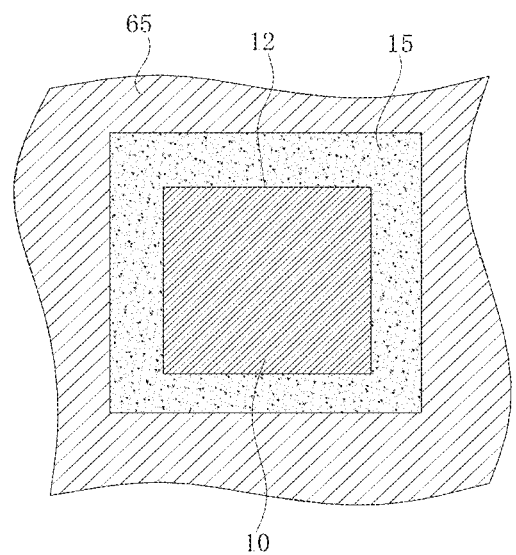

Referring to FIG. 30, when the laser emitter 10 is an edge-emitting laser, the laser emitter 10 is a columnar as a whole. One end surface of the laser emitter 10, which is away from the substrate 64, forms a light-emitting surface 11. The laser light is emitted from the light-emitting surface 11. The light-emitting surface 11 faces the collimating element 20. The laser emitter 10 is fixed to the substrate assembly 56. In detail, referring to FIG. 31, the laser emitter 10 may be attached to the substrate assembly 56 by a sealant 15. For example, the surface of the laser emitter 10 opposite to the light-emitting surface 11 is attached to the substrate assembly 56. Referring to FIG. 32, the connecting surface 12 of the laser emitter 10 may also be attached to the substrate assembly 56, and the sealant 15 encloses the connecting surface 12. Under this case, the sealant 15 may be a thermal conductive adhesive. The heat generated by the operation of the laser emitter 10 is transferred to the substrate assembly 56. When the laser projection module 100 adopts an edge-emitting laser, the temperature drift of the edge-emitting laser is smaller than that of the VCSEL array, and since the edge-emitting laser is a single-point illumination structure, it is not necessary to design an array structure, and the manufacture of the edge-emitting laser is sample, thus the cost of the light source of the laser projection module 100 is low.

When the laser light of the distributed feedback laser propagates, the gain of the power is obtained through the feedback of the grating structure. To increase the power of the distributed feedback laser, it is necessary to increase the injecting current and/or increase the length of the distributed feedback laser. Since increasing the injecting current will increase the power consumption of the distributed feedback laser and cause serious heat generation, in order to ensure the normal operation of the distributed feedback laser, it is necessary to increase the length of the distributed feedback laser, thus the distributed feedback laser usually has an elongate strip. When the light-emitting surface 11 of the edge-emitting laser faces the collimating element 20, the edge-emitting laser is placed vertically. Due to the structure of elongate strip of the edge-emitting laser, the edge-emitting laser is prone to accidents such as dropping, shifting or shaking.

Figure 33:
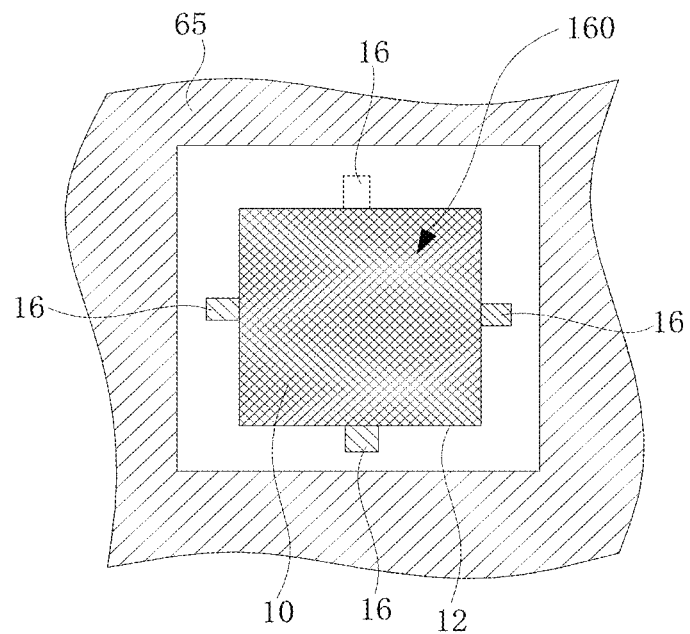

Referring to FIGS. 30 and 33, the laser emitter 10 may also be fixed to the substrate assembly 56 in a fixed manner as illustrated in FIG. 33. In detail, the laser projection module 100 includes a plurality of elastic support members 16. The plurality of support members 16 may be fixed to the substrate assembly 56, and collectively form the accommodating space 160. The laser emitter 10 is accommodated in the accommodating space 160 and supported by the plurality of support members 16. The laser emitter 10 may be directly mounted among the plurality of support members 16. In one example, the plurality of support members 16 collectively clamp the laser emitter 10 to further prevent the laser emitter 10 from shaking.

In some embodiments, the substrate 64 may also be omitted, and the laser emitter 10 may be directly fixed to the circuit board 65 to reduce the thickness of the laser projection module 100.

Figure 34:
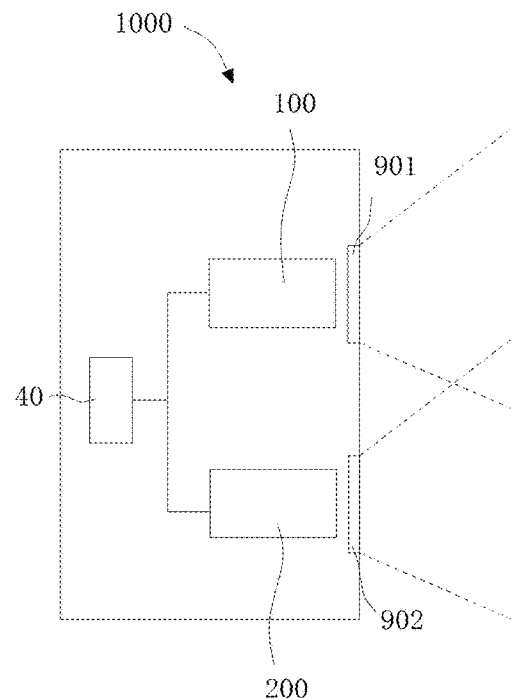
FIG. 34 illustrates a schematic diagram of a depth camera according to some embodiments of the present disclosure.

Referring to FIG. 34, the present disclosure also provides a depth camera 1000. The depth camera 1000 provided in the embodiment of the present disclosure includes the laser projection module 100 according to any one of the above embodiments, an image collector 200 and a processor 40. The image collector 200 is configured to collect the laser pattern diffracted by the diffractive element 30 and projected into a target space. The processor 40 is coupled to the laser projection module 100 and the image collector 200. The processor 40 is configured to process the laser pattern to obtain a depth image. The processor 40 herein may be the processor 40 in the laser projection module 100.

In detail, the laser projection module 100 projects the laser pattern into the target space through a projecting window 901, and the image collector 200 collects the laser pattern modulated by the target object through a collecting window 902. The image collector 200 may be an infrared camera. The processor 40 calculates an offset value between each pixel point in the laser pattern and the corresponding pixel point in the reference pattern through an image matching algorithm, and further obtains a depth image of the laser pattern according to offset values. The image matching algorithm may be a digital image correlation (DIC) algorithm, which may be replaced by other image matching algorithms.

The laser projection module 100 in the depth camera 1000 provided in the embodiment of the present disclosure employs the transparent collimation conductive film 21 and the collimation conductive electrode 22 disposed on the collimating element 20, and/or the transparent diffraction conductive film 31 and the diffraction conductive electrode 32 disposed on the diffractive element 30, to determine whether the collimating element 20 and/or the diffractive element 30 is fractured according to the electrical signal output by the collimation conductive electrode 22 and/or the diffraction conductive electrode 32. In this way, it may be detected whether the laser projection module 100 is intact. When it is detected that the laser projection module 100 is fractured, it may choose not to turn on the laser projection module 100, or turn off the laser light projected by the laser projection module 100 in time, or reduce the emission power of the laser projection module 100, such that the user's eyes may be protected from the high energy of the laser light projected by the fractured laser projection module 100, thereby improving the safety of the user.

Figure 35:
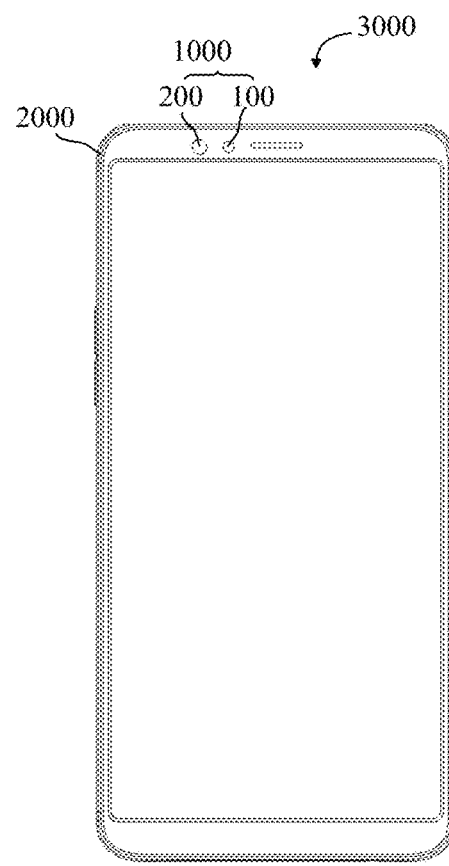
FIG. 35 illustrates a schematic diagram of an electronic device according to some embodiments of the present disclosure.

Referring to FIG. 35, the electronic device 3000 provided in an embodiment of the present disclosure includes a housing 2000, and the depth camera 1000 according to the above embodiment. The depth camera 1000 is disposed within the housing 2000 and exposed from the housing 2000 to obtain the depth image.

The laser projection module 100 in the electronic device 3000 provided in the embodiment of the present disclosure employs the transparent collimation conductive film 21 and the collimation conductive electrode 22 disposed on the collimating element 20, and/or the transparent diffraction conductive film 31 and the diffraction conductive electrode 32 disposed on the diffractive element 30, to determine whether the collimating element 20 and/or the diffractive element 30 is fractured according to the electrical signal output by the collimation conductive electrode 22 and/or the diffraction conductive electrode 32. In this way, it may be detected whether the laser projection module 100 is intact. When it is detected that the laser projection module 100 is fractured, it may choose not to turn on the laser projection module 100, or turn off the laser light projected by the laser projection module 100 in time, or reduce the emission power of the laser projection module 100, such that the user's eyes may be protected from the high energy of the laser light projected by the fractured laser projection module 100, thereby improving the safety of the user.

Referring to FIGS. 36 and 2, the present disclosure provides a method for detecting a fracture of a laser projection module 100. The laser projection module 100 includes a laser emitter 10, a collimating element 20, a diffractive element 30 and a processor 40. The laser emitter 10 is configured to emit laser light. The collimating element 20 is configured to collimate the laser light emitted by the laser emitter 10. The diffractive element 30 is configured to diffract the laser light collimated by the collimating element 20 to form a laser pattern. The collimating element 20 includes a collimating incident surface 201 and a collimating exit surface 202. The diffractive element 30 includes a diffractive incident surface 301 and a diffractive exit surface 302. The collimating element 20 and/or the diffractive element 30 include conductive particles 23/33 (illustrated in FIGS. 37 and 50). The conductive particles 23/33 are doped in the collimating element 20 and/or the diffractive element 30. In detail, the collimation conductive particles 23 may be doped only in the collimating element 20; or the diffraction conductive particles 33 may be doped only in the diffractive element 30; or the collimation conductive particles 23 may be doped in the collimating element 20, meanwhile the diffraction conductive particles 33 are also doped in the diffractive element 30. The conductive particles 23/33 form a conductive path 24/34 (illustrated in FIGS. 37 and 50). In detail, the collimation conductive particles 23 in the collimating element 20 form a collimation conductive path 24 of the collimating element 20, and the diffraction conductive particles 33 in the diffractive element 30 form a diffraction conductive path 34 of the diffractive element 30. The conductive path 24/34 is configured to output an electrical signal after being energized.

The method includes acts in the following blocks.

At block 022: an electrical signal output by the conductive path 24/34 after being energized is obtained.

At block 024: it is determined whether the electrical signal is within a preset range.

At block 026: the fracture of the collimating element 20 and/or the diffractive element 30 is determined in response to the electrical signal being not within the preset range.

The present disclosure also provides the laser projection module 100. Acts in blocks 022, 024, and 026 may be performed by the processor 40 in the laser projection module 100. That is, the processor 40 is configured to obtain the electrical signal output by the conductive path 24/34 after being energized, to determine whether the electrical signal is within the preset range, and to determine the fracture of the collimating element 20 and/or the diffractive element 30 in response to the electrical signal being not within the preset range.

In detail, the collimating element 20 is doped with the collimation conductive particles 23, and the collimation conductive particles 23 form the collimation conductive path 24. A resistance of the collimation conductive path 24 is related to the collimating element 20. For example, when the collimating element 20 is intact, the adjacent collimation conductive particles 23 are joined together, and the resistance of the collimation conductive path 24 is small, such as less than a third preset value. When the collimating element 20 is fractured, the junction among the collimation conductive particles 23 doped on the collimating element 20 is broken, and the resistance of the collimation conductive path 24 is close to infinity.

Based on the above features, it may be detected whether the collimating element 20 is fractured. For example, when the collimation conductive path 24 is energized, that is, when the voltage of a certain magnitude is applied to the collimation conductive path 24, the current output by the collimation conductive path 24 may be obtained by the processor 40. It may be detected whether the collimating element 20 is fractured based on the current output by the collimation conductive path 24 and obtained by the processor 40.

Therefore, in the first mode, it is determined whether the collimating element 20 is fractured according to a difference between the present electrical signal (i.e., current) output by the collimation conductive path 24 after being energized and the electrical signal detected when the collimating element 20 is intact. In the second mode, it is determined whether the collimating element 20 is fractured directly according to the present electrical signal (i.e., current) output by the collimation conductive path 24 in the collimating element 20 after being energized. In detail, when the present electrical signal output by the collimation conductive path 24 is not within the preset range, the collimating element 20 is fractured, and when the present electrical signal output by the collimation conductive path 24 is within the preset range, the collimating element 20 is intact.

Similarly, the diffractive element 30 is doped with the diffraction conductive particles 33, and the diffraction conductive particles 33 form the diffraction conductive path 34. A resistance of the diffraction conductive path 34 is related to the diffractive element 30. For example, when the diffractive element 30 is intact, the adjacent diffraction conductive particles 33 are joined together, and the resistance of the diffraction conductive path 34 is small, such as less than a fourth preset value. When the diffractive element 30 is fractured, the junction among the diffraction conductive particles 33 doped in the diffractive element 30 is broken, and the resistance of the diffraction conductive path 34 is close to infinity.

Based on the above features, it may be detected whether the diffractive element 30 is fractured. For example, when the diffraction conductive path 34 is energized, that is, when the voltage of a certain magnitude is applied to the diffraction conductive path 34, the current output by the diffraction conductive path 34 may be obtained by the processor 40. It may be detected whether the diffractive element 30 is fractured based on the current output by the diffraction conductive path 34 and obtained by the processor 40.

Therefore, in the first mode, it is determined whether the diffractive element 30 is fractured according to a difference between the present electrical signal (i.e., current) output by the diffraction conductive path 34 after being energized and the electrical signal detected when the diffractive element 30 is intact. In the second mode, it is determined whether the diffractive element 30 is fractured directly according to the present electrical signal (i.e., current) output by the diffraction conductive path 34 in the diffractive element 30 after being energized. In detail, when the present electrical signal (i.e., current) output by the diffraction conductive path 34 is not within the preset range, the diffractive element 30 is fractured, and when the present electrical signal (i.e., current) output by the diffraction conductive path 34 is within the preset range, the diffractive element 30 is intact.

When the collimating element 20 is doped with the collimation conductive particles 23 and the diffractive element 30 is also doped with the diffraction conductive particles 33, the processor 40 may obtain the electrical signal output by the collimation conductive path 24 in the collimating element 20, and the electrical signal output by the diffraction conductive path 34 in the diffractive element 30. The processor 40 may determine whether the collimating element 20 is fractured according to the electrical signal output by the collimation conductive path 24 in the collimating element 20, and determine whether the diffractive element 30 is fractured according to the electrical signal output by the diffraction conductive path 34 in the diffractive element 30. Therefore, the processor 40 may distinguish whether the collimating element 20 is fractured, or the diffractive element 30 is fractured, or the collimating element 20 and the diffractive elements 30 are all fractured.

With the laser projection module 100, and the method for detecting the fracture of the laser projection module 100, provided in the embodiments of the present application, by doping the collimation conductive particles 23 into the collimating element 20 to form the collimation conductive path 24, and/or doping the diffraction conductive particles 33 into the diffractive element 30 to form the diffraction conductive path 34, and determining whether the collimating element 20 and/or the diffractive element 30 is fractured according to the electrical signal output by the conductive path 24/34. In this way, it may be detected whether the laser projection module 100 is intact. When it is detected that the laser projection module 100 is fractured, it may choose not to turn on the laser projection module 100, or turn off the laser light projected by the laser projection module 100 in time, or reduce the emission power of the laser projection module 100, such that the user's eyes may be protected from the high energy of the laser light projected by the fractured laser projection module 100, thereby improving the safety of the user.

Figure 40:
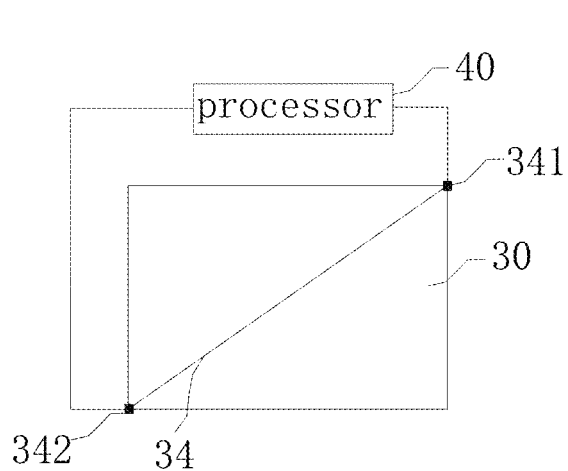
Figure 41:
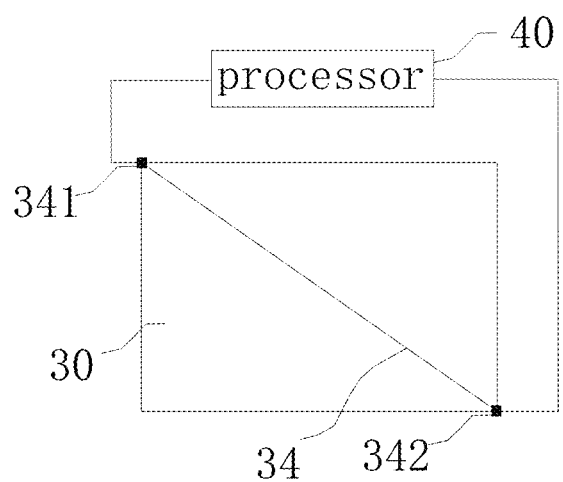

Referring to FIGS. 37 to 41, in some embodiments, the diffractive element 30 is doped with a plurality of diffraction conductive particles 33. The plurality of diffraction conductive particles 33 forms one diffraction conductive path 34. The diffraction conductive path 34 includes a diffraction input end 341 and a diffraction output end 342. The diffraction input end 341 and the diffraction output end 342 are coupled to the processor 40 to form a conductive loop. The diffraction conductive path 34 may be arranged in various manners. For example, the extending direction of the diffraction conductive path 34 may be the longitudinal direction of the diffractive element 30 (if the diffractive element 30 is circular, the longitudinal direction is the first radial direction of the diffractive element 30, and the interpretation of the "longitudinal direction" of the diffractive element 30 in the following may be the same, as illustrated in FIG. 38). Or the extending direction of the diffraction conductive path 34 may be the width direction of the diffractive element 30 (if the diffractive element 30 is circular, the width direction is the second radial direction perpendicular to the first radial direction of the diffractive element 30, and the interpretation of the "width direction" of the diffractive element 30 in the following may be the same, as illustrated in FIG. 39). Or the extending direction of the diffraction conductive path 34 may be the diagonal direction of the diffractive element 30 (as illustrated in FIGS. 40 and 41). Regardless of the way it is managed, the diffraction conductive path 34 may span the entire diffractive element 30, and it is possible to more accurately detect whether the diffractive element 30 is fractured.

Figure 42:
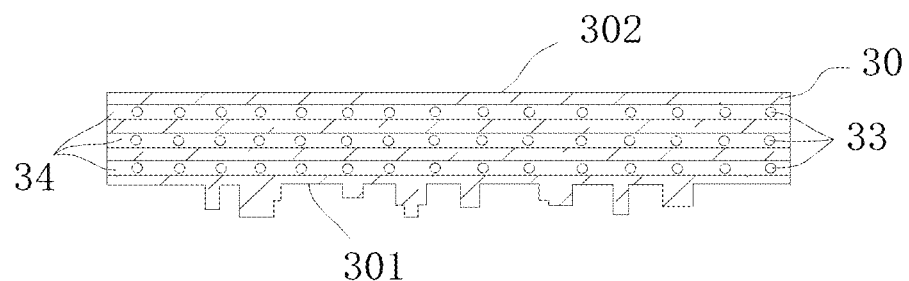
FIG. 42 illustrates a cross-sectional view of a diffractive element according to some embodiments of the present disclosure.
Figure 43:
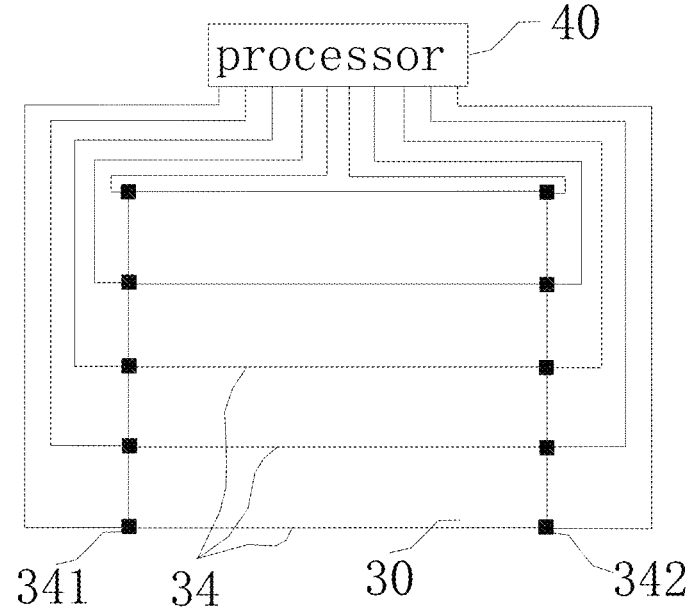
FIGS. 43 to 46 illustrate schematic diagrams of conductive paths of a diffractive element according to some embodiments of the present disclosure.
Figure 44:
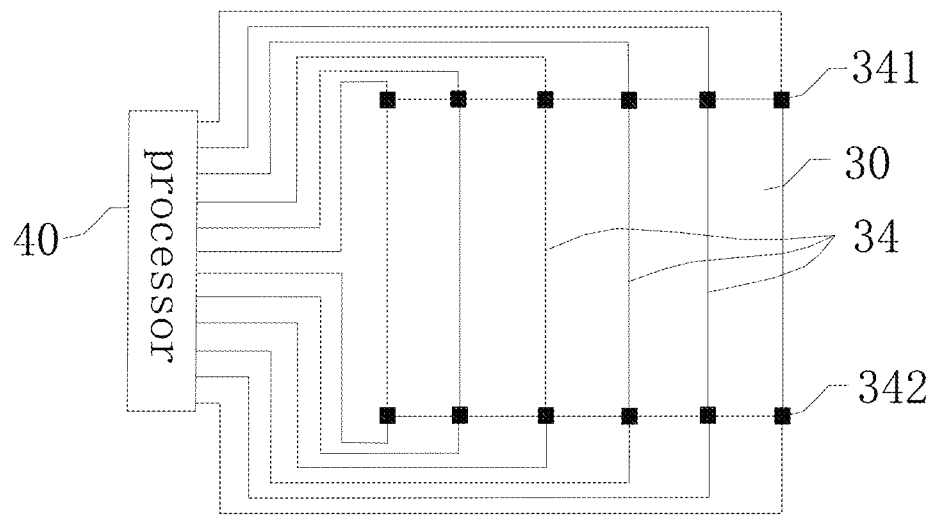
Figure 45:
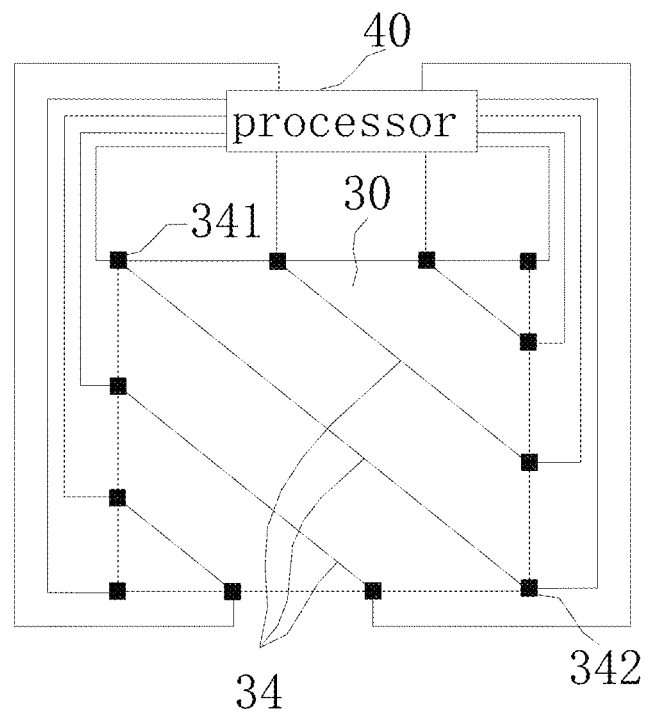
Figure 46:
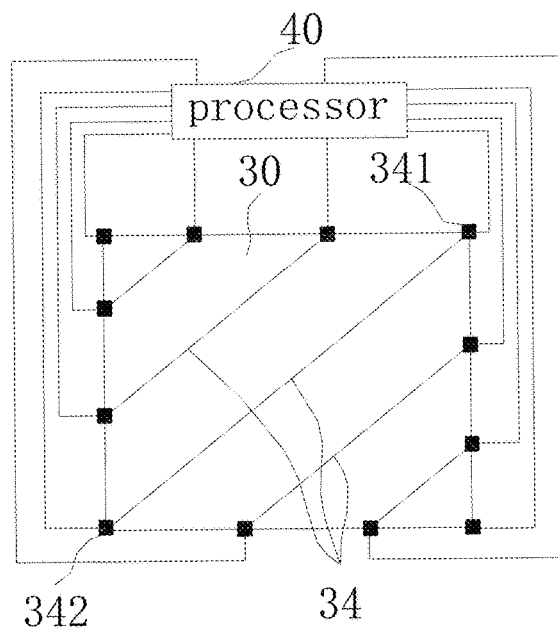

Referring to FIGS. 42 to 46, in some embodiments, the diffractive element 30 is doped with a plurality of diffraction conductive particles 33. The plurality of diffraction conductive particles 33 forms a plurality of diffraction conductive paths 34. The plurality of diffraction conductive paths 34 does not intersect with each other and is insulated from each other. Each of the plurality of diffraction conductive paths 34 includes a diffraction input end 341 and a diffraction output end 342. Each of the plurality of diffraction input ends 341 and each of the plurality of diffraction output ends 342 are coupled to the processor 40 to form a conductive loop. Thus, the plurality of diffraction input ends 341 and the plurality of diffraction output ends 342 of the plurality of diffraction conductive paths 34 are coupled to the processor 40 to form a plurality of conductive loops. The plurality of diffraction conductive paths 34 may be arranged in various manners. For example, the extending direction of each of the plurality of diffraction conductive paths 34 may be the longitudinal direction of the diffractive element 30 (as illustrated in FIG. 43), and the plurality of diffraction conductive paths 34 may be arranged in parallel at intervals along the width direction of the diffractive element 30. Since the diffractive element 30 has a certain thickness, the plurality of diffraction conductive paths 34 may be stacked at intervals along the thickness direction of the diffractive element 30 after being arranged in parallel at intervals along the width direction of the diffractive element 30 (as illustrated in FIG. 42). Or, the extending direction of each of the plurality of diffraction conductive paths 34 may be the width direction of the diffractive element 30 (as illustrated in FIG. 44), and the plurality of diffraction conductive paths 34 may be arranged in parallel at intervals along the longitudinal direction of the diffractive element 30. Since the diffractive element 30 has a certain thickness, the plurality of diffraction conductive paths 34 may be stacked at intervals along the thickness direction of the diffractive element 30 after being arranged in parallel at intervals along the longitudinal direction of the diffractive element 30. Or, the extending direction of each of the plurality of diffraction conductive paths 34 may be the diagonal direction of the diffractive incident surface 301 of the diffractive element 30 (as illustrated in FIGS. 45 and 46), and the plurality of diffraction conductive paths 34 may be arranged in parallel at intervals along the other diagonal direction of the diffractive incident surface 301 of the diffractive element 30. Since the diffractive element 30 has a certain thickness, the plurality of diffraction conductive paths 34 may be stacked at intervals along the thickness direction of the diffractive element 30 after being arranged in parallel at intervals along the other diagonal direction of the diffractive element 30. Or, the extending direction of each of the plurality of diffraction conductive paths 34 may be the diagonal direction (not illustrated) of the diffractive incident surface 301 and the diffractive exit surface 302 of the diffractive element 30, and the plurality of diffraction conductive paths 34 may be arranged in parallel at intervals along the other diagonal direction of the diffractive incident surface 301 and the diffractive exit surface 302 of the diffractive element 30. Or, each of the plurality of diffraction conductive paths 34 may be arranged in parallel at intervals along the thickness direction of the diffractive element 30 (not illustrated). Since the diffractive element 30 has a certain width, the plurality of diffraction conductive paths 34 may be stacked at intervals along the width direction of the diffractive element 30 after being disposed in parallel at intervals along the thickness direction of the diffractive element 30. Regardless of the way the plurality of diffraction conductive paths 34 is arranged, the plurality of diffraction conductive paths 34 may occupy a larger area of the diffractive element 30 compared to one diffraction conductive path 34, and output more electrical signals correspondingly. When only one diffraction conductive path 34 is provided, there is a possibility that the fracture position of the diffractive element 30 is far from the one diffraction conductive path 34, which has little effect on the one diffraction conductive path 34, and the electrical signal output by the one diffraction conductive path 34 is still within the preset range, thus the detection accuracy is low. In the present embodiment, the plurality of diffraction conductive paths 34 occupy a larger area of the diffractive element 30, and correspondingly, it may output more electrical signals, and the processor 40 may more accurately determine whether the diffractive element 30 is fractured, according to more electrical signals, thereby improving the accuracy of detecting the fracture of the diffractive element 30.

Figure 47:
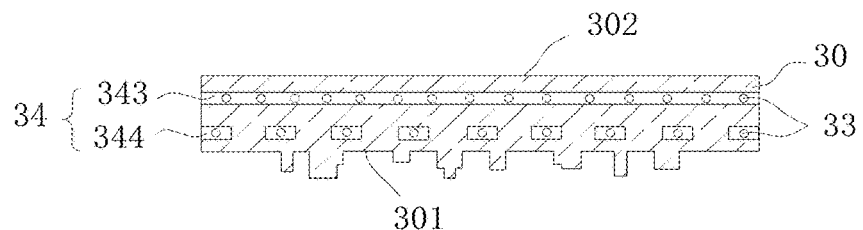
FIG. 47 illustrates a cross-sectional view of a diffractive element according to some embodiments of the present disclosure.
Figure 48:
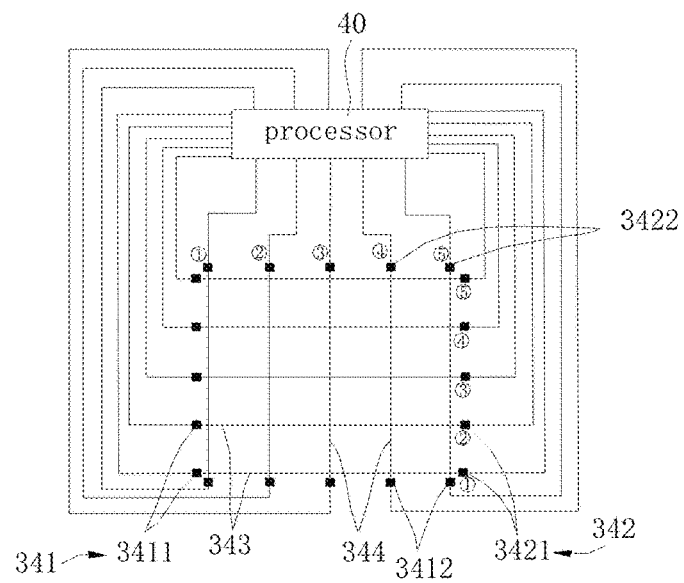
FIG. 48 illustrates a schematic diagram of conductive paths of a diffractive element according to some embodiments of the present disclosure.

Referring to FIGS. 47 and 48, in some embodiments, the diffractive element 30 is doped with a plurality of diffraction conductive particles 33. The plurality of diffraction conductive particles 33 forms a plurality of diffraction conductive paths 34. The plurality of diffraction conductive paths 34 includes a plurality of first diffraction conductive paths 343 and a plurality of second diffraction conductive paths 344. The plurality of first diffraction conductive paths 343 may be arranged in parallel at intervals, and the plurality of second diffraction conductive paths 344 may be arranged in parallel at intervals. The plurality of first diffraction conductive paths 343 and the plurality of second diffraction conductive paths 344 are in space crisscrossed. Each of the plurality of first diffraction conductive paths 343 includes a first diffraction input end 3411 and a first diffraction output end 3421. Each of the plurality of second diffraction conductive paths 344 includes a second diffraction input end 3412 and a second diffraction output end 3422. Each of the plurality of first diffraction input ends 3411 and each of the plurality of first diffraction output ends 3421 are coupled to the processor 40 to form a conductive loop, and each of the plurality of second diffraction input ends 3412 and each of the plurality of second diffraction output ends 3422 are coupled to the processor 40 to form a conductive loop. Therefore, both ends of the plurality of first diffraction conductive paths 343 are coupled to the processor 40 to form a plurality of conductive loops. Both ends of the plurality of second diffraction conductive paths 344 are coupled to the processor 40 to form a plurality of conductive loops. The plurality of first diffraction conductive paths 343 and the plurality of second diffraction conductive paths 344 are in space crisscrossed, meaning that the plurality of first diffraction conductive paths 343 and the plurality of second diffraction conductive paths 344 are vertically interlaced in space. That is, the angle between each of the plurality of first diffraction conductive paths 343 and each of the plurality of second diffraction conductive paths 344 is 90 degrees. At this time, the extending direction of the plurality of first diffraction conductive paths 343 is the longitudinal direction of the diffractive element 30, and the extending direction of the plurality of second diffraction conductive paths 344 is the width direction of the diffractive element 30. Or, the extending direction of the plurality of first diffraction conductive paths 343 is the thickness direction of the diffractive element 30, and the extending direction of the plurality of second diffraction conductive paths 344 is the longitudinal direction of the diffractive element 30. In other embodiments, the plurality of first diffraction conductive paths 343 and the plurality of second diffraction conductive paths 344 are crisscrossed in space, also meaning that the plurality of first diffraction conductive paths 343 and the plurality of second diffraction conductive paths 344 may be slantingly interlaced in space. In use, the processor 40 may simultaneously energize the plurality of first diffraction conductive paths 343 and the second plurality of diffraction conductive paths 344 to obtain electrical signals, or the processor 40 may sequentially energize the plurality of first diffraction conductive paths 343 and the plurality of second diffraction conductive paths 344 to obtain electrical signals. Then the processor 40 determines whether the diffractive element 30 is fractured according to the electrical signals. Referring to FIG. 48, when it is detected that the electrical signal output by the first diffraction conductive path 343 numbered ② is not within the preset range, and the electrical signal output by the second diffraction conductive paths 344 numbered ④ is not within the preset range, the diffractive element 30 is fractured at the crisscross point between the first diffraction conductive path 343 numbered ② and the second diffraction conductive paths 344 numbered ④, and the corresponding position of the diffractive element 30 is also fractured. Thus, whether the diffractive element 30 is fractured and the specific fracture position may be accurately detected through the crisscrossed manner of arranging the plurality of first diffraction conductive paths 343 and the plurality of second diffraction conductive paths 344.

Referring to FIGS. 48 and 49, since the diffractive element 30 has a certain width and a certain thickness, each of the plurality of first diffraction conductive paths 343 and each of the plurality of second diffraction conductive paths are in space interlaced to form a mutually-intersected conductive path pair, and a plurality of mutually-intersected conductive path pairs may be formed in the width direction or the thickness direction of the diffractive element 30. Similarly, in use, the processor 40 may simultaneously energize the plurality of first diffraction conductive paths 343 and the plurality of second diffraction conductive paths 344 to obtain electrical signals, or the processor 40 may sequentially energize the plurality of first diffraction conductive paths 343 and the plurality of second diffraction conductive paths 344 to obtain electrical signals. Then the processor 40 determines whether the diffractive element 30 is fractured and the specific fracture position according to the electrical signals. When only one conductive path pair is provided, there is a possibility that the fracture position of the diffractive element 30 is far from the one conductive path pair, which has little effect on the one conductive path pair, and the electrical signal output by the first diffraction conductive path 343 and the second diffraction conductive path 344 in the one conductive path pair is still within the preset range, thus the detection accuracy is low. In the present embodiment, the plurality of conductive path pairs may occupy a larger area of the diffractive element 30, and it may output more electrical signals correspondingly, and the processor 40 may more accurately determine whether the diffractive element 30 is fractured and the specific fracture position according to more electrical signals, thereby improving the accuracy of detecting the fracture of the diffractive element 30.

Referring to FIGS. 50 to 54, in some embodiments, the collimating element 20 is doped with a plurality of collimation conductive particles 23. The plurality of collimation conductive particles 23 forms one collimation conductive path 24. The collimation conductive path 24 includes a collimation input end 241 and a collimation output end 242. The collimation input end 241 and the collimation output end 242 are coupled to the processor 40 to form a conductive loop. The collimation conductive path 24 may be arranged in various manners. For example, the extending direction of the collimation conductive path 24 may be the longitudinal direction of the collimating element 20 (as illustrated in FIG. 51). Or the extending direction of the collimation conductive path 24 may be the width direction of the collimating element 20 (as illustrated in FIG. 52). Or the extending direction of the collimation conductive path 24 may be the diagonal direction of the collimating element 20 (as illustrated in FIGS. 53 and 54). Regardless of the way it is managed, the collimation conductive path 24 may span the entire collimating element 20, and it is possible to more accurately detect whether the collimating element 20 is fractured.

Figure 58:
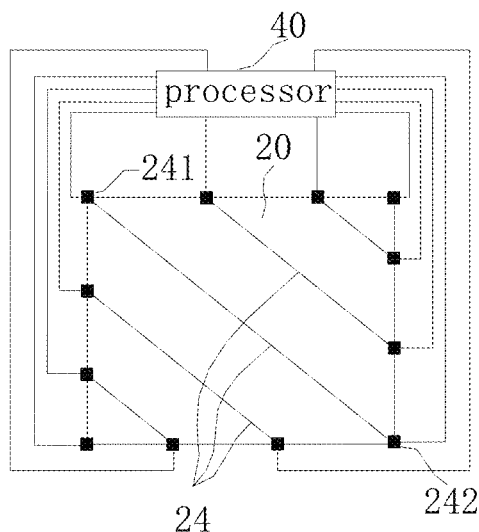
Figure 59:
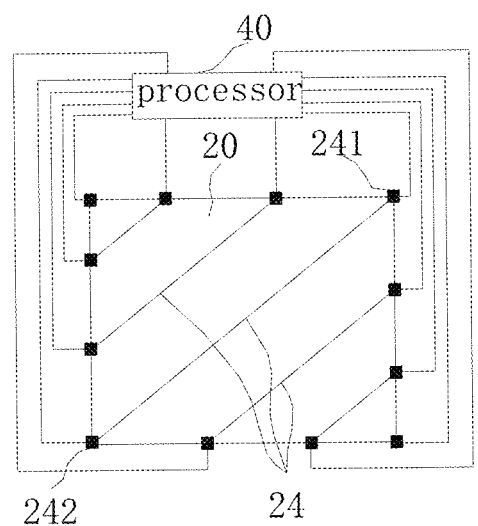

Referring to FIGS. 55 to 59, in some embodiments, the collimating element 20 is doped with a plurality of collimation conductive particles 23. The plurality of collimation conductive particles 23 forms a plurality of collimation conductive paths 24. The plurality of diffraction conductive paths 34 does not intersect with each other and is insulated from each other. Each of the plurality of collimation conductive paths 24 includes a collimation input end 241 and a collimation output end 242. Each of the plurality of collimation input ends 241 and each of the plurality of collimation output ends 242 are coupled to the processor 40 to form a conductive loop. Thus, the plurality of collimation input ends 241 and the plurality of collimation output ends 242 of the plurality of collimation conductive paths 24 are coupled to the processor 40 to form a plurality of conductive loops. The plurality of collimation conductive paths 24 may be arranged in various manners. For example, the extending direction of each of the plurality of collimation conductive paths 24 may be the longitudinal direction of the collimating element 20 (if the collimating element 20 is circular, the longitudinal direction is the first radial direction of the collimating element 20, and the interpretation of "the longitudinal direction of the collimating element 20" in the following may be the same, as illustrated in FIG. 56), and the plurality of collimation conductive paths 24 may be arranged in parallel at intervals along the width direction of the collimating element 20. Since the collimating element 20 has a certain thickness, the plurality of collimation conductive paths 24 may be stacked at intervals along the thickness direction of the collimating element 20 after being arranged in parallel at intervals along the width direction of the collimating element 20 (as illustrated in FIG. 55). Or, the extending direction of each of the plurality of collimation conductive paths 24 may be the width direction of the collimating element 20 (if the collimating element 20 is circular, the width direction is the second radial direction perpendicular to the first radial direction of the collimating element 20, and the interpretation of the "width direction" of the collimating element 20 in the following may be the same, as illustrated in FIG. 57), and the plurality of collimation conductive paths 24 may be arranged in parallel at intervals along the longitudinal direction of the collimating element 20. Since the collimating element 20 has a certain thickness, the plurality of collimation conductive paths 24 may be stacked at intervals along the thickness direction of the collimating element 20 after being arranged in parallel at intervals along the longitudinal direction of the collimating element 20. Or, the extending direction of each of the plurality of collimation conductive paths 24 may be the diagonal direction of the collimating incident surface 201 of the collimating element 20 (as illustrated in FIGS. 58 and 59), and the plurality of collimation conductive paths 24 may be arranged in parallel at intervals along the other diagonal direction of the collimating incident surface 201 of the collimating element 20. Since the collimating element 20 has a certain thickness, the plurality of collimation conductive paths 24 may be stacked at intervals along the thickness direction of the collimating element 20 after being arranged in parallel at intervals along the other diagonal direction of the collimating incident surface 201 of the collimating element 20. Or the extending direction of each of the plurality of collimation conductive paths 24 may be the diagonal direction (not illustrated) of the collimating incident surface 201 and the collimating exit surface 202 of the collimating element 20, and the plurality of collimation conductive paths 24 may be arranged in parallel at intervals along the other diagonal direction of the collimating incident surface 201 and the collimating exit surface 202 of the collimating element 20. Or, the plurality of collimation conductive paths 24 may be arranged in parallel at intervals along the thickness direction of the collimating element 20 (not illustrated). Since the collimating element 20 has a certain thickness, the plurality of collimation conductive paths 24 may be stacked at intervals along the width direction of the collimating element 20 after being arranged in parallel at intervals along the thickness direction of the collimating element 20. Regardless of the way the plurality of collimation conductive paths 24 are arranged, the plurality of collimation conductive paths 24 may occupy a larger area of the collimating element 20 compared to one collimation conductive path 24, and output more electrical signals correspondingly. When only one collimation conductive path 24 is provided, there is a possibility that the fracture position of the collimating element 20 is far from the one collimation conductive path 24, which has little effect on the one collimation conductive path 24, and the electrical signal output by the one collimation conductive path 24 is still within the preset range, thus the detection accuracy is low. In the present embodiment, the plurality of collimation conductive paths 24 occupy a larger area of the collimating element 20, and correspondingly, it may output more electrical signals, and the processor 40 may more accurately determine whether the collimating element 20 is fractured, according to more electrical signals, thereby improving the accuracy of detecting the fracture of the collimating element 20.

Figure 60:
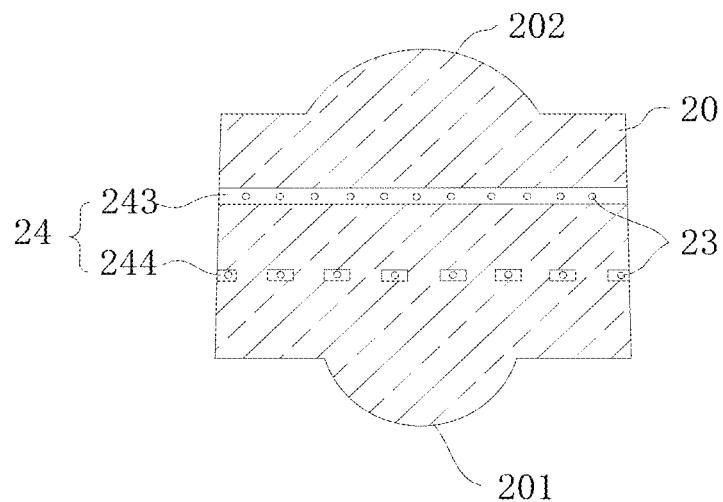
FIG. 60 illustrates a cross-sectional view of a collimating element according to some embodiments of the present disclosure.
Figure 61:
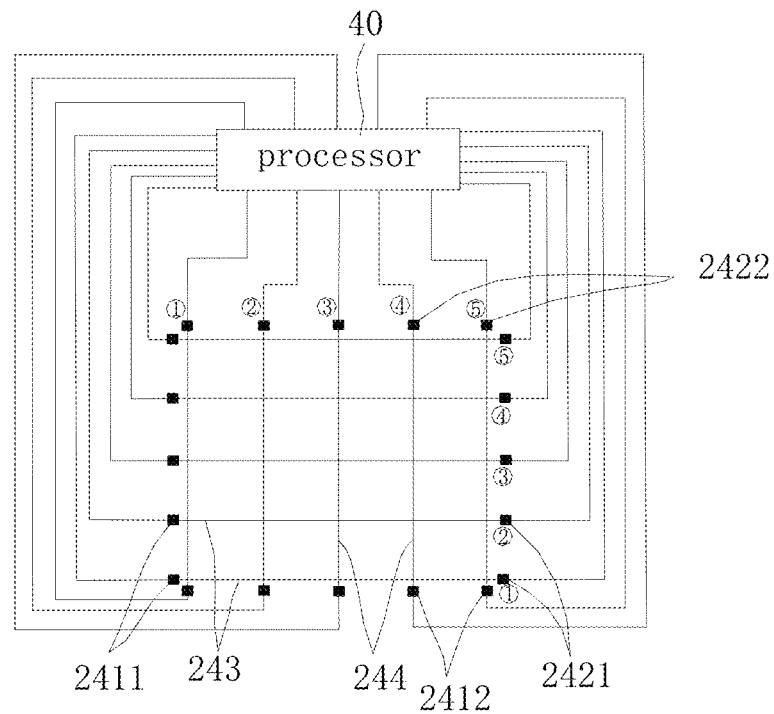
FIG. 61 illustrates a schematic diagram of conductive paths of a collimating element according to some embodiments of the present disclosure.

Referring to FIGS. 60 and 61, in some embodiments, the collimating element 20 is doped with a plurality of collimation conductive particles 23. The plurality of collimation conductive particles 23 forms a plurality of collimation conductive paths 24. The plurality of collimation conductive paths 24 includes a plurality of first collimation conductive paths 243 and a plurality of second collimation conductive paths 244. The plurality of first collimation conductive paths 243 may be arranged in parallel at intervals, and the plurality of second collimation conductive paths 244 may be arranged in parallel at intervals. The plurality of first collimation conductive paths 243 and the plurality of second collimation conductive paths 244 are in space crisscrossed. Each of the plurality of first collimation conductive paths 243 includes a first collimation input end 2411 and a first collimation output end 2421. Each of the plurality of second collimation conductive paths 244 includes a second collimation input end 2412 and a second collimation output end 2422. Each of the plurality of first collimation input ends 2411 and each of the plurality of first collimation output ends 2421 is coupled to the processor 40 to form a conductive loop, and each of the plurality of second collimation input ends 2412 and each of the plurality of second collimation output ends 2422 are coupled to processors 40 to form a conductive loop. Therefore, both ends of the plurality of first collimation conductive paths 243 are coupled to the processor 40 to form a plurality of conductive loops. Both ends of the plurality of second collimation conductive paths 244 are coupled to the processor 40 to form a plurality of conductive loops. The plurality of first collimation conductive paths 243 and the plurality of second collimation conductive paths 244 are in space crisscrossed, meaning that the plurality of first collimation conductive paths 243 and the plurality of second collimation conductive paths 244 are vertically interleaved in space. That is, the angle between each of the plurality of first collimation conductive paths 243 and each of the plurality of second collimation conductive paths 244 is 90 degrees. At this time, the extending direction of the plurality of first collimation conductive paths 243 is the longitudinal direction of the collimating element 20, and the extending direction of the plurality of second collimation conductive paths 244 is the width direction of the collimating element 20. Or, the extending direction of the plurality of first collimation conductive paths 243 is the thickness direction of the collimating element 20, and the extending direction of the plurality of second collimation conductive paths 244 is the longitudinal direction of the collimating element 20. In other embodiments, the plurality of first collimation conductive paths 243 and the plurality of second collimation conductive paths 244 are crisscrossed in space, also meaning that the plurality of first collimation conductive paths 243 and the plurality of second collimation conductive paths 244 may be slantingly interlaced in space. In use, the processor 40 may simultaneously energize the plurality of first collimation conductive paths 243 and the plurality of second collimation conductive paths 244 to obtain electrical signals, or the processor 40 may sequentially energize the plurality of first collimation conductive paths 243 and the plurality of second collimation conductive paths 244 to obtain electrical signals. Then the processor 40 determines whether the collimating element 20 is fractured according to the electrical signals. Referring to FIG. 61, when it is detected that the electrical signal outputted by the first collimation conductive path 243 numbered ② is not within the preset range, and the electrical signal output by the second collimation conductive path 244 numbered ④ is not in the preset range, it indicates that the collimating element 20 is fractured at a crisscross position of the first collimation conductive path 243 numbered ② and the second collimation conductive path 244 numbered ④, and the corresponding position of the collimating element 20 is also fractured. Thus, whether the collimating element 20 is fractured and the specific fracture position may be accurately detected through the crisscrossed manner of arranging the plurality of first collimation conductive paths 243 and the plurality of second collimation conductive paths 244.

Figure 62:
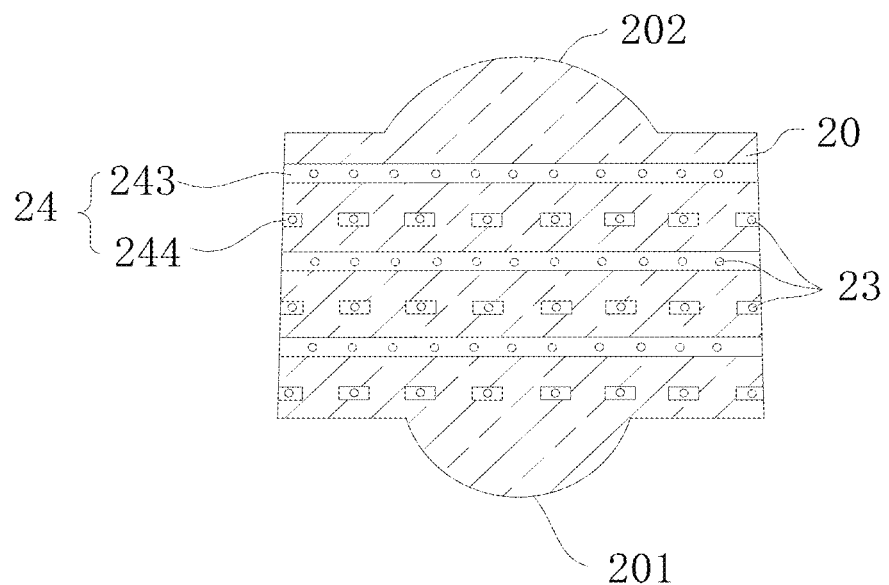
FIG. 62 illustrates a cross-sectional view of a collimating element according to some embodiments of the present disclosure.

Referring to FIGS. 61 and 62, since the collimating element 20 has a certain width and a certain thickness, each of the plurality of first collimation conductive paths 243 and each of the plurality of second collimation conductive paths 244 are in space interlaced to form a mutually-intersected conductive path pair, and a plurality of mutually-intersected conductive path pairs may be formed in the width direction or the thickness direction of the collimating element 20. Similarly, in use, the processor 40 may simultaneously energize the plurality of first collimation conductive paths 243 and the plurality of second collimation conductive paths 244 to obtain electrical signals, or the processor 40 may sequentially energize the plurality of first collimation conductive paths 243 and the plurality of second collimation conductive paths 244 to obtain electrical signals. Then the processor 40 determines whether the collimating element 20 is fractured and the specific fracture position according to the electrical signals. When only one conductive path pair is provided, there is a possibility that the fracture position of the collimating element 20 is far from the one conductive path pair, which has little effect on the one conductive path pair, and the electrical signal output by the first collimation conductive path 243 and the second collimation conductive path 244 in the one conductive path pair is still within the preset range, thus the detection accuracy is low. In the present embodiment, the plurality of conductive path pairs may occupy a larger area of the collimating element 20, and it may output more electrical signals correspondingly, and the processor 40 may more accurately determine whether the collimating element 20 is fractured and the specific fracture position according to more electrical signals, thereby improving the accuracy of detecting the fracture of the collimating element 20.

In some embodiments, in the act at block 022, the electrical signal output by the conductive path 24/34 after being energized may be obtained before turning on the laser projection module 100. In detail, each time before turning on the laser projection module 100, the processor 40 sequentially or simultaneously energizes the diffraction conductive path 34 and the collimation conductive path 24, obtains the electrical signals output by the diffraction conductive path 34 and the collimation conductive path 24, and determines whether the diffractive element 30 and the collimating element 20 are fractured according to the electric signals. When it is detected that any of the diffractive element 30 and the collimating element 20 is fractured, the laser projection module 100 cannot be turned on, thereby avoiding this case that the energy of the laser light projected by the laser projection module 100 is too high to jeopardize the user's eyes.

Figure 63:
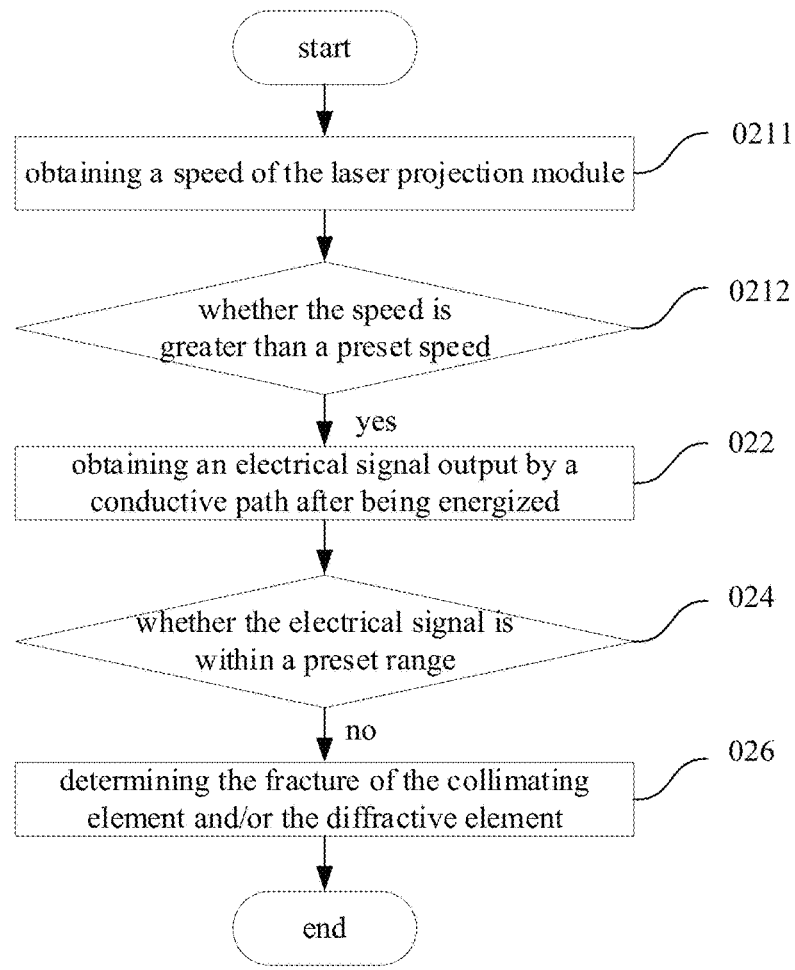
FIG. 63 illustrates a flow chart of a method for detecting a fracture of a laser projection module according to some embodiments of the present disclosure.

Referring to FIG. 63, in some embodiments, the method for detecting the fracture of the laser projection module 100 further includes acts in the following blocks.

At block 0211: a speed of the laser projection module 100 is detected.

At block 0212: it is determined whether the speed is greater than a preset speed, and an electrical signal outputted by the conductive path 24/34 after being energized is obtained in response to the speed of the laser projection module 100 being greater than the preset speed.

Referring to FIG. 2, in some embodiments, both the act in block 0211 and the act in block 0212 may be implemented by the processor 40. That is, the processor 40 may be configured to detect the speed of the laser projection module 100, and to determine whether the speed is greater than the preset speed, and to obtain the electrical signal output by the conductive path 24/34 after being energized in response to the speed of the laser projection module 100 being greater than the preset speed.

The speed sensor may be configured to detect the speed of the laser projection module 100. The speed sensor may be installed in the laser projection module 100, or may be installed together with the laser projection module 100 in the electronic device 3000 (illustrated in FIG. 35). The speed sensor detects the speed of the electronic device 3000, and further obtains the speed of the laser projection module 100. When the speed of the laser projection module 100 is large, it indicates that the laser projection module 100 may fall down. At this time, the processor 40 sequentially or simultaneously energizes the diffraction conductive path 34 and the collimation conductive path 24, obtains the electrical signals output by the diffraction conductive path 34 and the collimation conductive path 24, and determines whether the diffractive element 30 and the collimating element 20 are fractured according to the electric signals. Upon detecting that any of the diffractive element 30 and the collimating element 20 is fractured, it is determined that the laser projection module 100 is fractured. In this way, it is not necessary to detect the fracture of the laser projection module 100 every time the laser projection module 100 is used, and the power consumption of the laser projection module 100 may be reduced.

Referring to FIG. 2, in some embodiments, the laser projection module 100 provided in the embodiments of the present disclosure further includes a substrate assembly 56, a lens barrel 51, and a protective cover 52. The substrate assembly 56 includes a substrate 64 and a circuit board 65 carried on the substrate 64. The circuit board 65 is provided with a via 651. The laser emitter 10 is carried on the substrate 64 and accommodated in the via 651. The lens barrel 51 is provided with an accommodating cavity 54. The lens barrel 51 includes a top wall 511 and an annular peripheral wall 512 extending from the top wall 511. The peripheral wall 512 is disposed on the circuit board 65. The top wall 511 is provided with a through hole 513 communicating with the accommodating cavity 54. The collimating element 20 is accommodated in the accommodating cavity 54. The protective cover 52 is disposed on the top wall 511. The protective cover 52 includes a baffle 521 having a light-emitting through hole 523 and an annular peripheral wall 522 extending from the baffle 521. The diffractive element 30 is carried on the top wall 511 and accommodated in the protective cover 52. The opposite sides of the diffractive element 30 are respectively in contact with the protective cover 52 and the top wall 511. The baffle 521 includes an abutting surface 5212 adjacent to the through hole 513. The diffractive element 30 is in contact with the abutting surface 5212.

In detail, the diffractive element 30 includes a diffractive incident surface 301 and a diffractive exit surface 302 that are disposed oppositely. The diffractive element 30 is carried on the top wall 511, and the diffractive exit surface 302 is in contact with the surface (the abutting surface 5212) of the baffle 521 close to the through hole 513, and the diffractive incident surface 301 is in contact with the top wall 511. The through hole 513 is aligned with the accommodating cavity 54, and the light-emitting through hole 523 is aligned with the through hole 513. The top wall 511, the peripheral wall 522, and the baffle 521 are in contact with the diffractive element 30, thereby preventing the diffractive element 30 from coming off the protective cover 52 in the light emission direction. In some embodiments, the protective cover 52 is adhered to the top wall 511 by glue 55.

Reference to FIG. 2, in some embodiments, the collimating element 20 includes an optical portion 26 and a mounting portion 25 disposed around the optical portion 26. The collimating element 20 includes a collimating incident surface 201 and a collimating exit surface 202 disposed on the opposite sides of the collimating element 20. The optical portion 26 includes two curved surfaces on the opposite sides of the collimating element 20. The mounting portion 25 is in contact with the top wall 511. One of the curved surfaces of the optical portion 26 extends into the through hole 513.

When the laser projection module 100 described above is assembled, the collimating element 20 and the substrate assembly 56 on which the laser emitter 10 is mounted are placed in turn in the accommodating cavity 54 from the bottom end of the peripheral wall 512 along the optical path. The laser emitter 10 may be mounted on the substrate assembly 56 first, and the substrate assembly 56 on which the laser emitter 10 is mounted is coupled to lens barrel 51. The diffractive element 30 is carried on the top wall 511 against the direction of the optical path, and the protective cover 52 is mounted on the top wall 511, so that the diffractive element 30 is accommodated in the protective cover 52. Thus, the laser projection module 100 is simple to install. In other embodiments, the diffractive element 30 may be reversely disposed in the protective cover 52, and then the diffractive element 30 and the protective cover 52 may be mounted together on the top wall 511. At this time, the diffractive exit surface 302 of the diffractive element 30 is in contact with the abutting surface 5212, and the diffractive incident surface 301 is in contact with the top wall 511 and faces the collimating exit surface 202 of the optical portion 26, and the collimating incident surface 201 of the optical portion 26 faces the laser emitter 10. Thus, the installation of the laser projection module 100 is simpler.

In some embodiments, the laser emitter 10 may be a vertical-cavity surface-emitting laser (VCSEL) or an edge-emitting laser (EEL). The edge-emitting laser may be a distributed feedback laser (DFB).

Referring to FIG. 30, when the laser emitter 10 is an edge-emitting laser, the laser emitter 10 is a columnar as a whole. One end surface of the laser emitter 10, which is away from the substrate 64, forms a light-emitting surface 11. The laser light is emitted from the light-emitting surface 11. The light-emitting surface 11 faces the collimating element 20. The laser emitter 10 is fixed to the substrate assembly 56. In detail, referring to FIG. 31, the laser emitter 10 may be attached to the substrate assembly 56 by a sealant 15. For example, the surface of the laser emitter 10 opposite to the light-emitting surface 11 is attached to the substrate assembly 56. Referring to FIG. 32, the connecting surface 12 of the laser emitter 10 may also be attached to the substrate assembly 56, and the sealant 15 encloses the connecting surface 12. Under this case, the sealant 15 may be a thermal conductive adhesive. The heat generated by the operation of the laser emitter 10 is transferred to the substrate assembly 56. When the laser projection module 100 adopts an edge-emitting laser, the temperature drift of the edge-emitting laser is smaller than that of the VCSEL array, and since the edge-emitting laser is a single-point illumination structure, it is not necessary to design an array structure, and the manufacture of the edge-emitting laser is sample, thus the cost of the light source of the laser projection module 100 is low.

When the laser light of the distributed feedback laser propagates, the gain of the power is obtained through the feedback of the grating structure. To increase the power of the distributed feedback laser, it is necessary to increase the injecting current and/or increase the length of the distributed feedback laser. Since increasing the injecting current will increase the power consumption of the distributed feedback laser and cause serious heat generation, in order to ensure the normal operation of the distributed feedback laser, it is necessary to increase the length of the distributed feedback laser, thus the distributed feedback laser usually has an elongate strip. When the light-emitting surface 11 of the edge-emitting laser faces the collimating element 20, the edge-emitting laser is placed vertically. Due to the structure of elongate strip of the edge-emitting laser, the edge-emitting laser is prone to accidents such as dropping, shifting or shaking.

Referring to FIGS. 30 and 33, the laser emitter 10 may also be fixed to the substrate assembly 56 in a fixed manner as illustrated in FIG. 33. In detail, the laser projection module 100 includes a plurality of elastic support members 16. The plurality of support members 16 may be fixed to the substrate assembly 56, and collectively form the accommodating space 160. The laser emitter 10 is accommodated in the accommodating space 160 and supported by the plurality of support members 16. The laser emitter 10 may be directly mounted among the plurality of support members 16. In one example, the plurality of support members 16 collectively clamp the laser emitter 10 to further prevent the laser emitter 10 from shaking.

In some embodiments, the substrate 64 may also be omitted, and the laser emitter 10 may be directly fixed to the circuit board 65 to reduce the thickness of the laser projection module 100.

Referring to FIG. 34, the present disclosure also provides a depth camera 1000. The depth camera 1000 provided in the embodiment of the present disclosure includes the laser projection module 100 according to any one of the above embodiments, an image collector 200 and a processor 40. The image collector 200 is configured to collect the laser pattern diffracted by the diffractive element 30 and projected into a target space. The processor 40 is coupled to the laser projection module 100 and the image collector 200. The processor 40 is configured to process the laser pattern to obtain a depth image. The processor 40 herein may be the processor 40 in the laser projection module 100.

In detail, the laser projection module 100 projects the laser pattern into the target space through a projecting window 901, and the image collector 200 collects the laser pattern modulated by the target object through a collecting window 902. The image collector 200 may be an infrared camera. The processor 40 calculates an offset value between each pixel point in the laser pattern and the corresponding pixel point in the reference pattern through an image matching algorithm, and further obtains a depth image of the laser pattern according to offset values. The image matching algorithm may be a digital image correlation (DIC) algorithm, which may be replaced by other image matching algorithms.

The laser projection module 100 in the depth camera 1000 provided in the embodiment of the present disclosure employs the diffraction conductive path 22 formed by doping the plurality of collimation conductive particles 23 in the collimating element 20, and/or the diffraction conductive path 34 formed by doping the plurality of diffraction conductive particles 33 in the diffractive element 30, to determine whether the collimating element 20 and/or the diffractive element 30 is fractured according to the electrical signal output by the conductive path 24/34. In this way, it may be detected whether the laser projection module 100 is intact. When it is detected that the laser projection module 100 is fractured, it may choose not to turn on the laser projection module 100, or turn off the laser light projected by the laser projection module 100 in time, or reduce the emission power of the laser projection module 100, such that the user's eyes may be protected from the high energy of the laser light projected by the fractured laser projection module 100, thereby improving the safety of the user.

Referring to FIG. 35, the electronic device 3000 provided in an embodiment of the present disclosure includes a housing 2000, and the depth camera 1000 according to the above embodiment. The depth camera 1000 is disposed within the housing 2000 and exposed from the housing 2000 to obtain a depth image.

The laser projection module 100 in the electronic device 3000 provided in the embodiment of the present disclosure employs the diffraction conductive path 22 formed by doping the plurality of collimation conductive particles 23 in the collimating element 20, and/or the diffraction conductive path 34 formed by doping the plurality of diffraction conductive particles 33 in the diffractive element 30, to determine whether the collimating element 20 and/or the diffractive element 30 is fractured according to the electrical signal output by the conductive path 24/34. In this way, it may be detected whether the laser projection module 100 is intact. When it is detected that the laser projection module 100 is fractured, it may choose not to turn on the laser projection module 100, or turn off the laser light projected by the laser projection module 100 in time, or reduce the emission power of the laser projection module 100, such that the user's eyes may be protected from the high energy of the laser light projected by the fractured laser projection module 100, thereby improving the safety of the user.

Figure 64:
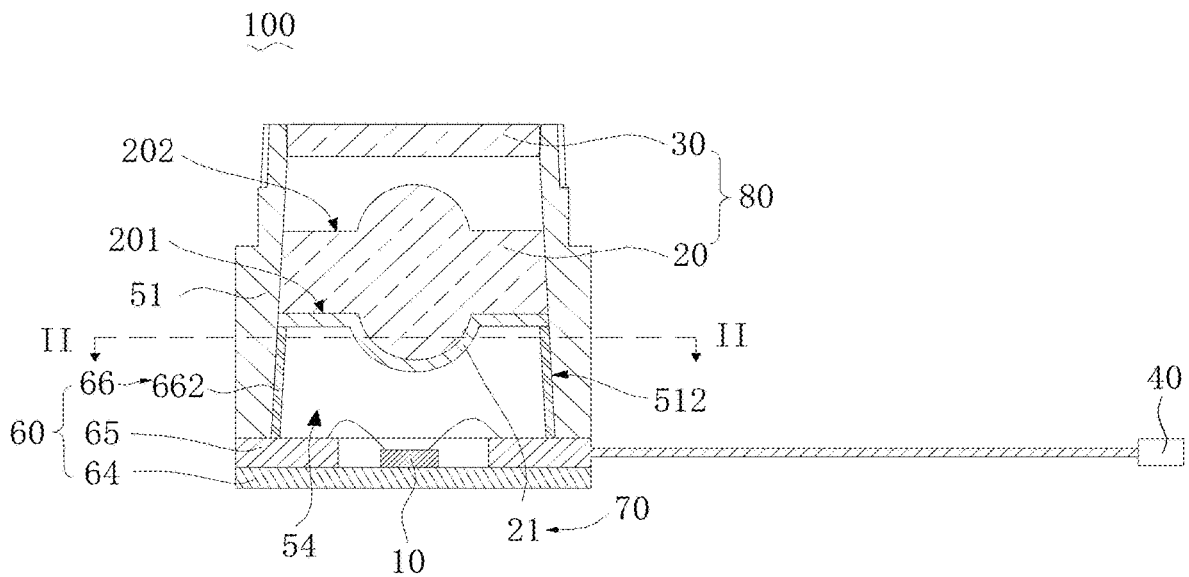
FIG. 64 illustrates a schematic diagram of a laser projection module according to some embodiments of the present disclosure.
Figure 65:
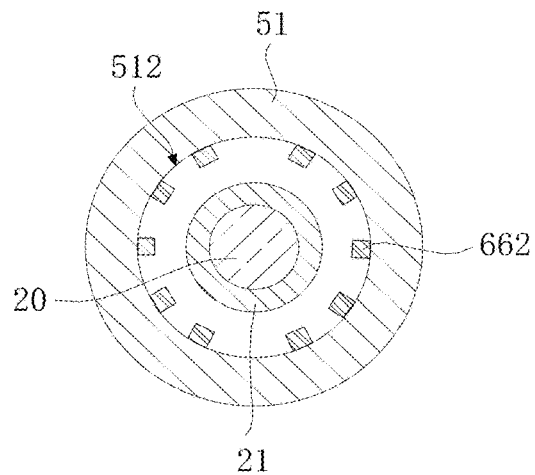
FIG. 65 illustrates a cross-sectional view of the laser projection module in FIG. 64 taken along line II-II.

Referring to FIGS. 64 and 65, the laser projection module 100 in the embodiment of the present disclosure includes a laser emitter 10, an optical assembly 80, a circuit board assembly 60 and a processor 40. The laser emitter 10 is configured to emit laser light. The optical assembly 80 is disposed on an outgoing optical path of the laser emitter 10. The laser light passes through the optical assembly 80 to form a laser pattern. A detection element 70 is disposed on the optical assembly 80. The circuit board assembly 60 includes a circuit board 65 and a conductive element 66. The detection element 70 is electrically coupled to the circuit board 65 through the conductive element 66. The laser emitter 10 is disposed on the circuit board assembly 60. The processor 40 is coupled to the circuit board 65. The processor 40 is configured to receive an electrical signal output by the detection element 70 to determine whether the optical assembly 80 is fractured.

The laser projection module 100 further includes a lens barrel 51. The lens barrel 51 is disposed on the circuit board 65 and encloses the accommodating cavity 54 with the circuit board 65. The laser emitter 10 is accommodated in the accommodating cavity 54. The optical assembly 80 includes a diffractive element 30 and a collimating element 20 accommodated in the accommodating cavity 54. The collimating element 20 and the diffractive element 30 are sequentially disposed along the outgoing optical path of the laser emitter 10. The collimating element 20 is configured to collimate the laser light emitted by the laser emitter 10. The diffractive element 30 is configured to diffract the laser light collimated by the collimating element 20 to form the laser pattern.

With the laser projection module 100 provided in the embodiment of the present application, by disposing the detection element 70 on the optical assembly 80, and employing the conductive element 66 to couple electrically the detection element 70 and the circuit board 65, the processor 40 may receive the electrical signal output by the detection element 70, and determine whether the optical assembly 80 is fractured according to the electrical signal. When it is detected that the optical assembly 80 is fractured, the laser emitter 10 may be turned off in time, or the power of the laser emitter 10 may be reduced in time, such that the user's eyes may be protected from the high energy of the laser light projected by the fractured optical assembly 80, thereby improving the safety of the laser projection module 100 in use.

Referring to FIGS. 64, 65 and 22, in some embodiments, a plurality of conductive elements 66 may be provided. The detection element 70 may be a transparent collimation conductive film 21. The transparent collimation conductive film 21 may be disposed on the collimating element 20. One or more collimation conductive electrodes 22 may be provided on the transparent collimation conductive film 21. The mechanism for determining whether the collimating element 20 is fractured may be as follows. A resistance of the transparent collimation conductive film 21 is related to the collimating element 20. When the collimating element 20 is intact, the transparent collimation conductive film 21 is intact, and the resistance of the transparent collimation conductive film 21 is small. When collimating element 20 is fractured, the transparent collimation conductive film 21 formed on the collimating element 20 is also fractured, and the resistance of the transparent collimation conductive film 21 at a fracture position is close to infinity. Based on the above features, it may be detected whether the collimating element 20 is fractured. For example, when the collimation conductive electrodes 22 on the transparent collimation conductive film 21 is energized, i.e., when the voltage of a certain magnitude is applied to the collimation conductive electrodes 22 on the transparent collimation conductive film 21, the current output by the collimation conductive electrode 22 may be obtained by the processor 40. It may be detected whether the collimating element 20 is fractured based on the current output by the collimation conductive electrode 22 and obtained by the processor 40.

Therefore, in the first mode, it is determined whether the transparent collimation conductive film 21 is damaged according to a difference between the collimating electrical signal (i.e., current) and the collimating electrical signal (i.e., current) detected when the collimating element 20 is intact, and further, determined whether the collimating element 20 is fractured based on a state of the transparent collimation conductive film 21. That is, when the transparent collimation conductive film 21 is damaged, the collimating element 20 is also fractured, and when the transparent collimation conductive film 21 is intact, the collimating element 20 is also intact. In the second mode, it is determined whether the transparent collimation conductive film 21 is damaged directly according to the electrical signal output by the collimation conductive electrode 22 on the collimating element 20 after being energized, and further, determined whether the collimating element 20 is fractured based on a state of the transparent collimation conductive film 21. In detail, it is determined that the transparent collimation conductive film 21 is damaged, when the electrical signal output by the collimation conductive electrode 22 is not within the preset range, and it is determined that the transparent collimation conductive film 21 is intact, when the electrical signal output by the collimating element 20 is within the preset range.

The transparent collimation conductive film 21 may be formed on the surface of the collimating element 20 by plating or the like. The material of the transparent collimation conductive film 21 may be any of indium tin oxide (ITO), Nano silver wire and metal silver wire. The above materials having good transmissivity and conductive properties, may realize of the output of the electrical signal after energization, without blocking the outgoing optical path of the collimating element 20.

Figure 24:
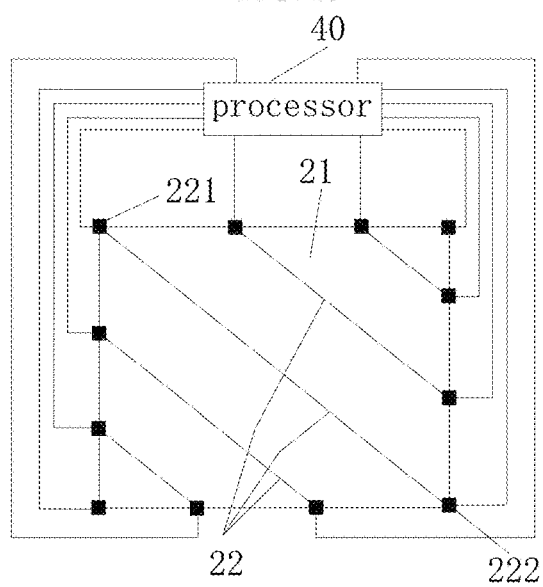
Figure 25:
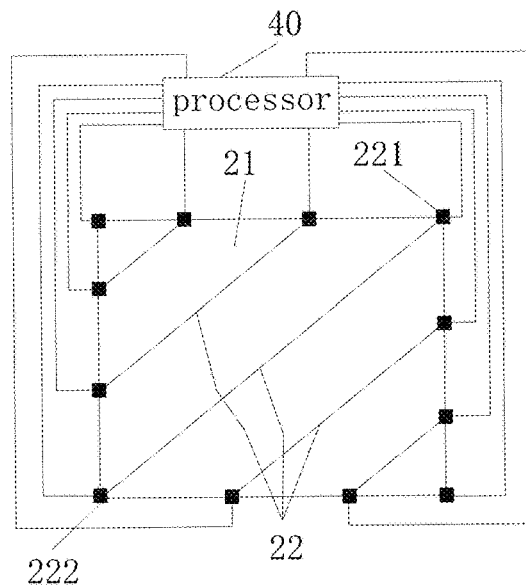

In detail, the collimating element 20 includes a collimating incident surface 201 and a collimating exit surface 202. The transparent collimation conductive film 21 is a single layer. The transparent collimation conductive film 21 may be disposed on the collimating incident surface 201 or on the collimating exit surface 202. The transparent collimation conductive film 21 is provided with a plurality of collimation conductive electrodes 22. The plurality of collimation conductive electrodes 22 does not intersect with each other. Each of the plurality of collimation conductive electrodes 22 includes a collimation input end 221 and a collimation output end 222. Each of the plurality of collimation input ends 221 and each of the plurality of collimation output ends 222 are coupled to the processor 40 to form a conductive loop. Thus, the plurality of collimation input ends 221 and the plurality of collimation output ends 222 of the plurality of collimation conductive electrodes 22 are coupled to the processor 40 to form a plurality of conductive loops. The plurality of collimation conductive electrodes 22 may be arranged in various manners. For example, the extending direction of each of the plurality of collimation conductive electrodes 22 may be the longitudinal direction of the transparent collimation conductive film 21, and the plurality of collimation conductive electrodes 22 may be arranged in parallel at intervals (as illustrated in FIG. 22). Or the extending direction of each of the plurality of collimation conductive electrodes 22 may be the width direction of the transparent collimation conductive film 21, and the plurality of collimation conductive electrodes 22 may be arranged in parallel at intervals (as illustrated in FIG. 23). Or the extending direction of each of the plurality of collimation conductive electrodes 22 may be the diagonal direction of the transparent collimation conductive film 21, and the plurality of collimation conductive electrodes 22 may arranged in parallel at intervals (as illustrated in FIGS. 24 and 25). Regardless of the way the plurality of collimation conductive electrodes 22 is arranged, the plurality of collimation conductive electrodes 22 may occupy a larger area of the transparent collimation conductive film 21 compared to one collimation conductive electrode 22, and output more electrical signals correspondingly. The processor 40 may more accurately determine whether the transparent collimation conductive film 21 is damaged, according to more electrical signals, and further determine whether the collimating element 20 is fractured, thereby improving the accuracy of the detecting fracture of the collimating element 20. The transparent collimation conductive film 21 also has a single-layer bridge structure. The transparent collimation conductive film 21 having the single-layer bridge structure is similar to the transparent diffraction conductive film 31 having the single-layer bridge structure and disposed on the diffractive element 30. The transparent diffraction conductive film 31 will be described in detail in the following. Therefore, the transparent collimation conductive film 21 having the single-layer ridging structure is not described in detail here.

Figure 66:
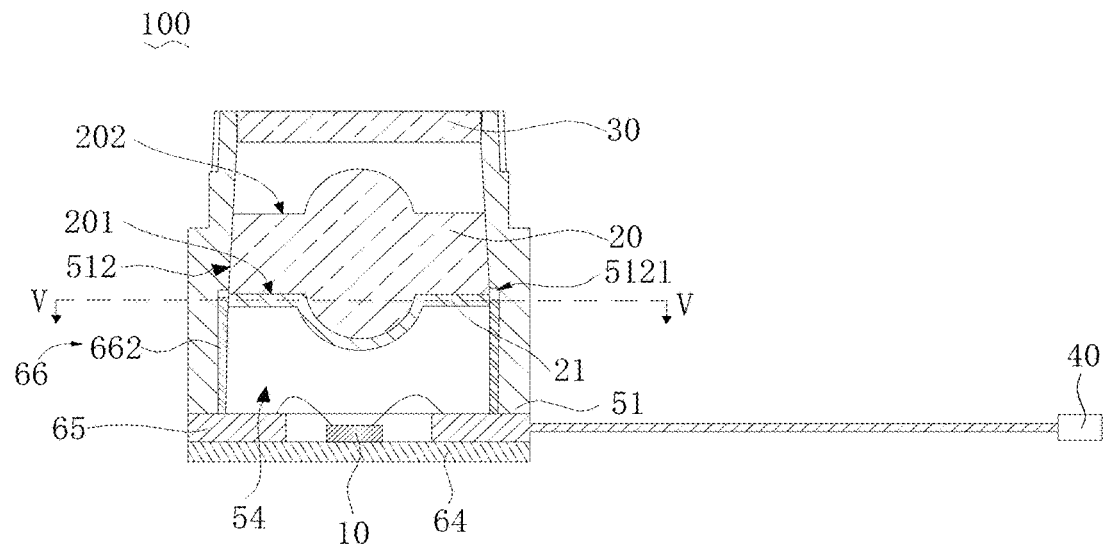
FIG. 66 illustrates a schematic diagram of a laser projection module according to some embodiments of the present disclosure.
Figure 67:
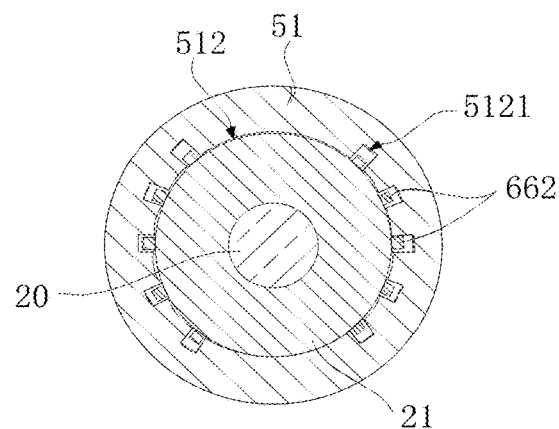
FIG. 67 illustrates a cross-sectional view of the laser projection module in FIG. 66 taken along line V-V.
Figure 68:
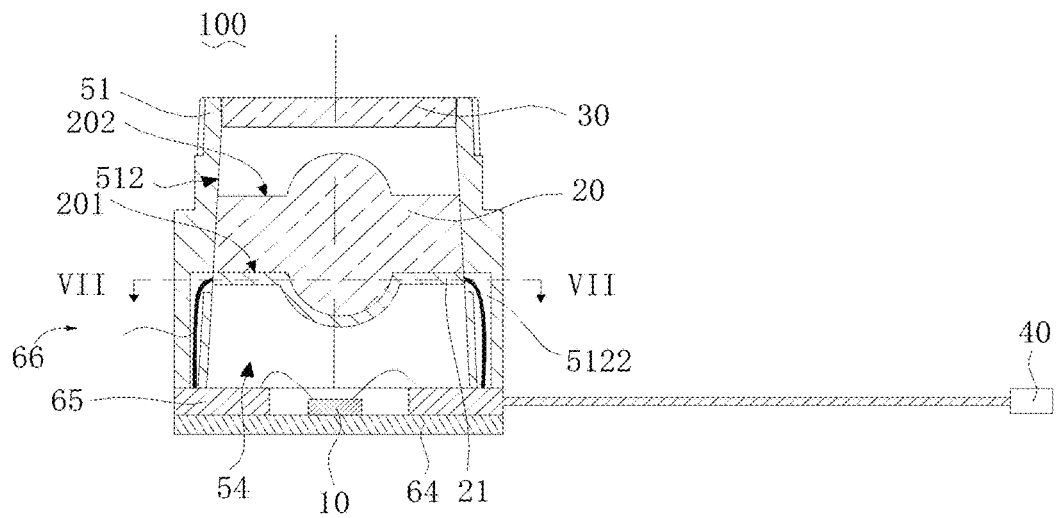
FIG. 68 illustrates a schematic diagram of a laser projection module according to some embodiments of the present disclosure.
Figure 69:
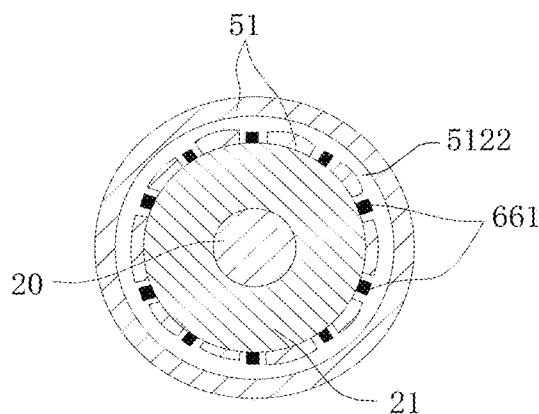
FIG. 69 illustrates a cross-sectional view of the laser projection module in FIG. 68 taken along line VII-VII.

The position of the conductive element 66 connecting the collimation conductive electrode 22 and the circuit board 65 may be the following. A plurality of conductive elements 66 may be attached to an inner surface of the peripheral wall 512 of the lens barrel 51. One end of each of the plurality of conductive elements 66 is electrically coupled to the collimation input end 221 or the collimation output end 222, and the other end is electrically coupled to the circuit board 65 (as illustrated in FIGS. 64 and 65). Or the peripheral wall 512 of the lens barrel 51 is provided with a plurality of grooves 5121 corresponding to the plurality of conductive elements 66. The plurality of conductive elements 66 is disposed in the plurality of corresponding grooves 5121. One end of each of the plurality of conductive elements 66 is electrically coupled to the collimation input end 221 or the collimation output end 222, and the other end is electrically coupled to the circuit board 65 (as illustrated in FIGS. 66 and 67). Or, the peripheral wall 512 of the lens barrel 51 is provided with an annular hole 5122 in the axial direction, and the plurality of conductive elements 66 is disposed in the annular hole 5122. One end of each of the plurality of conductive elements 66 is electrically coupled to the collimation input end 221 or the collimation output end 222, and the other end is electrically coupled to the circuit board 65 (as illustrated in FIGS. 68 and 69).

The conductive element 66 may be a crystal line 661 or a spring plate 662.

For example, as illustrated in FIGS. 64 and 65, the conductive element 66 is the spring plate 662. A plurality of spring plates 662 is disposed on the circuit board 65. The length of the plurality of spring plates 662 extends toward the light-emitting direction of the laser emitter 10. The plurality of spring plates 662 is attached to the inner surface of the peripheral wall 512 of the lens barrel 51. The number of the plurality of spring plates 662 is twice the number of the plurality of collimation conductive electrodes 22. One end of each of the plurality of spring plates 662 is coupled to the circuit board 65, and the other end is coupled to the collimation input end 221 or the collimation output end 222. The plurality of spring plates 662 are spaced from each other, and thus, the plurality of spring plates is insulated from each other, thereby ensuring insulation among the plurality of collimation conductive electrodes 22. Alternatively, an insulating material may be coated on the remaining surface of each of the plurality of spring plates 662 except the contact position of the collimation input end 221 or the collimation output end 222 to further ensure the insulation among the plurality of collimation conductive electrodes 22.

As illustrated in FIGS. 66 and 67, the peripheral wall 512 of the lens barrel 51 is provided with a plurality of grooves 5121 corresponding to the plurality of spring plates 662. The plurality of spring plates 662 are disposed in the plurality of corresponding grooves 5121. The positions of the plurality of spring plates 662 is in one-to-one correspondence with the positions of the plurality of collimation input ends 221 and the plurality of collimation output ends 222. The length of the plurality of spring plates 662 extends toward the light-emitting direction of the laser emitter 10. One end of each of the plurality of spring plates 662 is in contact with the circuit board 65, and the other end is in contact with the collimation input end 221 or the collimation output end 222.

As illustrated in FIGS. 68 and 69, the conductive element 66 is the crystal line 661. The peripheral wall 512 of the lens barrel 51 is provided with the annular hole 5122 in the axial direction. A plurality of crystal lines 661 are accommodated in the annular hole 5122. One end of each of a part of the plurality of crystal lines 661 is electrically coupled to the collimation input end 221, and the other end is electrically coupled to the circuit board 65. One end of each of the remaining part of the plurality of crystal lines 661 is electrically coupled to the collimation output end 222, and the other end is electrically coupled to the circuit board 65. The outer layer of each of the plurality of crystal lines 661 may be coated with an insulating material, so that the plurality of crystal lines 661 are prevented from contacting each other to cause a problem that the plurality of collimation conductive electrodes 22 is not insulated from each other.

In addition, the crystal line 661 may be attached to the inner surface of the lens barrel 51 or may be disposed in the groove 5121 provided on the peripheral wall 512 of the lens barrel 51; the spring plate may also be accommodated in the annular hole 5122.

Referring to FIGS. 70, 13, 14 and 71, in some embodiments, a plurality of conductive elements 66 may be provided. The detection element 70 may be a transparent diffraction conductive film 31. The transparent diffraction conductive film 31 may be disposed on the diffractive element 30. One or more diffraction conductive electrodes 32 may be provided on the transparent diffraction conductive film 31. The mechanism of determining whether the diffractive element 30 is fractured may be the same as the mechanism of determining whether the collimating element 20 is fractured when the transparent collimation conductive film 21 is provided on the collimating element 20, and the details will not be repeated herein. The material of the transparent diffraction conductive film 31 is the same as the material of the transparent collimation conductive film 21, and the details will not be repeated herein.

In detail, the diffractive element 30 includes a diffractive incident surface 301 and a diffractive exit surface 302. The transparent diffraction conductive film 31 has a single-layer bridge structure, and is disposed on the diffractive exit surface 302. A plurality of diffraction conductive electrodes 32 is provided on the transparent diffraction conductive film 31 having the single-layer bridge structure. The plurality of diffraction conductive electrodes 32 includes a plurality of first diffraction conductive electrodes 323 arranged in parallel at intervals, a plurality of second diffraction conductive electrodes 324 arranged in parallel at intervals, and a plurality of bridging diffraction conductive electrodes 325. The plurality of first diffraction conductive electrodes 323 and the plurality of second diffraction conductive electrodes 324 are crisscrossed. Each of the plurality of first diffraction conductive electrodes 323 is continuous without interruption. Each of the plurality of second diffraction conductive electrodes 324 is interrupted with the plurality of first diffraction conductive electrodes 323 at crisscross points, and insulated from the plurality of first diffraction conductive electrodes 323. Each of the plurality of bridging diffraction conductive electrodes 325 is coupled to a corresponding and interrupted second diffraction conductive electrode 324 at breakpoints. A diffraction insulator 326 is provided at a crisscross position between each of the plurality of bridging diffraction conductive electrodes 325 and each of the plurality of first diffraction conductive electrodes 323. Both ends of each of the plurality of first diffraction conductive electrodes 323 are coupled to the processor 40 to form a conductive loop, and both ends of each of the plurality of second diffraction conductive electrodes 324 are coupled to the processor 40 to form a conductive loop. Therefore, both ends of the plurality first diffraction conductive electrode 323 and the processor 40 are coupled to form a plurality of conductive loops, and both ends of the plurality of second diffraction conductive electrodes 324 are coupled to the processor 40 to form a plurality of conductive loops. The material of the diffraction insulator 326 may be an organic material having good transmissivity and insulation properties. The diffraction insulator 326 may be formed by a silk screen printing or a photolithographic process. The plurality of first diffraction conductive electrodes 323 and the plurality of second diffraction conductive electrodes 324 are crisscrossed, meaning that the plurality of first diffraction conductive electrodes 323 and the plurality of second diffraction conductive electrodes 324 are vertically interlaced. That is, the angle between each of the plurality of first diffraction conductive electrodes 323 and each of the plurality of second diffraction conductive electrodes 324 is 90 degrees. In other embodiments, the plurality of first diffraction conductive electrodes 323 and the plurality of second diffraction conductive electrodes 324 may be crisscrossed, also meaning that the plurality of first diffraction conductive electrodes 323 and the plurality of second diffraction conductive electrodes 324 are slantingly interlaced. In use, the processor 40 may simultaneously energize the plurality of first diffraction conductive electrodes 323 and the plurality of second diffraction conductive electrodes 324 to obtain electrical signals, or the processor 40 may sequentially energize the plurality of first diffraction conductive electrodes 323 and the plurality of second diffraction conductive electrodes 324 to obtain electrical signals. Then the processor 40 determines whether the transparent diffraction conductive film 31 is damaged according to the electrical signals. For example, when it is detected that the electrical signal output by the first diffraction conductive electrode 323 numbered ① is not within the preset range, and the electrical signal output by the second diffraction conductive electrode 324 numbered ③ is not within the preset range, the transparent diffraction conductive film 31 is damaged at the crisscross point between the first diffraction conductive electrode 323 numbered ① and the second diffraction conductive electrode 324 numbered ③, and the position of the diffractive element 30 corresponding to the fracture position of the transparent diffraction conductive film 31 is also damaged. Thus, whether the diffractive element 30 is fractured and the specific fracture position may be accurately detected through the transparent diffraction conductive film 31 having the single-layer bridge structure.

The transparent diffraction conductive film 31 also has a single-layer structure. The transparent diffraction conductive film 31 having the single-layer structure is similar to the transparent collimation conductive film 21 having the single-layer structure, and the details will not be repeated herein.

Figure 70:
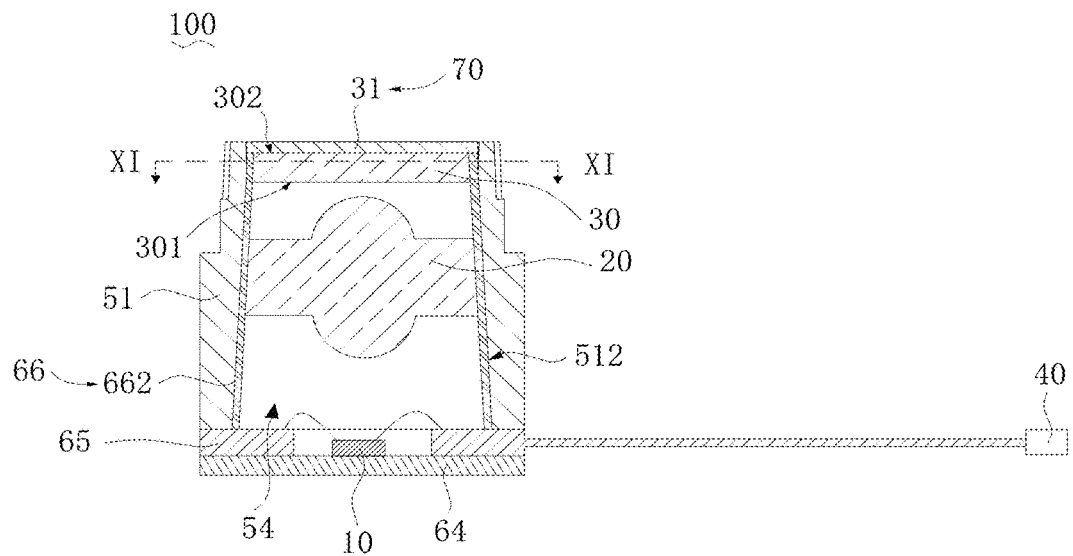
FIG. 70 illustrates a schematic diagram of a laser projection module according to some embodiments of the present disclosure.
Figure 71:
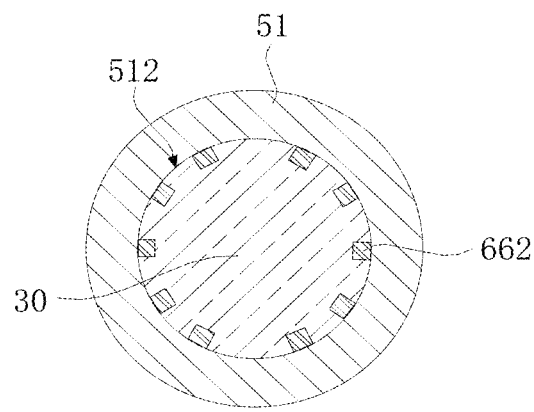
FIG. 71 illustrates a cross-sectional view of the laser projection module in FIG. 70 taken along line XI-XI.
Figure 72:
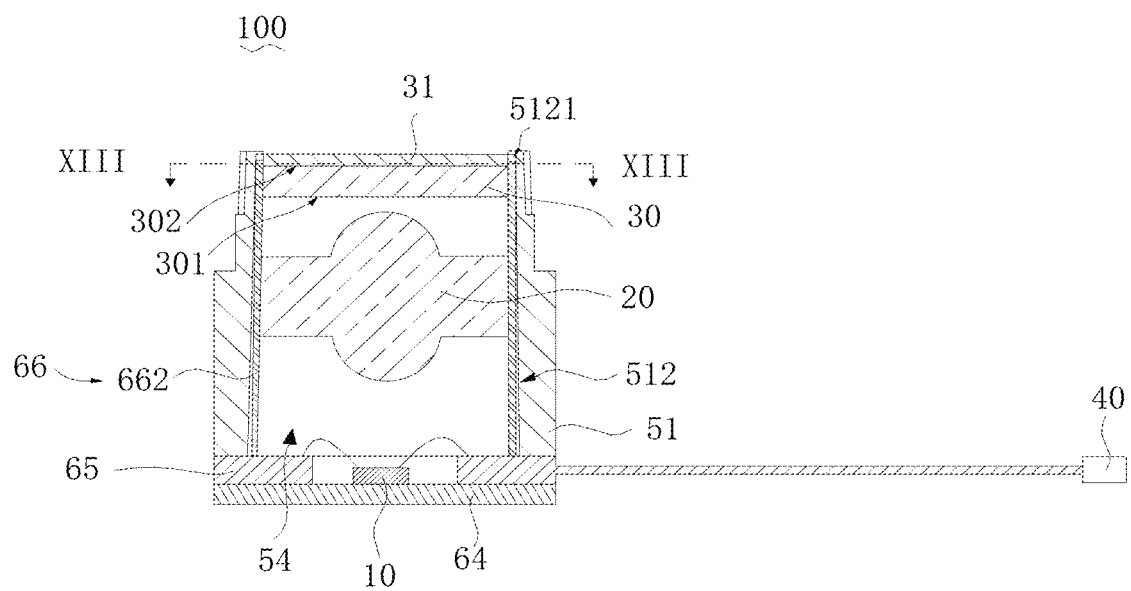
FIG. 72 illustrates a schematic diagram of a laser projection module according to some embodiments of the present disclosure.
Figure 73:
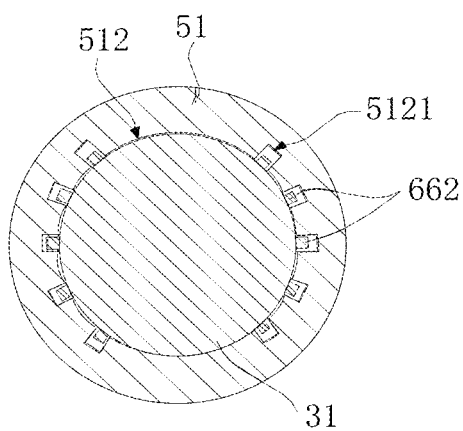
FIG. 73 illustrates a cross-sectional view of the laser projection module in FIG. 72 taken along line XIII-XIII
Figure 74:
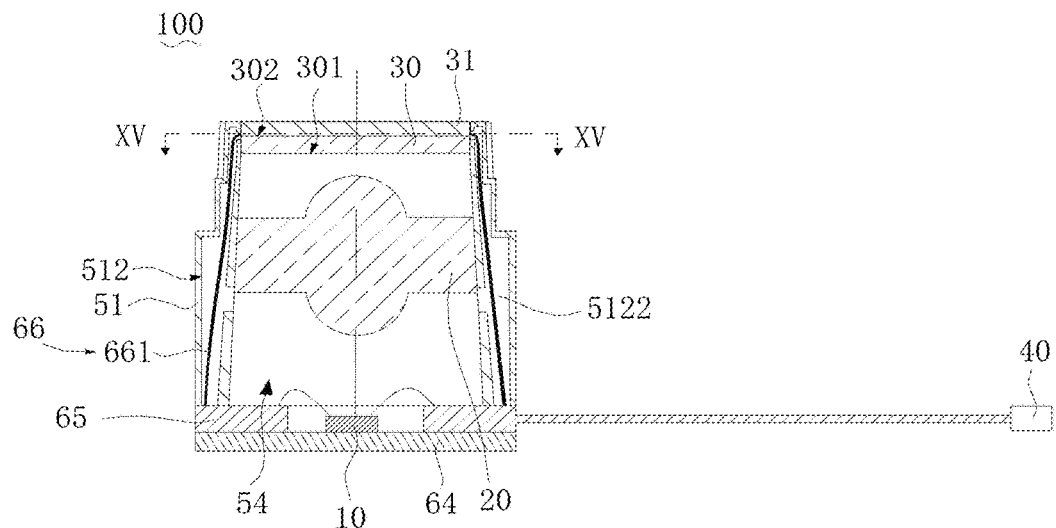
FIG. 74 illustrates a schematic diagram of a laser projection module according to some embodiments of the present disclosure.
Figure 75:
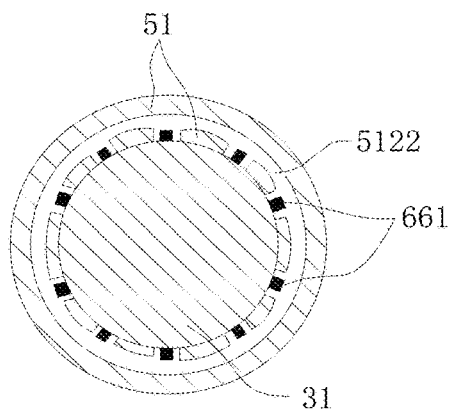
FIG. 75 illustrates a cross-sectional view of the laser projection module in FIG. 74 taken along line XV-XV.

The position of the conductive element 66 connecting the diffraction conductive electrode 32 and the circuit board 65 may be the following. A plurality of conductive elements 66 may be attached to an inner surface of the peripheral wall 512 of the lens barrel 51. One end of each of the plurality of conductive elements 66 is electrically coupled to the diffraction input end 321 (including a first diffraction input end 3211 of the first diffraction conductive electrode 323 and a second diffraction input end 3212 of the second diffraction conductive electrode 324) or the diffraction output end 322 (including a first diffraction output end 3221 of the first diffraction conductive electrode 323 and a second diffraction output end 3222 of the second diffraction conductive electrode 324), and the other end is electrically coupled to the circuit board 65 (as illustrated in FIGS. 70 and 71). Or the peripheral wall 512 of the lens barrel 51 is provided with a plurality of grooves 5121 corresponding to the plurality of conductive elements 66. The plurality of conductive elements 66 is disposed in the plurality of corresponding grooves 5121. One end of each of the plurality of conductive elements 66 is electrically coupled to the diffraction input end 321 or the diffraction output end 322, and the other end is electrically coupled to the circuit board 65 (as illustrated in FIGS. 72 and 73). Or, the peripheral wall 512 of the lens barrel 51 is provided with an annular hole 5122 in the axial direction, and the plurality of conductive elements 66 is disposed in the annular hole 5122. One end of each of the plurality of conductive elements 66 is electrically coupled to the diffraction input end 321 or the diffraction output end 322, and the other end is electrically coupled to the circuit board 65 (as illustrated in FIGS. 74 and 75).

The conductive element 66 may be a crystal line 661 or a spring plate 662.

For example, as illustrated in FIGS. 70 and 71, the conductive element 66 is the spring plate 662. A plurality of spring plates 662 is disposed on the circuit board 65. The length of the plurality of spring plates 662 extends toward the light-emitting direction of the laser emitter 10. The plurality of spring plates 662 is attached to the inner surface of the peripheral wall 512 of the lens barrel 51. The number of the plurality of spring plates 662 is twice the number of the plurality of diffraction conductive electrodes 32. One end of each of the plurality of spring plates 662 is coupled to the circuit board 65, and the other end is coupled to the diffraction input end 321 or the diffraction output end 322. In detail, one end of each of the first part of the plurality of spring plates 662 is coupled to the first diffraction input end 3211, and the other end is coupled to the circuit board 65; one end of each of the second part of the plurality of spring plates 662 is coupled to the first diffraction output end 3221, and the other end is coupled to the circuit board 65; one end of each of the third part of the plurality of spring plates 662 is coupled to the second diffraction input end 3212, and the other end is coupled to the circuit board 65; one end of each of the fourth part of the plurality of spring plates 662 is coupled to the second diffraction output end 3222, and the other end is coupled to the circuit board 65. The plurality of spring plates 662 are spaced from each other, and thus, the plurality of spring plates is insulated from each other, thereby ensuring insulation among the plurality of diffraction conductive electrodes 32. Alternatively, an insulating material may be coated on the remaining surface of each of the plurality of spring plates 662 except the contact position of the diffraction input end 321 or the diffraction output end 322 to further ensure the insulation among the plurality of diffraction conductive electrodes 32.

As illustrated in FIGS. 72 and 73, the peripheral wall 512 of the lens barrel 51 is provided with a plurality of grooves 5121 corresponding to the plurality of spring plates 662. The plurality of spring plates 662 are disposed in the plurality of corresponding grooves 5121. The positions of the plurality of spring plates 662 is in one-to-one correspondence with the positions of the plurality of diffraction input ends 321 and the plurality of diffraction output ends 322. The length of the plurality of spring plates 662 extends toward the light-emitting direction of the laser emitter 10. One end of each of the plurality of spring plates 662 is in contact with the circuit board 65, and the other end is in direct contact with the diffraction input end 321 or the diffraction output end 322. In detail, one end of each of the first part of the plurality of spring plates 662 is coupled to the first diffraction input end 3211, and the other end is coupled to the circuit board 65; one end of each of the second part of the plurality of spring plates 662 is coupled to the first diffraction output end 3221, and the other end is coupled to the circuit board 65; one end of each of the third part of the plurality of spring plates 662 is coupled to the second diffraction input end 3212, and the other end is coupled to the circuit board 65; one end of each of the fourth part of the plurality of spring plates 662 is coupled to the second diffraction output end 3222, and the other end is coupled to the circuit board 65.

As illustrated in FIGS. 74 and 75, the conductive element 66 is the crystal line 661. The peripheral wall 512 of the lens barrel 51 is provided with the annular hole 5122 in the axial direction. A plurality of crystal lines 661 are accommodated in the annular hole 5122. One end of each of a part of the plurality of crystal lines 661 is electrically coupled to the diffraction input end 321, and the other end is electrically coupled to the circuit board 65. One end of each of the remaining part of the plurality of crystal lines 661 is electrically coupled to the diffraction output end 322, and the other end is electrically coupled to the circuit board 65. The outer layer of each of the plurality of crystal lines 661 may be coated with an insulating material, so that the plurality of crystal lines 661 is prevented from contacting each other to cause a problem that the plurality of diffraction conductive electrodes 32 is not insulated from each other.

In addition, the crystal line 661 may be attached to the inner surface of the lens barrel 51 or may be disposed in the groove 5121 provided on the peripheral wall 512 of the lens barrel 51; the spring plate may also be accommodated in the annular hole 5122.

Referring to FIGS. 76, 50, 56 and 77, in some embodiments, a plurality of conductive elements 66 may be provided. The detection element 70 may be a plurality of collimation conductive particles 23 doped in the collimating element 20. The plurality of collimation conductive particles 23 forms one or more collimation conductive paths 24. Under this case, the mechanism of determining whether the collimating element 20 is fractured may be as follows. A resistance of the collimation conductive path 24 is related to the collimating element 20. When the collimating element 20 is intact, the adjacent collimation conductive particles 23 are joined together, and the resistance of the collimation conductive path 24 is small. When the collimating element 20 is fractured, the junction among the collimation conductive particles 23 doped on the collimating element 20 is broken, and the resistance of the collimation conductive path 24 is close to infinity.

Based on the above features, it may be detected whether the collimating element 20 is fractured. For example, when the collimation conductive path 24 is energized, that is, when the voltage of a certain magnitude is applied to the collimation conductive path 24, the current output by the collimation conductive path 24 may be obtained by the processor 40. It may be detected whether the collimating element 20 is fractured based on the current output by the collimation conductive path 24 and obtained by the processor 40.

Therefore, in the first mode, it is determined whether the collimating element 20 is fractured according to a difference between the collimating electrical signal (i.e., current) output by the collimation conductive path 24 after being energized and the collimating electrical signal detected when the collimating element 20 is fractured. In the second mode, it is determined whether the collimating element 20 is fractured directly according to the collimating electrical signal output by the collimation conductive path 24 after being energized. In detail, when the collimating electrical signal is not within the preset range, the collimating element 20 is fractured, and when the collimating electrical signal is within the preset range, the collimating element 20 is intact.

In detail, the collimating element 20 is doped with a plurality of collimation conductive particles 23. The plurality of collimation conductive particles 23 forms a plurality of collimation conductive paths 24. The plurality of collimation conductive paths 24 does not intersect with each other and is insulated from each other. The plurality of collimation conductive paths 24 may be arranged in various manners. For example, the extending direction of each of the plurality of collimation conductive paths 24 may be the longitudinal direction of the collimating element 20 (as illustrated in FIG. 56), and the plurality of collimation conductive paths 24 may be arranged in parallel at intervals. Or the extending direction of each of the plurality collimation conductive paths 24 may be the width direction of the collimating element 20 (as illustrated in FIG. 57), and the plurality of collimation conductive paths 24 may be arranged in parallel at intervals. Or the extending direction of each of the plurality of collimation conductive paths 24 may be the diagonal direction of the collimating incident surface 201 (not illustrated), and the plurality of collimation conductive paths 24 may be arranged in parallel at intervals. Or the extending direction of each of the plurality of collimation conductive paths 24 may be the diagonal direction (not illustrated) of the collimating incident surface 201 and the collimating exit surface 202 of the collimating element 20, and the plurality of collimation conductive path 24 may be arranged in parallel at intervals. Or the plurality of collimation conductive paths 24 are arranged in parallel at intervals along the thickness direction of the collimating element 20 (not illustrated). Regardless of the way the plurality of collimation conductive paths 24 are arranged, the plurality of collimation conductive paths 24 may occupy a larger area of the collimating element 20 compared to one collimation conductive path 24, and output more electrical signals correspondingly. The processor 40 may more accurately determine whether the collimating element 20 is fractured, according to more electrical signals, thereby improving the accuracy of detecting the fracture of the collimating element 20. In other embodiments, the arrangement of the plurality of collimation conductive paths 24 may be similar to the arrangement of the plurality of collimation conductive paths 24 in the diffractive element 30 described below, and the details will not be repeated herein.

Figure 76:
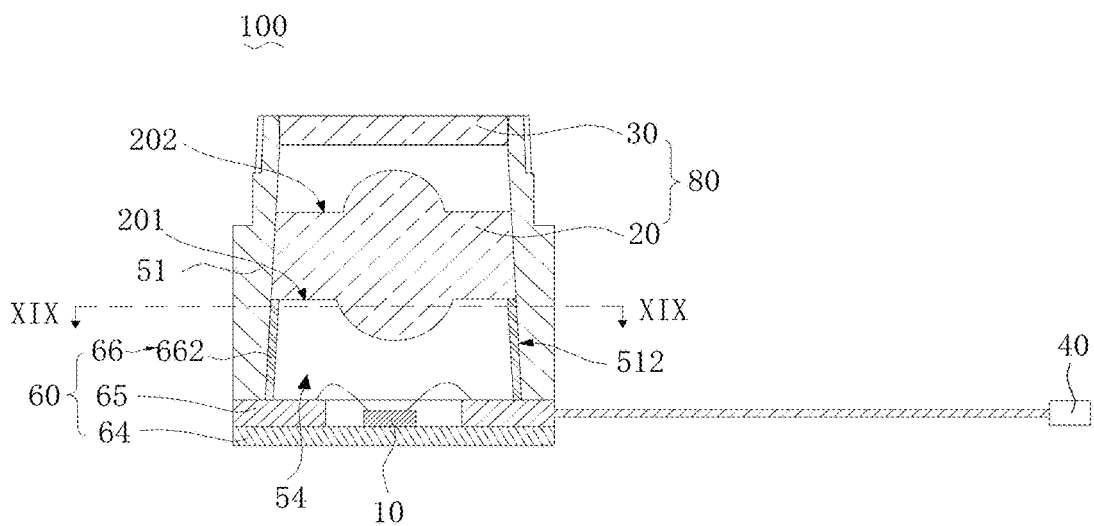
FIG. 76 illustrates a schematic diagram of a laser projection module according to some embodiments of the present disclosure.
Figure 77:
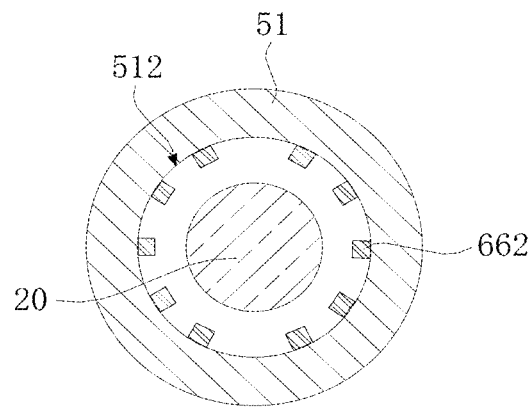
FIG. 77 illustrates a cross-sectional view of the laser projection module in FIG. 76 taken along line XIX-XIX.
Figure 78:
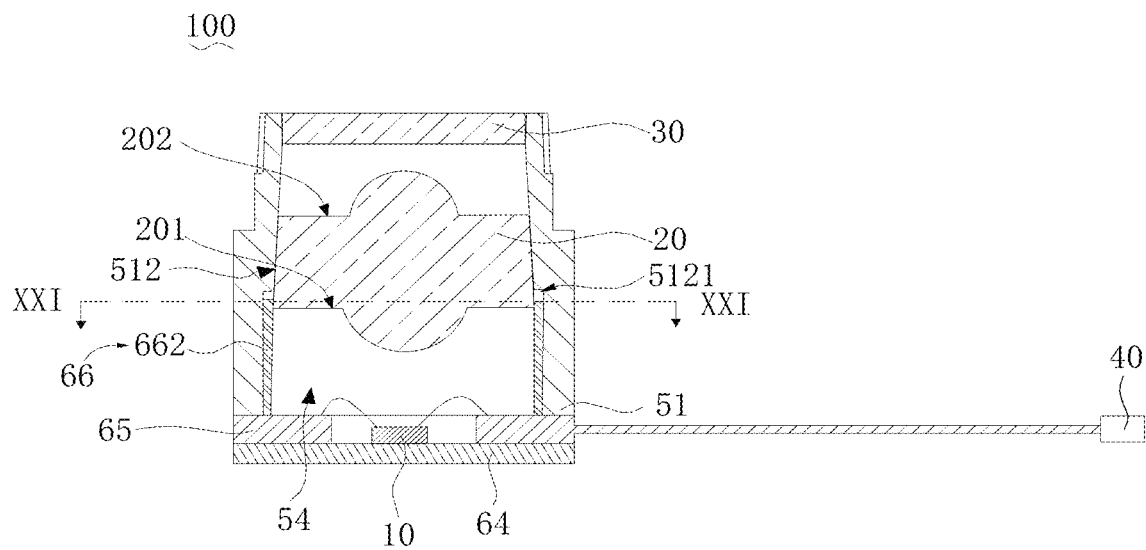
FIG. 78 illustrates a schematic diagram of a laser projection module according to some embodiments of the present disclosure.
Figure 79:
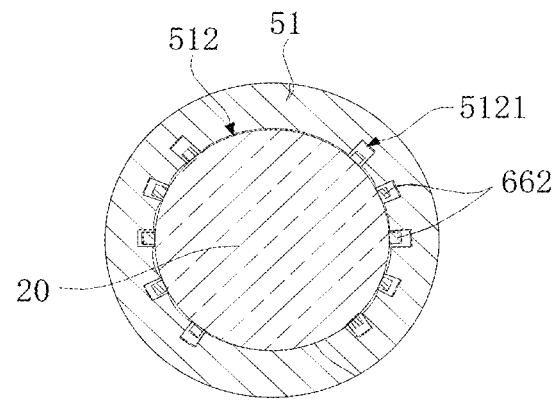
FIG. 79 illustrates a cross-sectional view of the laser projection module in FIG. 78 taken along line XXI-XXI.
Figure 80:
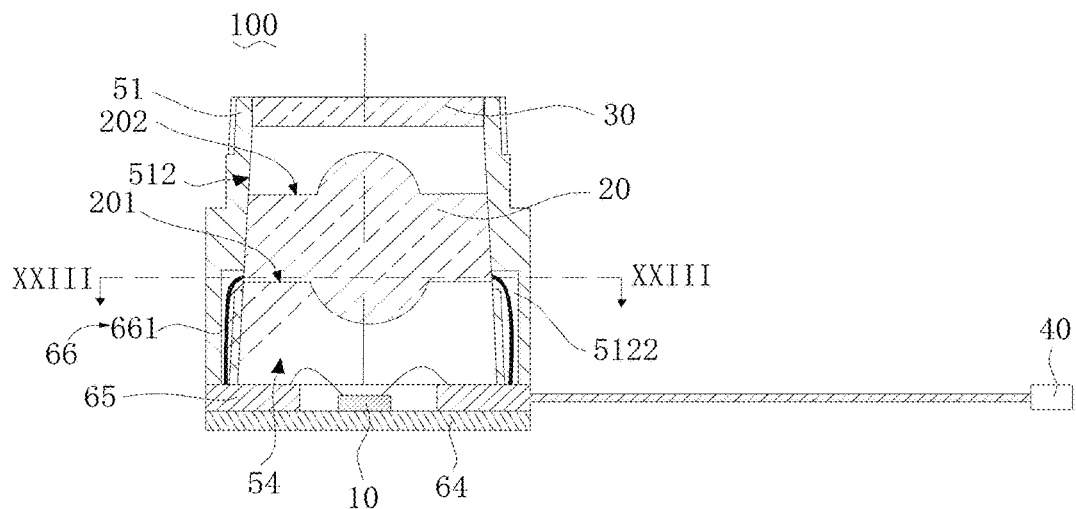
FIG. 80 illustrates a schematic diagram of a laser projection module according to some embodiments of the present disclosure.
Figure 81:
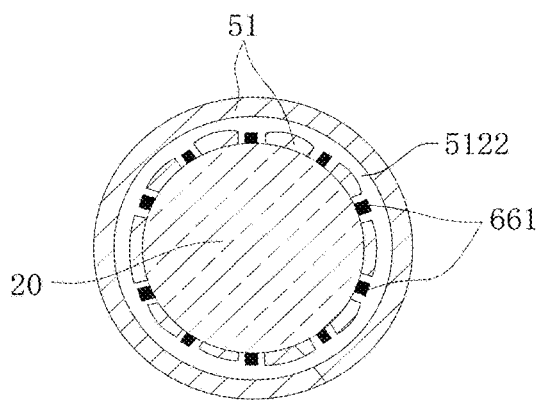
FIG. 81 illustrates a cross-sectional view of the laser projection module in FIG. 80 taken along line XXIII-XXIII.

The position of the conductive element 66 connecting the collimation conductive path 24 and the circuit board 65 may be the following. A plurality of conductive elements 66 may be attached to an inner surface of the peripheral wall 512 of the lens barrel 51. One end of each of the plurality of conductive elements 66 is electrically coupled to the collimation input end 241 or the collimation output end 242, and the other end is electrically coupled to the circuit board 65 (as illustrated in FIGS. 76 and 77). Or the peripheral wall 512 of the lens barrel 51 is provided with a plurality of grooves 5121 corresponding to the plurality of conductive elements 66. The plurality of conductive elements 66 is disposed in the plurality of corresponding grooves 5121. One end of each of the plurality of conductive elements 66 is electrically coupled to the collimation input end 241 or the collimation output end 242, and the other end is electrically coupled to the circuit board 65 (as illustrated in FIGS. 78 and 79). Or, the peripheral wall 512 of the lens barrel 51 is provided with an annular hole 5122 in the axial direction, and the plurality of conductive elements 66 is disposed in the annular hole 5122. One end of each of the plurality of conductive elements 66 is electrically coupled to the collimation input end 241 or the collimation output end 242, and the other end is electrically coupled to the circuit board 65 (as illustrated in FIGS. 80 and 81).

The conductive element 66 may be a crystal line 661 or a spring plate 662.

For example, as illustrated in FIGS. 76 and 77, the conductive element 66 is the spring plate 662. A plurality of spring plates 662 is disposed on the circuit board 65. The length of the plurality of spring plates 662 extends toward the light-emitting direction of the laser emitter 10. The plurality of spring plates 662 is attached to the inner surface of the peripheral wall 512 of the lens barrel 51. The number of the plurality of spring plates 662 is twice the number of the plurality of collimation conductive paths 24. One end of each of the plurality of spring plates 662 is coupled to the circuit board 65, and the other end is coupled to the collimation input end 241 or the collimation output end 242. The plurality of spring plates 662 are spaced from each other, and thus, the plurality of spring plates is insulated from each other, thereby ensuring insulation among the plurality of collimation conductive paths 24. Alternatively, an insulating material may be coated on the remaining surface of each of the plurality of spring plates 662 except the contact position of the collimation input end 241 or the collimation output end 242 to further ensure the insulation among the plurality of collimation conductive paths 24.

As illustrated in FIGS. 78 and 79, the peripheral wall 512 of the lens barrel 51 is provided with a plurality of grooves 5121 corresponding to the plurality of spring plates 662. The plurality of spring plates 662 are disposed in the plurality of corresponding grooves 5121. The positions of the plurality of spring plates 662 is in one-to-one correspondence with the positions of the plurality of collimation input ends 241 or the plurality of collimation output ends 242. The length of the plurality of spring plates 662 extends toward the light-emitting direction of the laser emitter 10. One end of each of the plurality of spring plates 662 is in contact with the circuit board 65, and the other end is in contact with the collimation input end 241 or the collimation output end 242.

As illustrated in FIGS. 80 and 81, the conductive element 66 is the crystal line 661. The peripheral wall 512 of the lens barrel 51 is provided with the annular hole 5122 in the axial direction. A plurality of crystal lines 661 are accommodated in the annular hole 5122. One end of each of a part of the plurality of crystal lines 661 is electrically coupled to the collimation input end 241, and the other end is electrically coupled to the circuit board 65. One end of each of the remaining part of the plurality of crystal lines 661 is electrically coupled to the collimation output end 242, and the other end is electrically coupled to the circuit board 65. The outer layer of each of the plurality of crystal lines 661 may be coated with an insulating material, so that the plurality of crystal lines 661 is prevented from contacting each other to cause a problem that the plurality of collimation conductive paths 24 is not insulated from each other.

In addition, the crystal line 661 may be attached to the inner surface of the lens barrel 51 or may be disposed in the groove 5121 provided on the peripheral wall 512 of the lens barrel 51; the spring plate may also be accommodated in the annular hole 5122.

Referring to FIGS. 82, 47, 48 and 83, in some embodiments, a plurality of conductive elements 66 may be provided. The detection element 70 may be a plurality of diffraction conductive particles 33 doped in the diffractive element 30. The plurality of diffraction conductive particles 33 forms one or more diffraction conductive paths 34. The mechanism of determining whether the diffractive element 30 is fractured is similar to that of determining whether the collimating element 20 is fractured when the collimating element 20 is doped with the plurality of collimation conductive particles 23, and the details will not be repeated herein.

In detail, the diffractive element 30 is doped with a plurality of diffraction conductive particles 33. The plurality of diffraction conductive particles 33 forms a plurality of diffraction conductive paths 34. Each of the plurality of diffraction conductive paths 34 includes a diffraction input end 341 and a diffraction output end 342. The plurality of diffraction conductive paths 34 includes a plurality of first diffraction conductive paths 343 and a plurality of second diffraction conductive paths 344. The plurality of first diffraction conductive paths 343 are spaced in parallel, and the plurality of second diffraction conductive paths 344 are spaced in parallel. The plurality of first diffraction conductive paths 343 and the plurality of second diffraction conductive paths 344 are crisscrossed in space. Each of the plurality of first diffraction conductive paths 343 includes a first diffraction input end 3411 and a first diffraction output end 3421. Each of the plurality of second diffraction conductive paths 344 includes a second diffraction input end 3412 and a second diffraction output end 3422. That is, the diffraction input end 341 includes the first diffraction input end 3411 and the second diffraction input end 3412, and the diffraction output end 342 includes the first diffraction output end 3421 and the second diffraction output end 3422. Each of the plurality of first diffraction input ends 3411 and each of the plurality of first diffraction output ends 3421 are coupled to the processor 40 to form a conductive loop, and each of the plurality of second diffraction input ends 3412 and each of the plurality of second diffraction output ends 3422 are coupled to the processor 40 to form a conductive loop. Both ends of the plurality of first diffraction conductive paths 343 are coupled to the processor 40 to form a plurality of conductive loops, and both ends of the plurality of second diffraction conductive paths 344 are coupled to the processor 40 to form a plurality of conductive loops. The plurality of first diffraction conductive paths 343 and the plurality of second diffraction conductive paths 344 are crisscrossed, meaning that the plurality of first diffraction conductive paths 343 and the plurality of second diffraction conductive paths 344 are vertically interlaced in space. That is, the angle between each of the plurality of first diffraction conductive paths 343 and each of the plurality of second diffraction conductive paths 344 is 90 degrees. At this time, the extending direction of the plurality of first diffraction conductive paths 343 is the longitudinal direction of the diffractive element 30, and the extending direction of the plurality of second diffraction conductive paths 344 is the width direction of the diffractive element 30 (as illustrated in FIG. 48). Or, the extending direction of the plurality of first diffraction conductive paths 343 is the thickness direction of the diffractive element 30, and the extending direction of the plurality of second diffraction conductive paths 344 is the longitudinal direction of the diffractive element 30 (not illustrated). In other embodiments, the plurality of first diffraction conductive paths 343 and the plurality of second diffraction conductive paths 344 are crisscrossed, also meaning that the plurality of first diffraction conductive paths 343 and the plurality of second diffraction conductive paths 344 may be slantingly interlaced in space. In use, the processor 40 may simultaneously energize the plurality of first diffraction conductive paths 343 and the plurality of second diffraction conductive paths 344 to obtain electrical signals, or the processor 40 may sequentially energize the plurality of first diffraction conductive paths 343 and the plurality of second diffraction conductive paths 344 to obtain electrical signals. Then the processor 40 determines whether the diffractive element 30 is fractured according to the electrical signals. For example, when it is detected that the electrical signal output by the first diffraction conductive path 343 numbered ② is not within the preset range, and the electrical signal output by the second diffraction conductive paths 344 numbered ED is not within the preset range, the diffractive element 30 is fractured at the crisscross point between the first diffraction conductive path 343 numbered ② and the second diffraction conductive paths 344 numbered ④, and the corresponding position of the diffractive element 30 is also fractured. Thus, whether the diffractive element 30 is fractured and the specific fracture position may be accurately detected through the crisscrossed manner of arranging the plurality of first diffraction conductive paths 343 and the plurality of second diffraction conductive paths 344. In other embodiments, the arrangement of the plurality of diffraction conductive paths 34 may be similar to the arrangement of the plurality of collimation conductive paths 24 in the collimating element 20, and the details will not be repeated herein.

Figure 82:
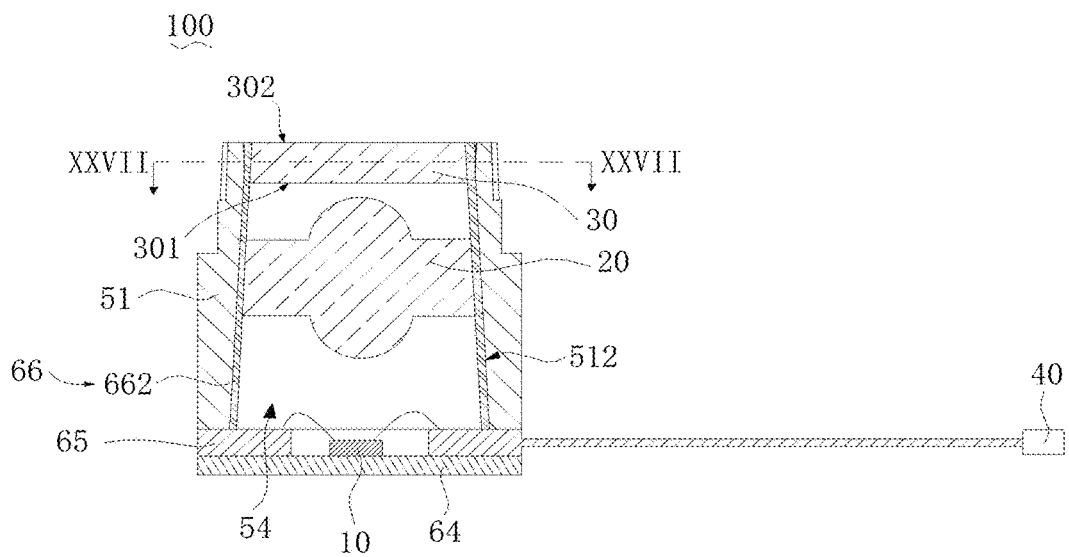
FIG. 82 illustrates a schematic diagram of a laser projection module according to some embodiments of the present disclosure.
Figure 83:
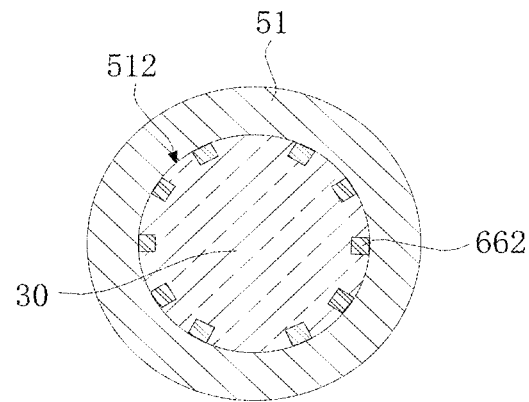
FIG. 83 illustrates a cross-sectional view of the laser projection module in FIG. 82 taken along line XXVII-XXVII.
Figure 84:
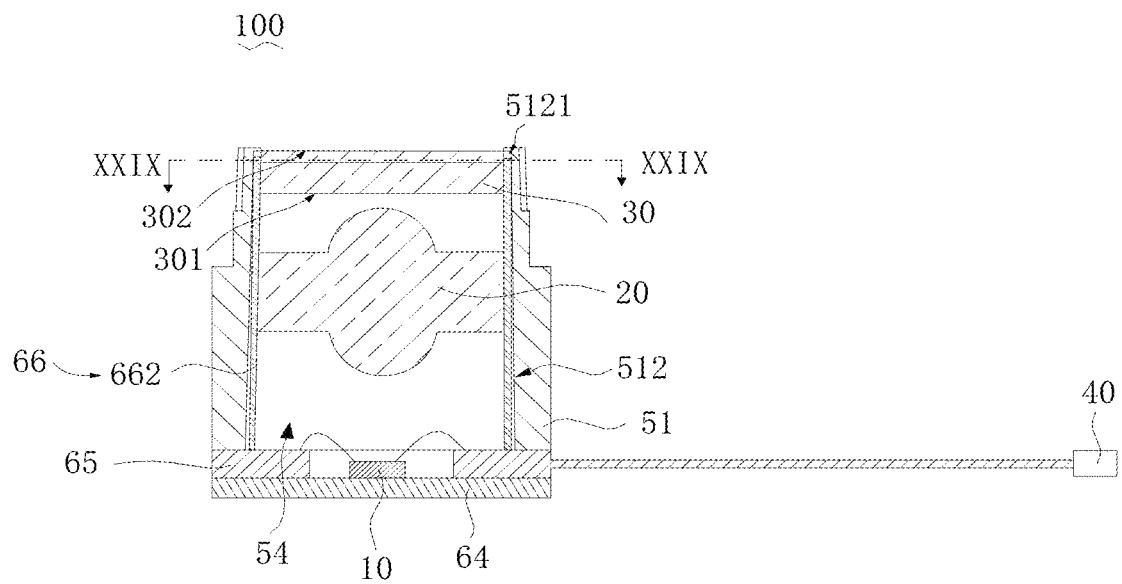
FIG. 84 illustrates a schematic diagram of a laser projection module according to some embodiments of the present disclosure.
Figure 85:
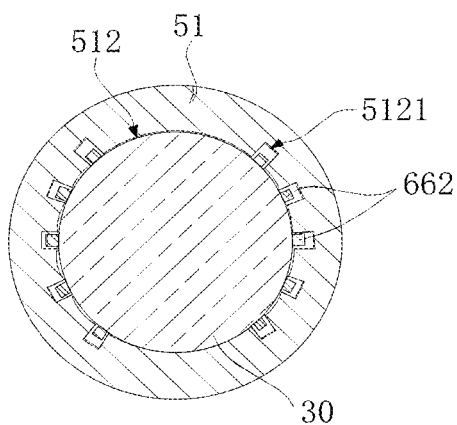
FIG. 85 illustrates a cross-sectional view of the laser projection module in FIG. 84 taken along line XXIX-XXIX.
Figure 86:
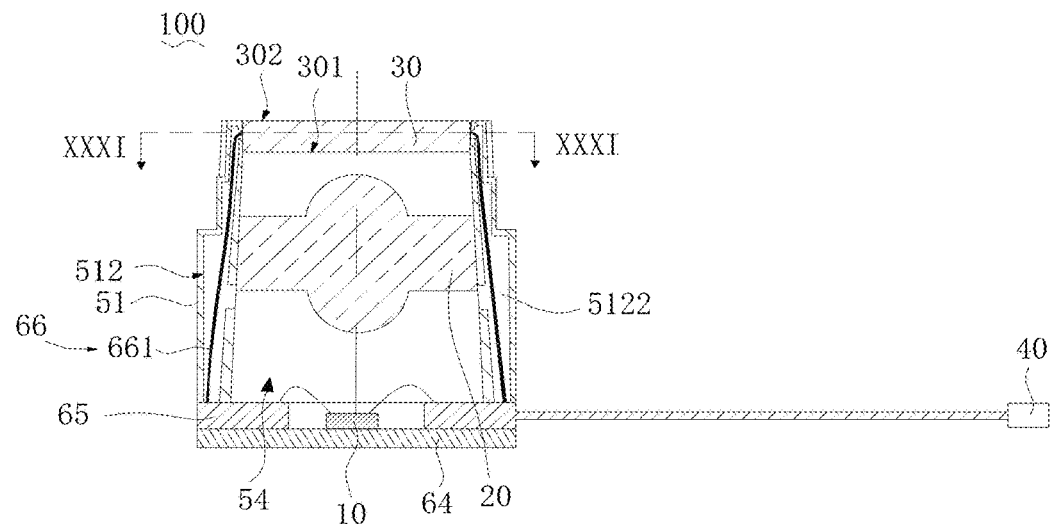
FIG. 86 illustrates a schematic diagram of a laser projection module according to some embodiments of the present disclosure.
Figure 87:
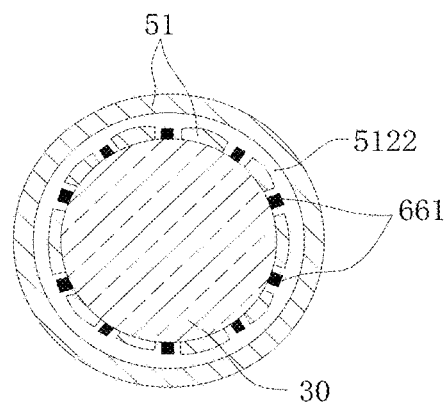
FIG. 87 illustrates a cross-sectional view of the laser projection module in FIG. 86 taken along line XXXI-XXXI.

The position of the conductive element 66 connecting the diffraction conductive path 34 and the circuit board 65 may be the following. A plurality of conductive elements 66 is attached to an inner surface of the peripheral wall 512 of the lens barrel 51. One end of each of the plurality of conductive elements 66 is electrically coupled to the diffraction input end 341 (including the first diffraction input end 3411 and the second diffraction input end 3412) or the diffraction output end 342 (including the first diffraction output end 3421 and the second diffraction output end 3422), and the other end is electrically coupled to the circuit board 65 (as illustrated in FIGS. 82 and 83). Or the peripheral wall 512 of the lens barrel 51 is provided with a plurality of grooves 5121 corresponding to the plurality of conductive elements 66. The plurality of conductive elements 66 is disposed in the plurality of corresponding grooves 5121. One end of each of the plurality of conductive elements 66 is electrically coupled to the diffraction input end 341 or the diffraction output end 342, and the other end is electrically coupled to the circuit board 65 (as illustrated in FIGS. 84 and 85). Or, the peripheral wall 512 of the lens barrel 51 is provided with an annular hole 5122 in the axial direction, and the plurality of conductive elements 66 is disposed in the annular hole 5122. One end of each of the plurality of conductive elements 66 is electrically coupled to the diffraction input end 341 or the diffraction output end 342, and the other end is electrically coupled to the circuit board 65 (as illustrated in FIGS. 86 and 87).

The conductive element 66 may be a crystal line 661 or a spring plate 662.

For example, as illustrated in FIGS. 82 and 83, the conductive element 66 is the spring plate 662. A plurality of spring plates 662 is disposed on the circuit board 65. The length of the plurality of spring plates 662 extends toward the light-emitting direction of the laser emitter 10. The plurality of spring plates 662 is attached to the inner surface of the peripheral wall 512 of the lens barrel 51. The number of the plurality of spring plates 662 is twice the number of the plurality of diffraction conductive paths 34. One end of each of the plurality of spring plates 662 is coupled to the circuit board 65, and the other end is coupled to the diffraction input end 341 or the diffraction output end 342. In detail, one end of each of the first part of the plurality of spring plates 662 is coupled to the first diffraction input end 3411, and the other end is coupled to the circuit board 65; one end of each of the second part of the plurality of spring plates 662 is coupled to the first diffraction output end 3421, and the other end is coupled to the circuit board 65; one end of each of the third part of the plurality of spring plates 662 is coupled to the second diffraction input end 3412, and the other end is coupled to the circuit board 65; one end of each of the fourth part of the plurality of spring plates 662 is coupled to the second diffraction output end 3422, and the other end is coupled to the circuit board 65. The plurality of spring plates 662 is spaced from each other, and thus, the plurality of spring plates is insulated from each other, thereby ensuring insulation among the plurality of diffraction conductive paths 34. Alternatively, an insulating material may be coated on the remaining surface of each of the plurality of spring plates 662 except the contact position of the diffraction input end 341 or the diffraction output end 342 to further ensure the insulation among the plurality of diffraction conductive paths 34.

As illustrated in FIGS. 84 and 85, the peripheral wall 512 of the lens barrel 51 is provided with a plurality of grooves 5121 corresponding to the plurality of spring plates 662. The plurality of spring plates 662 is disposed in the plurality of corresponding grooves 5121. The positions of the plurality of spring plates 662 is in one-to-one correspondence with the positions of the plurality of diffraction input ends 341 and the plurality of diffraction output ends 342. The length of the plurality of spring plates 662 extends toward the light-emitting direction of the laser emitter 10. One end of each of the plurality of spring plates 662 is in contact with the circuit board 65, and the other end is in contact with the diffraction input end 341 or the diffraction output end 342. In detail, one end of each of the first part of the plurality of spring plates 662 is coupled to the first diffraction input end 3411, and the other end is coupled to the circuit board 65; one end of each of the second part of the plurality of spring plates 662 is coupled to the first diffraction output end 3421, and the other end is coupled to the circuit board 65; one end of each of the third part of the plurality of spring plates 662 is coupled to the second diffraction input end 3412, and the other end is coupled to the circuit board 65; one end of each of the fourth part of the plurality of spring plates 662 is coupled to the second diffraction output end 3422, and the other end is coupled to the circuit board 65.

As illustrated in FIGS. 86 and 87, the conductive element 66 is the crystal line 661. The peripheral wall 512 of the lens barrel 51 is provided with the annular hole 5122 in the axial direction. A plurality of crystal lines 661 is accommodated in the annular hole 5122. One end of each of the first part of the plurality of crystal lines 661 is electrically coupled to the first diffraction input end 3411, and the other end is electrically coupled to the circuit board 65. One end of each of the second part of the plurality of crystal lines 661 is coupled to the first diffraction output end 3421, and the other end is coupled to the circuit board 65. One end of each of the third part of the plurality of crystal lines 661 is coupled to the second diffraction input end 3412, and the other end is coupled to the circuit board 65. One end of the fourth part of the plurality of crystal lines 661 is coupled to the second diffraction output end 3422, and the other end is coupled to the circuit board 65. The outer layer of each of the plurality of crystal lines 661 may be coated with an insulating material, so that the plurality of crystal lines 661 are prevented from contacting each other to cause a problem that the plurality of diffraction conductive paths 34 is not insulated from each other.

In addition, the crystal line 661 may be attached to the inner surface of the lens barrel 51 or may be disposed in the groove 5121 provided on the peripheral wall 512 of the lens barrel 51; the spring plate may also be accommodated in the annular hole 5122.

Figure 88:
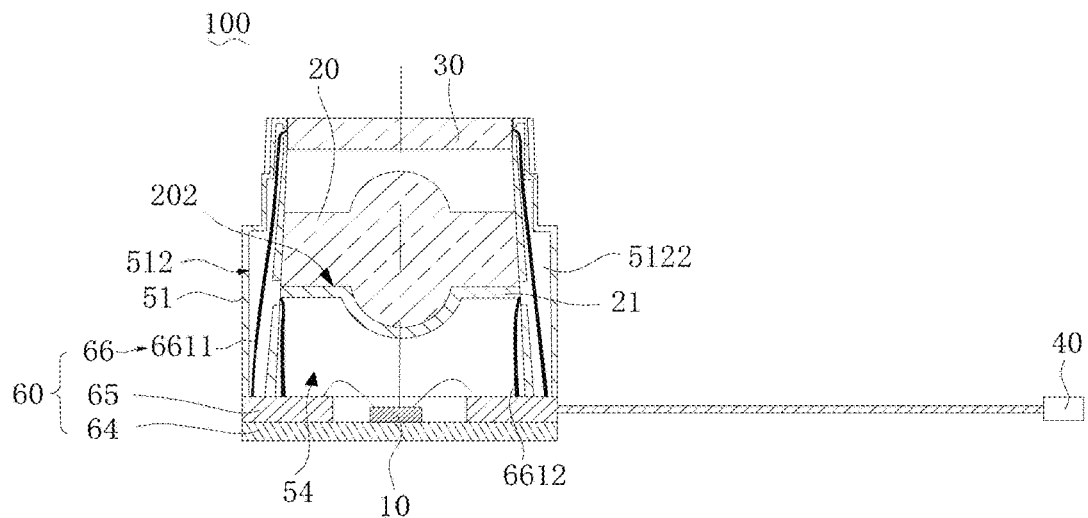
FIGS. 88 and 89 illustrate schematic diagrams of a laser projection module according to some embodiments of the present disclosure.

Referring to FIG. 88, in some embodiments, the collimating incident surface 201 of the collimating element 20 is provided with the transparent collimation conductive film 21. The plurality of collimation conductive electrodes 22 arranged in parallel at intervals is provided in the transparent collimation conductive film 21. The diffractive element 30 is doped with the plurality of diffraction conductive particles 33. The plurality of diffraction conductive particles 33 forms the plurality of diffraction conductive paths 34. The plurality of diffraction conductive paths 34 does not intersect with each other and is insulated from each other. The conductive element 66 is the crystal line 52. The peripheral wall 512 of the lens barrel 51 is provided with the annular hole 5122 in the axial direction. A plurality of crystal lines 6612 (hereinafter referred to as "collimating crystal line 6612") attached to the inner surface of the peripheral wall 512 of the lens barrel 51, connects the plurality of collimation conductive electrodes 22 and the circuit board 65. The plurality of crystal lines 6611 (hereinafter referred to as "diffractive crystal line 6611") connecting the plurality of diffraction conductive paths 34 and the circuit board 65, is accommodated in the annular hole 5122. In detail, one end of each of a part of the plurality of collimating crystal lines 6612 is electrically coupled to the collimation input end 241, and the other end is electrically coupled to the circuit board 65. One end of each of the remaining part of the plurality of collimating crystal lines 6612 is electrically coupled to the collimation output end 242, and the other end is electrically coupled to the circuit board 65. Moreover, one end of each of a part of the plurality of diffractive crystal lines 6611 is electrically coupled to the diffraction input end 341, and the other end is electrically coupled to the circuit board 65. One end of each of the remaining part of the plurality diffractive crystal lines 6611 is electrically coupled to the diffraction output end 342, and the other end is electrically coupled to the circuit board 65. The collimation conductive electrode 22 on the collimating element 20 may output collimating electrical signal to the processor 40 through the collimating crystal line 6612, and the diffraction conductive path 34 on the diffractive element 30 may output the diffractive electrical signal to the processor 40 through the diffractive crystal line 6611. Thus, the processor 40 may detect whether the collimating element 20 is fractured, and whether the diffractive element 30 is fractured. Upon detecting any of the collimating element 20 and the diffractive element 30 is fractured, it may immediately turn off the laser emitter 10 or reduce the emission power of the laser emitter 10 to avoid harm to the user's eyes.

Figure 89:
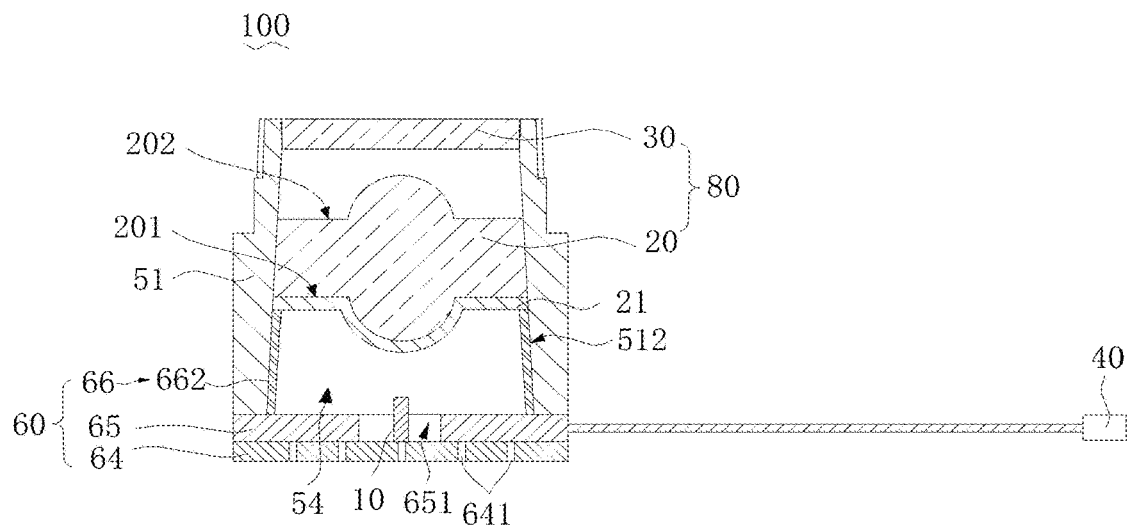

Referring to FIG. 89, in some embodiments, the circuit board assembly 60 further includes a substrate 64 on which the circuit board 65 is carried. The circuit board 65 may be a hard board, a soft board, or a soft and hard board. The circuit board 65 is provided with a via 651. The laser emitter 10 is carried on the substrate 64 and accommodated in the via 651. The laser emitter 10 is electrically coupled to the processor 40 through the circuit board 65. The substrate 64 is provided with a heat dissipation hole 641. The heat generated by the operation of the laser emitter 10 or the circuit board 65 may be dissipated by the heat dissipation hole 641. The heat dissipation hole 641 may also be filled with the thermal conductive adhesive to further improve the heat dissipation performance of the substrate 64.

The laser emitter 10 may be a vertical-cavity surface-emitting laser (VCSEL) or an edge-emitting laser (EEL). In the embodiment illustrated in FIG. 89, the laser emitter 10 is an edge-emitting laser. In detail, the laser emitter 10 may be a distributed feedback laser (DFB). The laser emitter 10 is configured to emit laser light into the accommodating cavity 54. Referring to FIG. 31, the laser emitter 10 is a columnar as a whole, and the laser emitter 10 forms a light-emitting surface 11 away from an end surface of the substrate 64. The laser light is emitted from the light-emitting surface 11 that faces the collimating element 20. The laser emitter 10 is fixed to the substrate 64. In detail, the laser emitter 10 may be attached to the substrate 64 by a sealant 15, for example, one side of the laser emitter 10 opposite to the light-emitting surface 11 is attached to the substrate 64. Referring to FIGS. 89 and 32, the connecting surface 12 of the laser emitter 10 may also be attached to the substrate 64. The sealant 15 encloses the connecting surface 12, or may only attach one surface of the connecting surface 12 to the substrate 64 or attach a few surfaces to the substrate 64. At this time, the sealant 15 may be a thermal conductive adhesive to transfer heat generated by the operation of the laser emitter 10 to the substrate 64.

When the laser projection module 100 adopts an edge-emitting laser as the laser emitter 10, the temperature drift of the edge-emitting laser is smaller than that of the VCSEL array, and since the edge-emitting laser is a single-point illumination structure, it is not necessary to design an array structure, and the manufacture of the edge-emitting laser is sample, thus the cost of the light source of the laser projection module 100 is low.

When the laser light of the distributed feedback laser propagates, the gain of the power is obtained through the feedback of the grating structure. To increase the power of the distributed feedback laser, it is necessary to increase the injecting current and/or increase the length of the distributed feedback laser. Since increasing the injecting current will increase the power consumption of the distributed feedback laser and cause serious heat generation, in order to ensure the normal operation of the distributed feedback laser, it is necessary to increase the length of the distributed feedback laser, thus the distributed feedback laser usually has an elongate strip. When the light-emitting surface 11 of the edge-emitting laser faces the collimating element 20, the edge-emitting laser is placed vertically. Due to the structure of elongated strip of the edge-emitting laser, the edge-emitting laser is prone to accidents such as dropping, shifting or shaking, and the accidents may be avoided by fixing the edge-emitting laser with the sealant 15.

Referring to FIGS. 89 and 33, the laser emitter 10 may also be fixed to the substrate 64 in a fixed manner as illustrated in FIG. 33. In detail, the laser projection module 100 includes a plurality of support members 16. The plurality of support members 16 may be fixed to the substrate 64, and collectively form the accommodating space 160. The laser emitter 10 is accommodated in the accommodating space 160 and supported by the plurality of support members 16. The laser emitter 10 may be directly mounted between the plurality of support members 16. In one example, the plurality of support members 16 collectively clamp the laser emitter 10 to further prevent the laser emitter 10 from shaking.

In some embodiments, the substrate 64 may also be omitted, and the laser emitter 10 may be directly fixed to the circuit board 65 to reduce the thickness of the laser projection module 100.

Referring to FIG. 34, the present disclosure also provides a depth camera 1000. The depth camera 1000 provided in the embodiment of the present disclosure includes the laser projection module 100 according to any one of the above embodiments, an image collector 200 and a processor 40. The image collector 200 is configured to collect the laser pattern diffracted by the diffractive element 30 and projected into the target space. The processor 40 is coupled to the laser projection module 100 and the image collector 200. The processor 40 is configured to process the laser pattern to obtain a depth image. The processor 40 herein may be the processor 40 in the laser projection module 100.

In detail, the laser projection module 100 projects the laser pattern into the target space through a projecting window 901, and the image collector 200 collects the laser pattern modulated by the target object through a collecting window 902. The image collector 200 may be an infrared camera. The processor 40 calculates an offset value between each pixel point in the laser pattern and the corresponding pixel point in the reference pattern through an image matching algorithm, and further obtains a depth image of the laser pattern according to the offset values. The image matching algorithm may be a digital image correlation (DIC) algorithm, which may be replaced by other image matching algorithms.

Referring to FIGS. 64 and 35, the electronic device 3000 provided in an embodiment of the present disclosure includes a housing 2000, and the depth camera 1000 according to the above embodiment. The depth camera 1000 is disposed within the housing 2000 and exposed from the housing 2000 to obtain the depth image.

With the laser projection module 100 in the embodiment of the present application, by disposing the detection element 70 on the optical assembly 80, and electrically coupling the detection element 70 to the circuit board 65 through the conductive element 66, thus the processor 40 may obtain the electrical signal output by the detection element 70, and determine whether the optical assembly 80 is fractured according to the electrical signal. When it is detected that the optical assembly 80 is fractured, it may turn off the laser emitter 10 in time, or reduce the power of the laser emitter 10 in time, such that the user's eyes may be protected from the high energy of the laser projected by a fractured optical assembly 80, thereby improving the safety of the laser projection module 100 in use.

Figure 90:
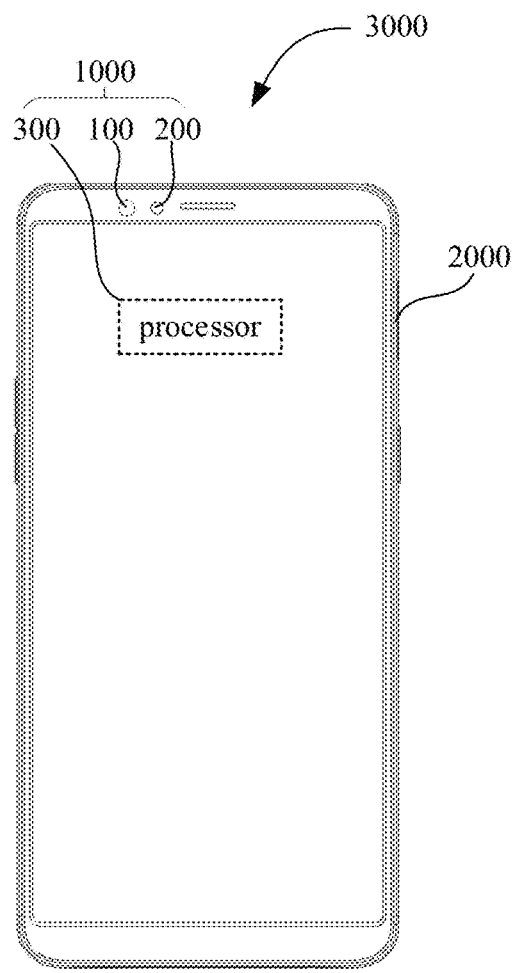
FIG. 90 illustrates a schematic diagram of an electronic device according to some embodiments of the present disclosure.

Referring to FIGS. 90 and 34, the present disclosure provides an electronic device 3000. The electronic device 3000 may be a smart phone, a smart bracelet, a smart watch, a tablet, smart glasses, a smart helmet, a somatosensory game device, and the like. The electronic device 3000 includes a housing 2000 and a depth camera 1000. The depth camera 1000 is disposed within the housing 2000 and exposed from the housing 2000 to obtain a depth image. The depth camera 1000 includes a laser projection module 100, an image collector 200 and a processor 40. The laser projection module 100 is configured to project a laser pattern into a target space. The image collector 200 is configured to collect the laser pattern projected by the laser projection module 100 into the target space. The processor 40 is configured to obtain the laser pattern and to obtain a depth image.

In detail, the laser projection module 100 projects the laser pattern into the target space through a projecting window 901, and the image collector 200 collects the laser pattern modulated by the target object through a collecting window 902. The image collector 200 may be an infrared camera. The processor 40 calculates an offset value of each pixel point in the laser pattern and the corresponding pixel point in the reference pattern by using an image matching algorithm, and further obtains the depth image of the laser pattern according to offset values. The image matching algorithm may be a digital image correlation (DIC) algorithm, which could be replaced by other image matching algorithms.

Figure 91:
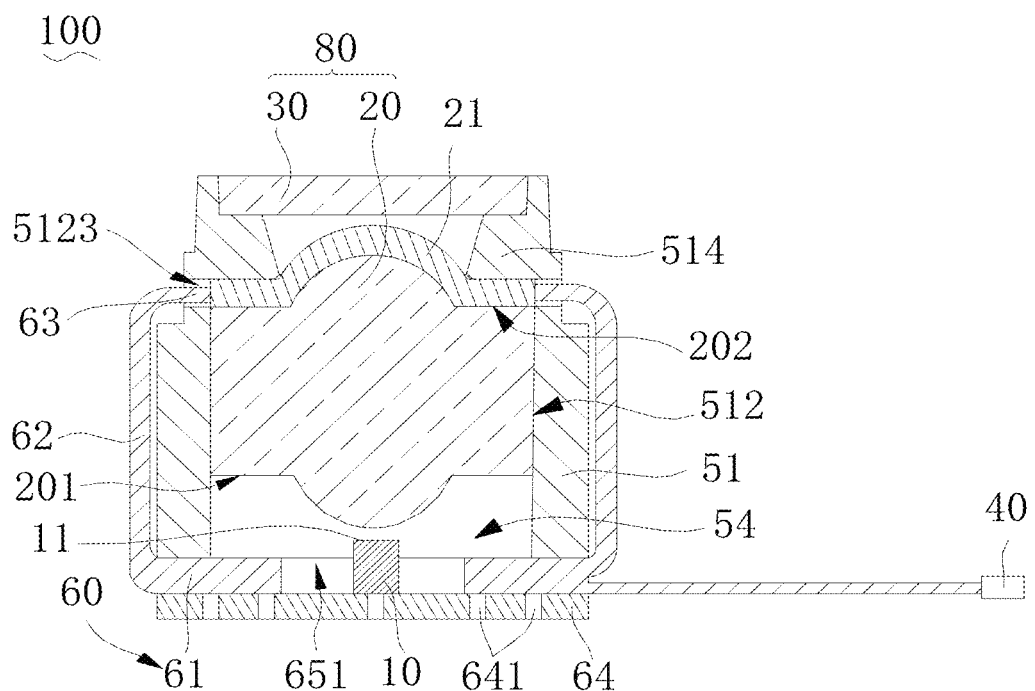
FIG. 91 illustrates a schematic diagram of a laser projection module according to some embodiments of the present disclosure.

As illustrated in FIG. 91, the laser projection module 100 includes a circuit board assembly 60 and a lens barrel 51. The circuit board assembly 60 includes a first connecting board 61, a bent board 62, and a second connecting board 63 that are sequentially joined. The first connecting board 61 may be a hard board, a soft board or a soft and hard board. The second connecting board 63 may also be a hard board, a soft board or a soft and hard board. The bent board 62 may be preferably a soft board. The lens barrel 51 includes a peripheral wall 512 and a carrier 514 extending from the peripheral wall 512. The peripheral wall 512 is disposed on the first connecting board 61. The peripheral wall 512 encloses an accommodating cavity 54 with the first connecting board 61.

The laser projection module 100 also includes a laser emitter 10 and an optical assembly 80. The optical assembly 80 includes a collimating element 20 and a diffractive element 30. The laser emitter 10, the collimating element 20, and the diffractive element 30 are accommodated in the accommodating cavity 54. The collimating element 20 and the diffractive element 30 are sequentially arranged along the outgoing optical path of the laser emitter 10. The circuit board assembly 60 also includes the substrate 64. The first connection board 61 is carried on the substrate 64. The first connecting board 61 is provided with a through hole 651. The laser emitter 10 is carried on the substrate 64 and accommodated in the through hole 651. The laser emitter 10 is configured to emit laser light. The collimating element 20 is configured to collimate the laser light emitted by the laser emitter 10. The diffractive element 30 is carried on the carrier 514 and configured to diffract the laser light collimated by the collimating element 20 to output a laser pattern.

Referring to FIGS. 91 and 22, the optical assembly 80 is provided with a detection element. After the detection element is energized, an electrical signal may be output to the processor 40. The processor 40 determines whether the optical assembly 80 is fractured according to the electrical signal. Upon detecting the fracture of the optical assembly 80, it may turn off the laser emitter 10 in time or reduce the power of the laser emitter 10 in time. The first connecting board 61 is electrically coupled to the processor 40. The detection element is electrically coupled to the first connecting board 61 through the second connecting board 63 and the bent board 62, and further electrically coupled to the processor 40. In detail, the peripheral wall 512 of the lens barrel 51 is provided with an annular connecting hole 5123. One end of the bent board 62 is coupled to the first connecting board 61, and the other end is coupled to the second connecting board 63, and the intermediate portion is attached to the peripheral wall 512 of the lens barrel 51. The second connecting board 63 protrudes into the accommodating cavity 54 through the annular connecting hole 5123 to be coupled with the detection element.

A plurality of bent boards 62 may be provided. A plurality of corresponding second connecting boards 63 may be also provided. The detection element may be a transparent collimation conductive film 21. The transparent collimation conductive film 21 may be disposed on the collimating element 20. One or more collimation conductive electrodes 22 may be disposed on the transparent collimation conductive film 21. The mechanism for determining whether the collimating element 20 is fractured may be as follows. A resistance of the transparent collimation conductive film 21 is related to the collimating element 20. When the collimating element 20 is intact, the transparent collimation conductive film 21 is intact, and the resistance of the transparent collimation conductive film 21 is small. When collimating element 20 is fractured, the transparent collimation conductive film 21 formed on the collimating element 20 is also fractured, and the resistance of the transparent collimation conductive film 21 at a fracture position is close to infinity. Based on the above features, it may be detected whether the collimating element 20 is fractured. For example, when the collimation conductive electrodes 22 on the transparent collimation conductive film 21 is energized, i.e., when the voltage of a certain magnitude is applied to the collimation conductive electrodes 22 on the transparent collimation conductive film 21, the current output by the one or more collimation conductive electrodes 22 may be obtained by the processor 40. It may be detected whether the collimating element 20 is fractured based on the current output by the collimation conductive electrode 22 and obtained by the processor 40.

Therefore, in the first mode, it is determined whether the transparent collimation conductive film 21 is damaged according to a difference between the collimating electrical signal (i.e., current) and the collimating electrical signal (i.e., current) detected when the collimating element 20 is intact, and further, determined whether the collimating element 20 is fractured based on a state of the transparent collimation conductive film 21. That is, when the transparent collimation conductive film 21 is damaged, the collimating element 20 is also fractured, and when the transparent collimation conductive film 21 is intact, the collimating element 20 is also intact. In the second mode, it is determined whether the transparent collimation conductive film 21 is damaged directly according to the collimating electrical signal output by the one or more collimation conductive electrodes 22 on the collimating element 20 after being energized, and further, determined whether the collimating element 20 is fractured based on a state of the transparent collimation conductive film 21. In detail, when the collimating electrical signal output by the one or more collimation conductive electrodes 22 is not within the preset range, the transparent collimation conductive film 21 is intact, and the collimating element 20 is also intact. When the collimating electrical signal output by the one or more collimation conductive electrodes 22 is within the preset range, it is determined that the transparent collimation conductive film 21 is intact, and the collimating element 20 is also intact.

The transparent collimation conductive film 21 may be formed on the surface of the collimating element 20 by plating or the like. The material of the transparent collimation conductive film 21 may be any of indium tin oxide (ITO), Nano silver wire and metal silver wire. The above materials having good transmissivity and conductive properties, may output electrical signal after energization, without blocking the outgoing optical path of the collimating element 20.

In detail, the collimating element 20 includes a collimation incident surface 201 and a collimation exit surface 202. The transparent collimation conductive film 21 is a single layer. The transparent collimation conductive film 21 may be disposed on the collimation incident surface 201 or on the collimation exit surface 202. The transparent collimation conductive film 21 is provided with a plurality of collimation conductive electrodes 22. The plurality of collimation conductive electrodes 22 does not intersect with each other. Each of the plurality of collimation conductive electrodes 22 includes a collimation input end 221 and a collimation output end 222. Each of the plurality of collimation input ends 221 is electrically coupled to the first connecting board 61 through one second connecting board 63 and one bent board 62, and is further electrically coupled to the processor 40, and the corresponding collimation output end 222 is electrically coupled to the first connecting board 61 through another second connecting board 63 and another bent board 62, and is further electrically coupled to the processor 40. Each of the plurality of collimation input ends 221 and each of the plurality of collimation output ends 222 and the processor 40 are coupled to form a collimation conductive loop. The plurality of collimation input ends 221 and the plurality of collimation output ends 222 of the plurality of collimation conductive electrodes 22 are electrically coupled to the processor 40 to form a plurality of collimation conductive loops. The plurality of collimation conductive electrodes 22 may be arranged in various manners. For example, the extending direction of each of the plurality of collimation conductive electrodes 22 may be the longitudinal direction of the transparent collimation conductive film 21, and the plurality of collimation conductive electrodes 22 may be arranged in parallel at intervals (as illustrated in FIG. 22). Or the extending direction of each of the plurality of collimation conductive electrodes 22 may be the width direction of the transparent collimation conductive film 21, and the plurality of collimation conductive electrodes 22 may be arranged in parallel at intervals (as illustrated in FIG. 23). Or the extending direction of each of the plurality of collimation conductive electrodes 22 may be the diagonal direction of the transparent collimation conductive film 21, and the plurality of collimation conductive electrodes 22 may be arranged in parallel at intervals (as illustrated in FIGS. 24 and 25). Regardless of the way the plurality of collimation conductive electrodes 22 is arranged, the plurality of collimation conductive electrodes 22 may occupy a larger area of the transparent collimation conductive film 21 compared to one collimation conductive electrode 22, and output more electrical signals correspondingly. The processor 40 may more accurately determine whether the transparent collimation conductive film 21 is damaged, according to more electrical signals, and further determine whether the collimating element 20 is fractured, thereby improving the accuracy of detecting the fracture of the collimating element 20.

It should be noted that, for each of the plurality of collimation conductive electrodes 22, the collimation input end 221 and the collimation output end 222 each may be provided with a metal contact (e.g. gold finger). Metal contacts may be also provided on the surface of the second connecting board 63 that is in contact with each of the plurality of collimation input ends 221 or the plurality of collimation output ends 222. After the second connecting board 63 extends into the accommodating cavity 54 through the annular connecting hole 5123, the metal contacts on the second connecting board 63 may be in contact with the metal contact on each of the plurality of collimation input ends 221 or the plurality of collimation output ends 222 to realize the electrical connection between the detection element and the processor 40. Further, a sealant may be filled in the annular connecting hole 5123 to fix the second connecting board 63, such that the contacts between the metal contacts on the second connecting board 63 and the metal contacts on the plurality of collimation input ends 221 or the plurality of collimation output ends 222 may be stabilized, and the sealant may seal the annular connecting hole 5123 to prevent water, dust, and the like from entering the accommodating cavity 54.

With the laser projection module 100 provided in the embodiments of the present application, by disposing the detection element on the optical assembly 80, and electrically coupling the detection element and the processor 40 through the bendable circuit board assemble 60, thus the processor 40 may obtain the electrical signal output by the detection element, and determine whether the optical assembly 80 is fractured according to the electrical signal. When it is detected that the optical assembly 80 is fractured, it may turn off the laser emitter 10 in time, or reduce the power of the laser emitter 10 in time, such that the user's eyes may be protected from the high energy of the laser projected by the fractured optical assembly 80, thereby improving the safety of the laser projection module 100 in use.

Figure 92:
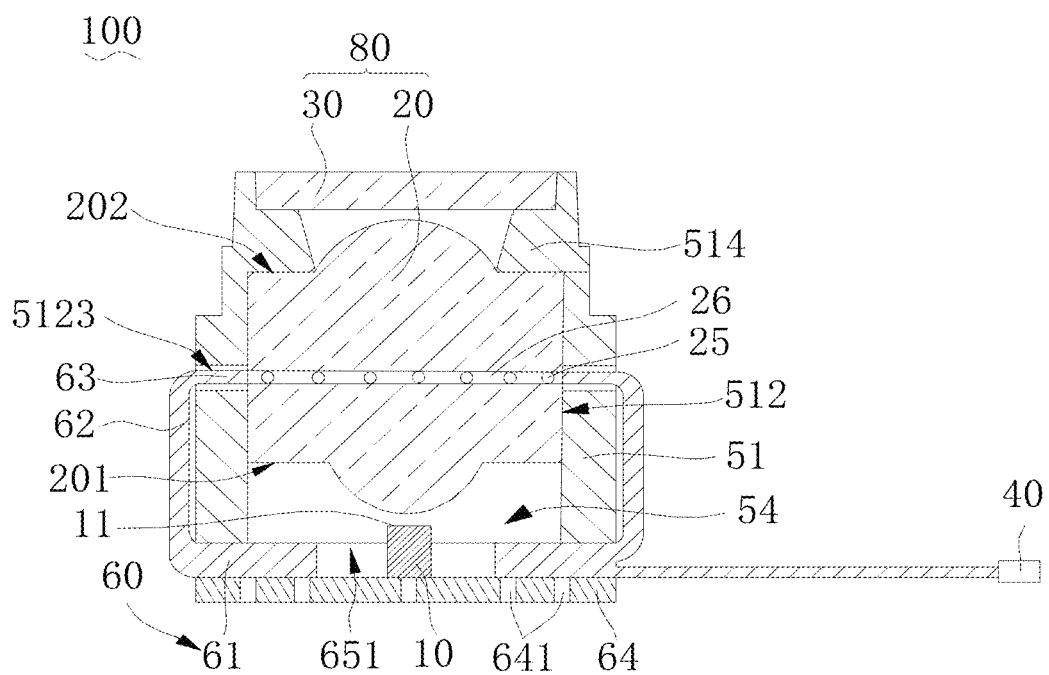
FIG. 92 illustrates a schematic diagram of a laser projection module according to some embodiments of the present disclosure.

Referring to FIG. 92, in some embodiments, the detection element may be a plurality of collimation conductive particles 23 doped in the collimating element 20. The plurality of collimation conductive particles 23 forms one or more collimation conductive paths 24. At this time, the mechanism of determining whether the collimating element 20 is fractured may be as follows. A resistance of the collimation conductive path 24 is related to the collimating element 20. When the collimating element 20 is intact, the adjacent collimation conductive particles 23 are joined together, and the resistance of the collimation conductive path 24 is small. When the collimating element 20 is fractured, the junction among the collimation conductive particles 23 doped on the collimating element 20 is broken, and the resistance of the collimation conductive path 24 is close to infinity.

Based on the above features, it may be detected whether the collimating element 20 is fractured. For example, when the collimation conductive path 24 is energized, that is, when the voltage of a certain magnitude is applied to the collimation conductive path 24, the current output by the collimation conductive path 24 may be obtained by the processor 40. It may be detected whether the collimating element 20 is fractured based on the current output by the collimation conductive path 24 and obtained by the processor 40.

Therefore, in the first mode, it is determined whether the collimating element 20 is fractured according to a difference between the collimating electrical signal (i.e., current) output by the collimation conductive path 24 after being energized and the collimating electrical signal detected when the collimating element 20 is fractured. In the second mode, it is determined whether the collimating element 20 is fractured directly according to the collimating electrical signal output by the collimation conductive path 24 after being energized. In detail, when the collimating electrical signal is not within the preset range, the collimating element 20 is fractured, and when the collimating electrical signal is within the preset range, the collimating element 20 is intact.

In detail, the collimating element 20 is doped with a plurality of collimation conductive particles 23. The plurality of collimation conductive particles 23 forms a plurality of collimation conductive paths 24. The plurality of collimation conductive paths 24 does not intersect with each other and is insulated from each other. Each of the plurality of collimation conductive paths 24 includes a collimation input end 41 and a collimation output end 242. Each of the plurality of collimation input ends 241 is electrically coupled to the first connecting board 61 through one second connecting board 63 and one bent board 62, and is further electrically coupled to the processor 40, and the corresponding collimation output end 242 is electrically coupled to the first connecting board 61 through another second connecting board 63 and another bent board 62, and is further electrically coupled to the processor 40. Thus, each of the plurality of collimation input ends 241 and each of the plurality of collimation output ends 242 and the processor 40 are coupled to form a collimation conductive loop. The plurality of collimation input ends 241 and the plurality of collimation output ends 242 of the plurality of collimation conductive paths 24 are electrically coupled to the processor 40 to form a plurality of collimation conductive loops. The plurality of collimation conductive paths 24 may be arranged in various manners. For example, the extending direction of each of the plurality of collimation conductive paths 24 may be the longitudinal direction of the collimating element 20, and the plurality of collimation conductive paths 24 may be arranged in parallel at intervals (as illustrated in FIG. 56). Or the extending direction of each of the plurality collimation conductive paths 24 may be the width direction of the collimating element 20, and the plurality of collimation conductive paths 24 may be arranged in parallel at intervals (as illustrated in FIG. 57). Or the extending direction of each of the plurality of collimation conductive paths 24 may be the diagonal direction of the collimating incident surface 201, and the plurality of collimation conductive paths 24 may be arranged in parallel at intervals (not illustrated). Or the extending direction of each of the plurality of collimation conductive paths 24 may be the diagonal direction of the collimating incident surface 201 and the collimating exit surface 202 of the collimating element 20, and the plurality of collimation conductive path 24 may be arranged in parallel at intervals (not illustrated). Regardless of the way the plurality of collimation conductive paths 24 is arranged, the plurality of collimation conductive paths 24 may occupy a larger area of the collimating element 20 compared to one collimation conductive path 24, and output more electrical signals correspondingly. The processor 40 may more accurately determine whether the collimating element 20 is fractured, according to more electrical signals, thereby improving the accuracy of detecting the fracture of the collimating element 20.

Similarly, metal contacts (e.g. gold fingers) may be provided on the peripheral wall of the collimating element 20. The metal contacts are coupled to the collimation input end 241 and the collimation output end 242 of each of the plurality of collimation conductive paths 24. Metal contacts may be also provided on the surface of the second connecting board 63 that is in contact with each of the plurality of collimation input ends 241 or the plurality of collimation output ends 242. After the second connecting board 63 extends into the accommodating cavity 54 through the annular connecting hole 5123, the metal contacts on the second connecting board 63 may be in contact with the metal contacts on the peripheral wall of the collimating element 20 to realize the electrical connection between each of the plurality of collimation input ends 241 or the plurality of collimation output ends 242 and the processor 40. Further, a sealant may be filled in the annular connecting hole 5123 to fix the second connecting board 63, such that the contacts between the metal contacts on the second connecting board 63 and the metal contacts on the peripheral wall of the collimating element 20 may be stabilized, and the sealant may seal the annular connecting hole 5123 to prevent water, dust, and the like from entering the accommodating cavity 54.

Figure 93:
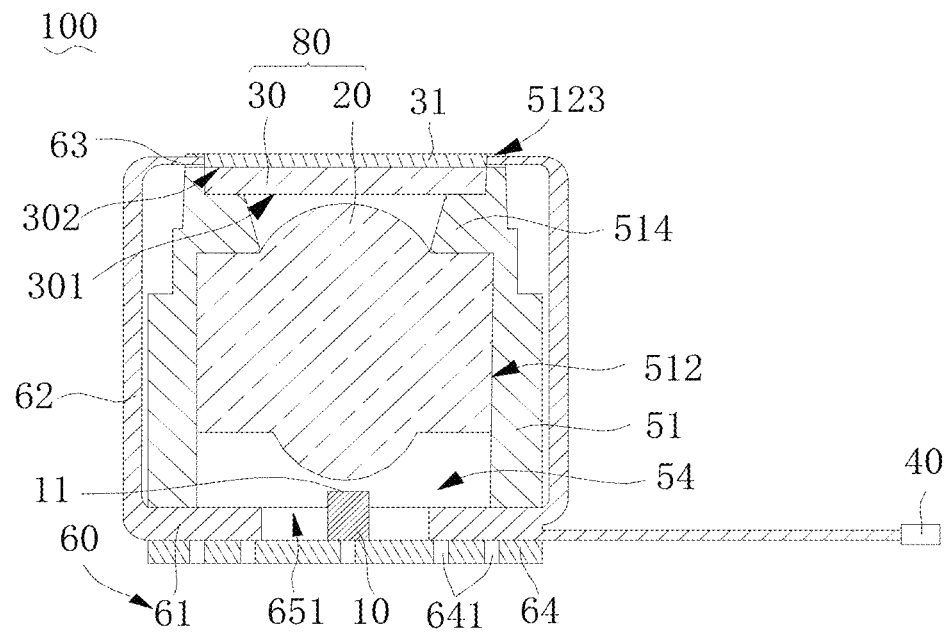
FIG. 93 illustrates a schematic diagram of a laser projection module according to some embodiments of the present disclosure.

Referring to FIGS. 93 to 14, in some embodiments, the detection element may be a transparent diffraction conductive film 31. The transparent diffraction conductive film 31 may be disposed on the diffractive element 30. One or more diffraction conductive electrodes 32 may be disposed on the transparent diffraction conductive film 31. The mechanism of determining whether the diffractive element 30 is fractured is the same as the mechanism of determining whether the collimating element 20 is fractured when the collimating element 20 is provided with the transparent collimation conductive film 21, and the details will not be repeated herein. The material of the transparent diffraction conductive film 31 is the same as the material of the transparent collimation conductive film 21, and the details will not be repeated herein.

In detail, the diffractive element 30 includes a diffraction incident surface 301 and a diffraction exit surface 302. The transparent diffraction conductive film 31 is a single-layer bridge structure and is disposed on the diffraction exit surface 302. A plurality of diffraction conductive electrodes 32 may be disposed on the transparent diffraction conductive film 31 of the single-layer bridge structure. The plurality of diffraction conductive electrodes 32 includes a plurality of first diffraction conductive electrodes 323 arranged in parallel at intervals, a plurality of second diffraction conductive electrodes 324 arranged in parallel at intervals, and a plurality of bridging diffraction conductive electrodes 325. The plurality of first diffraction conductive electrodes 323 and the plurality of second diffraction conductive electrodes 324 are crisscrossed. Each of the plurality of first diffraction conductive electrodes 323 is continuous without interruption. Each of the plurality of second diffraction conductive electrodes 324 is interrupted with the plurality of first diffraction conductive electrodes 323 at crisscross points, and insulated from the plurality of first diffraction conductive electrodes 323. Each of the plurality of bridging diffraction conductive electrodes 325 is coupled to a corresponding and interrupted second diffraction conductive electrode 324 at breakpoints. A diffraction insulator 326 is provided at a crisscross position between each of the plurality of bridging diffraction conductive electrodes 325 and each of the plurality of first diffraction conductive electrodes 323. One end, of each of the plurality of first diffraction conductive electrodes 323, is coupled to the first connecting board 61 through one second connecting board 63 and one bent board 62, and further electrically coupled to the processor 40, and the other end is coupled to the first connecting board 61 through another second connecting board 63 and another bent board 62, and further electrically coupled to the processor 40, to form a conductive loop. One end, of each of the plurality of second diffraction conductive electrodes 324, is coupled to the first connecting board 61 respectively through one second connecting board 63 and one bent board 62, and further electrically coupled to the processor 40, and the other end is coupled to the first connecting board 61 through another second connecting board 63 and another bent board 62, and further electrically coupled to the processor 40. to form a conductive loop. Therefore, both ends of the plurality of first diffraction conductive electrodes 323 and the processor 40 are coupled to form a plurality of conductive loops, and both ends of the plurality of second diffraction conductive electrodes 324 are coupled to the processor 40 to form a plurality of conductive loops. The material of the diffraction insulator 326 may be an organic material having good transmissivity and insulation properties, and the diffraction insulator 326 may be formed by a silk screen printing, or a photolithographic process. The plurality of first diffraction conductive electrodes 323 and the plurality of second diffraction conductive electrodes 324 are crisscrossed, meaning that the plurality of first diffraction conductive electrodes 323 and the plurality of second diffraction conductive electrodes 324 are vertically interlaced. That is, the angle between each of the plurality of first diffraction conductive electrodes 323 and each of the plurality of second diffraction conductive electrodes 324 is 90 degrees. In other embodiments, the plurality of first diffraction conductive electrodes 323 and the plurality of second diffraction conductive electrodes 324 may interlaced slantingly. In use, the processor 40 may simultaneously energize the plurality of first diffraction conductive electrodes 323 and the plurality of second diffraction conductive electrodes 324 to obtain electrical signals, or the processor 40 may sequentially energize the plurality of first diffraction conductive electrodes 323 and the plurality of second diffraction conductive electrodes 324 to obtain electrical signals. Then the processor 40 determines whether the transparent diffraction conductive film 31 is damaged according to the electrical signals. When it is detected that the electrical signal output by the first diffraction conductive electrode 323 numbered ① is not within the preset range, and the electrical signal output by the second diffraction conductive electrode 324 numbered ③ is not within the preset range, the transparent diffraction conductive film 31 is damaged at the crisscross point between the first diffraction conductive electrode 323 numbered ① and the second diffraction conductive electrode 324 numbered ③, and the position of the diffractive element 30 corresponding to the fracture position of the transparent diffraction conductive film 31 is also damaged. Thus, whether the diffractive element 30 is fractured and the specific fracture position may be accurately detected through the transparent diffraction conductive film 31 of the single-layer bridge structure.

It should be noted that each of the plurality of diffraction conductive electrodes 32 is provided with metal contacts at both ends. The metal contacts may be also provided on the surface of the second connecting board 63 that is in contact with both ends of the diffraction conductive electrode 32. After the second connecting board 63 extends into the accommodating cavity 54 through the annular connecting hole 5123, the metal contacts on the second connecting board 63 are in contact with the metal contacts at each end point to realize electrical connection between the detection element and the processor 40. Further, the sealant may be filled in the annular connecting hole 5123 to fix the second connecting plate 63, so that the metal contacts on the second connecting plate 63 may be stably contacted to the metal contacts at each end point, and the sealant may seal the annular connecting hole 5123 to prevent water, dust, and the like from entering the accommodating cavity 54.

Figure 94:
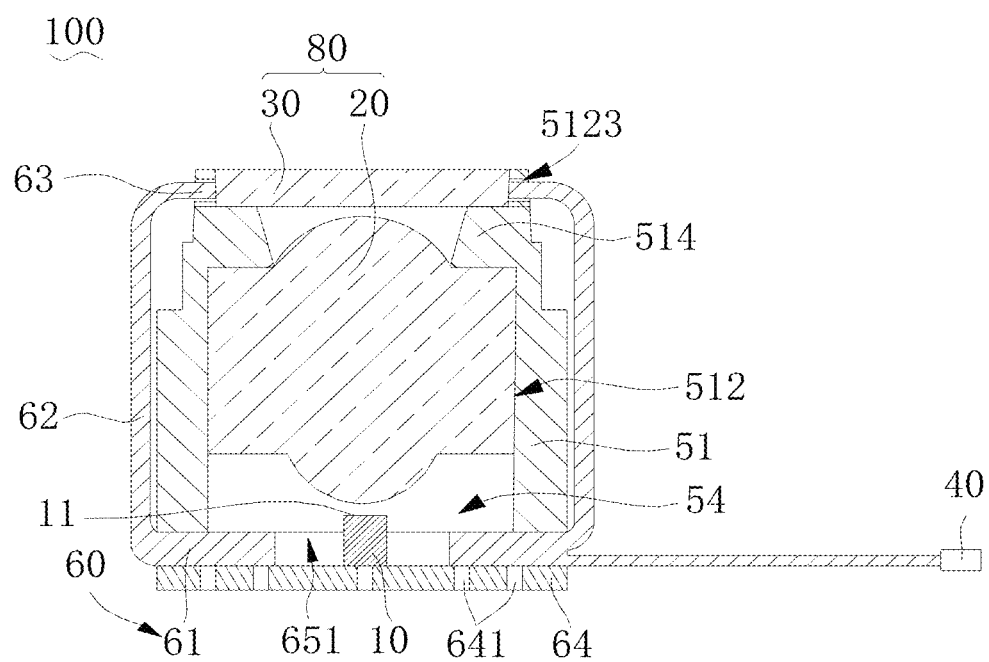
FIG. 94 illustrates a schematic diagram of a laser projection module according to some embodiments of the present disclosure.

Referring to FIGS. 94 to 48, in some embodiments, the detection element may be a plurality of diffraction conductive particles 33 doped in the diffractive element 30. The plurality of diffraction conductive particles 33 forms a plurality of diffraction conductive paths 34. The mechanism for determining whether the diffractive element 30 is fractured is the same as the mechanism for determining whether the collimating element 20 is fractured when the collimating element 20 is doped with the plurality of diffraction conductive particles 33, and the details will not be repeated herein.

In detail, the diffractive element 30 is doped with the plurality of diffraction conductive particles 33. The plurality of diffraction conductive particles 33 forms a plurality of diffraction conductive paths 34. Each of the plurality of diffraction conductive paths 34 includes a diffraction input end 341 and a diffraction output end 342. The plurality of diffraction conductive paths 34 includes a plurality of first diffraction conductive paths 343 and a plurality of second diffraction conductive paths 344. The plurality of first diffraction conductive paths 343 are spaced in parallel, and the plurality of second diffraction conductive paths 344 are spaced in parallel. The plurality of first diffraction conductive paths 343 and the plurality of second diffraction conductive paths 344 are crisscrossed in space. Each of the plurality of first diffraction conductive paths 343 includes a first diffraction input end 3411 and a first diffraction output end 3421. Each of the plurality of second diffraction conductive paths 344 includes a second diffraction input end 3412 and a second diffraction output end 3422. That is, the diffraction input end 341 includes the first diffraction input end 3411 and the second diffraction input end 3412, and the diffraction output end 342 includes the first diffraction output end 3421 and the second diffraction output end 3422. Each of the plurality of first diffraction input ends 3411 is electrically coupled to the first connecting board 61 through one second connecting board 63 and one bent board 62, and is further electrically coupled to the processor 40, and the corresponding first diffraction output end 3421 is electrically coupled to the first connecting board 61 through another second connecting board 63 and another bent board 62, and is further electrically coupled to the processor 40. Thus, each of the plurality of first diffraction input ends 3411, each of the plurality of first diffraction output ends 3421 and the processor 40 are coupled to form a collimation conductive loop. Each of the plurality of second diffraction input ends 3412 is electrically coupled to the first connecting board 61 through one second connecting board 63 and one bent board 62, and is further electrically coupled to the processor 40, and the corresponding second diffraction output end 3422 is electrically coupled to the first connecting board 61 through another second connecting board 63 and another bent board 62, and is further electrically coupled to the processor 40. Thus, each of the plurality of second diffraction input ends 3412, each of the plurality of second diffraction output ends 3422 and the processor 40 are coupled to form a collimation conductive loop. Both ends of the plurality of first diffraction conductive paths 343 are coupled to the processor 40 to form a plurality of conductive loops, and both ends of the plurality of second diffraction conductive paths 344 are coupled to the processor 40 to form a plurality of conductive loops. The plurality of first diffraction conductive paths 343 and the plurality of second diffraction conductive paths 344 are crisscrossed, meaning that the plurality of first diffraction conductive paths 343 and the plurality of second diffraction conductive paths 344 are vertically interlaced in space. That is, the angle between each of the plurality of first diffraction conductive paths 343 and each of the plurality of second diffraction conductive paths 344 is 90 degrees. At this time, the extending direction of the plurality of first diffraction conductive paths 343 is the longitudinal direction of the diffractive element 30, and the extending direction of the plurality of second diffraction conductive paths 344 is the width direction of the diffractive element 30. In other embodiments, the plurality of first diffraction conductive paths 343 and the plurality of second diffraction conductive paths 344 are crisscrossed, also meaning that the plurality of first diffraction conductive paths 343 and the plurality of second diffraction conductive paths 344 are interlaced slantingly in space. In use, the processor 40 may simultaneously energize the first diffraction conductive paths 343 and the second diffraction conductive paths 344 to obtain electrical signals, or the processor 40 may sequentially energize the first diffraction conductive paths 343 and the second diffraction conductive paths 344 to obtain electrical signals. Then the processor 40 determines whether the diffractive element 30 is fractured according to the electrical signals. When it is detected that the electrical signal output by the first diffraction conductive path 343 numbered ② is not within the preset range, and the electrical signal output by the second diffraction conductive paths 344 numbered ④ is not within the preset range, the diffractive element 30 is fractured at the crisscross point between the first diffraction conductive path 343 numbered ② and the second diffraction conductive paths 344 numbered ④, and the corresponding position of the diffractive element 30 is also fractured. Thus, whether the diffractive element 30 is fractured and the specific fracture position may be accurately detected through the crisscrossed manner of arranging the plurality of first diffraction conductive paths 343 and the second plurality of diffraction conductive paths 344.

Similarly, metal contacts may be provided on the peripheral wall of the diffractive element 30. The metal contacts are coupled to the diffraction input end 341 and the diffraction output end 342 of each of the plurality of diffraction conductive paths 34. Metal contacts may be also provided on the surface of the second connecting board 63 that is in contact with each of the plurality of diffraction input end 341s or the plurality of diffraction output ends 342. After the second connecting board 63 extends into the accommodating cavity 54 through the annular connecting hole 5123, the metal contacts on the second connecting board 63 may contact the metal contacts on the peripheral wall of the diffractive element 30 to realize the electrical connection between each of the plurality of diffraction input ends 341 or the plurality of diffraction output ends 342 and the processor 40. Further, a sealant may be filled in the annular connection hole 5123 to fix the second connecting board 63 such that the metal contacts on the second connection board 63 may be in stable contact with the metal contacts on the peripheral wall of the diffractive element 30.

In some embodiments, when the detection element is the transparent collimation conductive film 21, the transparent collimation conductive film 21 may also be a single-layer bridge structure. The transparent collimation conductive film 21 having the single-layer bridge structure is similar to the transparent diffraction conductive film 31 having the single-layer bridge structure and disposed on the diffractive element 30. The mechanism of detecting whether the collimating element 20 is fractured through the transparent collimation conductive film 21 having the single-layer bridge structure is similar to the mechanism of detecting whether the diffractive element 30 is fractured through the transparent diffraction conductive film 31 having the single-layer bridge structure, and the details will not be repeated herein.

In some embodiments, when the detection element is the plurality of collimation conductive particles 23, the plurality of collimation conductive particles 23 may also form a plurality of first collimation conductive paths and a plurality of second collimation conductive paths. Under this case, the mechanism of determining whether the collimating element 20 is fractured through the collimation conductive particles 23 is similar to the mechanism of determining whether the diffractive element 30 is fractured through the plurality of first diffraction conductive paths 343 and the plurality of second diffraction conductive paths 344 formed by the plurality of diffraction conductive particles 33, and the details will not be repeated herein.

In some embodiments, when the detection element is the transparent diffraction conductive film 31, the transparent diffraction conductive film 31 may be a single-layer structure. The transparent diffraction conductive film 31 having the single-layer structure is similar to the transparent collimation conductive film 21 having the single-layer structure and provided on the collimating element 20. The mechanism of detecting whether the diffractive element 30 is fractured through the transparent diffraction conductive film 31 having the single-layer structure is similar to the mechanism of detecting whether the collimating element 20 is fractured through the transparent collimation conductive film 21 having the single-layer structure, and the details will not be repeated herein.

In some embodiments, when the detection element is the plurality of diffraction conductive particles 33, the plurality of diffraction conductive particles 33 may also form a plurality of diffraction conductive paths 34 that are mutually crisscrossed and insulated. At this time, the mechanism for determining whether the diffractive element 30 is fractured by the plurality of diffraction conductive particles is similar to the mechanism for determining whether the collimating element 20 by the plurality of collimation conductive particles 23 forming a plurality of mutually crisscrossed and insulated collimation conductive paths 24, and the details will not be repeated herein.

In some embodiments, the collimating element 20 and the diffractive element 30 both may be provided with the detection element. The detection element on the collimating element 20 may be the transparent collimation conductive film 21 or the plurality of collimation conductive particles 23. The detection element on the diffractive element 30 may be the transparent diffraction conductive film 31 or the plurality of diffraction conductive particles 33. In this way, the processor 40 may simultaneously detect the fracture of the collimating element 20 and the diffractive element 30, thereby avoiding the problem that if any of the collimating element 20 and the diffractive element 30 is fractured, the laser energy emitted will be too strong to endanger the user's eyes.

Referring to FIG. 91, in some embodiments, the laser emitter 10 may be an edge-emitting laser (EEL). In detail, the laser emitter 10 may be a distributed feedback laser (DFB). Under this case, the light-emitting surface 11 of the laser emitter 10 faces the collimating element 20. The distributed feedback laser has a small temperature drift and is a single-point light-emitting structure, such that it is not necessary to design an array structure, and the manufacture of the edge-emitting laser is sample, and thus the cost of the laser projection module 100 is low.

Referring to FIGS. 91 and 31, in some embodiments, the laser emitter 10 may be an edge-emitting laser. Under this case, the laser projection module 100 further includes a fixing member. In detail, the laser emitter 10 is a columnar. One end surface of the laser emitter 10, which is away from the substrate 64, forms a light-emitting surface 11. The laser light is emitted from the light-emitting surface 11 facing the collimating element 20. The laser emitter 10 is fixed to the substrate 64. The fixing member may be the sealant 15 and the laser emitter 10 is attached to the substrate 64 by the sealant 15. For example, another end surface of the laser emitter 10, which is opposite to the light-emitting surface 11, is attached to the substrate 64. Referring to FIGS. 91 and 32, the connecting surface 12 of the laser emitter 10 may also be attached to the substrate 64. The sealant 15 encloses the connecting surface 12, and one or more surfaces of the connecting surface 12 may be attached to the substrate 64. The sealant 15 may be a thermal conductive adhesive to transfer heat generated by the operation of the laser emitter 10 to the substrate 64. Since the edge-emitting laser is generally in the form of a thin strip, when the light-emitting surface 11 of the edge-emitting laser faces the collimating element 20, the edge-emitting laser is vertically placed. At this time, the edge-emitting laser is prone to accidents such as dropping, shifting, or shaking, which may be avoided by fixing the edge-emitting laser by the sealant 15.

Referring to FIGS. 91 and 33, in some embodiments, the fixing member may also be an elastic support member 16. There are two or more support members 16. The plurality of support members 16 collectively forms an accommodating space 160. The accommodating space 160 is configured to accommodate the laser emitter 10, and the plurality of support members 16 supports the laser emitter 10, so that the laser emitter 10 may be prevented from shaking.

Further, as illustrated in FIG. 91, the substrate 64 is provided with a heat dissipation hole 641. The heat dissipation hole 641 may be filled with a thermal conductive adhesive to dissipate heat from the laser emitter 10.

Moreover, in some embodiments, the substrate 64 may be omitted, and the laser emitter 10 is carried directly on the first connecting board 61. In this way, the thickness of the laser projection module 100 may be reduced.

With the laser projection module 100, the depth camera 1000, and the electronic device 3000, provided in the embodiments of the present disclosure, by disposing the detection element on the optical assembly 80, and employing the bendable circuit board to realize the electrically coupling between the detection element and the processor 40, thus the processor 40 may obtain the electrical signal output by the detection element, and determine whether the optical assembly 80 is fractured according to the electrical signal. When it is detected that the optical assembly 80 is fractured, it may turn off the laser emitter 10 in time, or reduce the power of the laser emitter 10 in time, such that the user's eyes may be protected from the high energy of the laser light projected by the fractured optical assembly 80, thereby improving the safety of the laser projection module 100 in use.

Although embodiments of the present disclosure have been illustrated and described above, it should be understood that, the above embodiments are exemplary, and it would be appreciated by those skilled in the art that the above embodiments may not be construed to limit the present disclosure, and changes, alternatives, and modifications may be made in the embodiments without departing from scope of the present disclosure.

What is claimed is:

1. A laser projection module, comprising:
a laser emitter, configured to emit laser light;
an optical assembly, wherein the laser light passes through the optical assembly to form a laser pattern, comprising: a collimating element, configured to collimate the laser light; and a diffractive element, configured to diffract the laser light collimated by the collimating element to form the laser pattern, wherein the diffractive element is provided with a transparent conductive film, a plurality of conductive electrodes is disposed on the transparent conductive film, and the plurality of conductive electrodes is configured to output an electrical signal after being energized; and
a processor coupled to the plurality of conductive electrodes, the processor is configured to obtain the electrical signal, to determine whether the electrical signal is within a preset range, and to determine fracture of the diffractive element in response to the electrical signal being not within the preset range;
wherein the diffractive element comprises a diffractive incident surface and a diffractive exit surface which are opposed, and the transparent conductive film is disposed on the diffractive incident surface or on the diffractive exit surface;
wherein, the plurality of conductive electrodes comprises a plurality of first diffraction conductive electrodes arranged in parallel, a plurality of second diffraction conductive electrodes arranged in parallel, and a plurality of bridging diffraction conductive electrodes;
wherein each of the plurality of first diffraction conductive electrodes is continuous without interruption;
wherein each of the plurality of second diffraction conductive electrodes is interrupted with the plurality of first diffraction conductive electrodes at crisscross points, and insulated from the plurality of first diffraction conductive electrodes;
wherein each of the plurality of bridging diffraction conductive electrodes is coupled to a corresponding and interrupted second diffraction conductive electrode at breakpoints;
wherein a diffraction insulator is provided at a crisscross position between the bridging diffraction conductive electrode and the first diffraction conductive electrode; and
wherein both ends of each of the plurality of first diffraction conductive electrodes are coupled to the processor to form a conductive loop, and both ends of each of the plurality of second diffraction conductive electrodes are coupled to the processor to form a conductive loop.

2. The module of claim 1, further comprising:
a substrate assembly comprising a substrate and a circuit board carried on the substrate, wherein the circuit board is provided with a via, and the laser emitter is carried on the substrate and accommodated in the via;
a lens barrel provided with an accommodating cavity, wherein the lens barrel comprises a first top wall and a first annular peripheral wall extending from the first top wall, the first peripheral wall is disposed on the circuit board, the first top wall is provided with a through hole communicating with the accommodating cavity, and the collimating element is accommodated in the accommodating cavity; and
a protective cover disposed on the first top wall, wherein the protective cover comprises a second top wall having a through hole for emitting and a second annular peripheral wall extending from the second top wall, the diffractive element is carried on the first top wall and accommodated in the protective cover.

3. The module of claim 1, wherein the optical assembly is disposed on an outgoing optical path of the laser emitter, and the optical assembly is provided with a detection element; and
the laser projection module further comprises:
a circuit board assembly, comprising a circuit board and a conductive element, wherein the detection element is electrically coupled to the circuit board by the conductive element, the laser emitter is disposed on the circuit board assembly; and
a processor coupled to the circuit board; the processor being configured to receive an electrical signal output by the detection element to determine whether the optical assembly is fractured;
wherein the module further comprises a lens barrel, wherein the lens barrel is disposed on the circuit board and encloses an accommodating cavity with the circuit board, the laser emitter is accommodated in the accommodating cavity, the optical assembly comprises a diffractive element and a collimating element accommodated in the accommodating cavity, and the collimating element and the diffractive element are sequentially disposed along the outgoing optical path of the laser emitter.

4. The module of claim 3, wherein the circuit board assembly comprises a plurality of conductive elements, the detection element comprises a transparent diffraction conductive film disposed on the diffractive element, a diffraction conductive electrode is disposed on the transparent diffraction conductive film, the diffraction conductive electrode comprises a diffraction input end and a diffraction output end, the diffraction input end is coupled to the circuit board through one of the plurality of conductive elements, and the diffraction output end is coupled to the circuit board by another one of the plurality of conductive elements; or
the circuit board assembly comprises a plurality of conductive elements, the detection element comprises diffraction conductive particles doped in the diffractive element, the diffraction conductive particles form a diffraction conductive path, the diffraction conductive path comprises a diffraction input end and a diffraction output end, the diffraction input end is coupled to the circuit board through one of the plurality of conductive elements, and the diffraction output end is coupled to the circuit board by another one of the plurality of conductive elements.

5. The module of claim 4, wherein the plurality of conductive elements are attached to an inner surface of a peripheral wall of the lens barrel, one end of each of the plurality of conductive elements is electrically coupled to the diffraction input end or the diffraction output end, and the other end is electrically coupled to the circuit board; or
  a peripheral wall of the lens barrel is provided with an annular hole in an axial direction, the plurality of conductive elements are disposed in the annular hole, and one end of each of the plurality of conductive elements is electrically coupled to the diffraction input end or the diffraction output end, and the other end is electrically coupled to the circuit board; or
  a peripheral wall of the lens barrel is provided with a plurality of grooves corresponding to the plurality of conductive elements, the plurality of conductive elements are disposed in the plurality of corresponding grooves, one end of each of the plurality of conductive elements is electrically coupled to the diffraction input end or the diffraction output end, and the other end is electrically coupled to the circuit board.

6. The module of claim 3, wherein the laser emitter comprises an edge-emitting laser, the edge-emitting laser comprises a light-emitting surface, and the light-emitting surface faces the collimating element.

7. The module of claim 6, further comprising a fixing member, wherein the circuit board assembly further comprises a substrate, the circuit board is carried on the substrate, and the fixing member is configured to fix the edge-emitting laser on the substrate,
  wherein the fixing member comprises a sealant disposed between the edge-emitting laser and the circuit board and comprising a thermal conductive adhesive, or
  wherein the fixing member comprises at least two elastic support members disposed on the circuit board assembly, the at least two support members collectively form an accommodating space for accommodating the laser emitter, and the at least two support members are configured to support the laser emitter.

8. An electronic device, comprising:
  a laser projection module comprising:
  a laser emitter, configured to emit laser light;
  an optical assembly, wherein the laser light passes through the optical assembly to form a laser pattern, wherein the optical assembly comprises: a collimating element, configured to collimate the laser light; and a diffractive element, configured to diffract the laser light collimated by the collimating element to form the laser pattern, wherein the diffractive element is provided with a transparent conductive film, a plurality of conductive electrodes is disposed on the transparent conductive film, and the plurality of conductive electrodes is configured to output an electrical signal after being energized;
  an image collector, configured to collect the laser pattern projected by the laser projection module into a target space; and
  a processor, configured to obtain the electrical signal, to determine whether the electrical signal is within a preset range, and to determine fracture of the diffractive element in response to the electrical signal being not within the preset range, and to process the laser pattern to obtain a depth image;
  wherein the diffractive element comprises a diffractive incident surface and a diffractive exit surface which are opposed, and the transparent conductive film is disposed on the diffractive incident surface or on the diffractive exit surface;
  wherein the plurality of conductive electrodes comprises a plurality of first diffraction conductive electrodes arranged in parallel, a plurality of second diffraction conductive electrodes arranged in parallel, and a plurality of bridging diffraction conductive electrodes;
  wherein each of the plurality of first diffraction conductive electrodes is continuous without interruption;
  wherein each of the plurality of second diffraction conductive electrodes is interrupted with the plurality of first diffraction conductive electrodes at crisscross points, and insulated from the plurality of first diffraction conductive electrodes;
  wherein each of the plurality of bridging diffraction conductive electrodes is coupled to a corresponding and interrupted second diffraction conductive electrode at breakpoints;
  wherein a diffraction insulator is provided at a crisscross position between the bridging diffraction conductive electrode and the first diffraction conductive electrode; and
  wherein both ends of each of the plurality of first diffraction conductive electrodes are coupled to the processor to form a conductive loop, and both ends of each of the plurality of second diffraction conductive electrodes are coupled to the processor to form a conductive loop.

9. A method for detecting a fracture of a laser projection module, wherein the laser projection module comprises a laser emitter, a collimating element and a diffractive element, the laser emitter is configured to emit laser light, the collimating element is configured to collimate the laser light, the diffractive element is configured to diffract the laser light collimated by the collimating element to form a laser pattern;
  a transparent conductive film is formed on the diffractive element, and a plurality of conductive electrodes is disposed on the transparent conductive film, and the plurality of conductive electrodes is configured to output an electrical signal after being energized;
  wherein the diffractive element comprises a diffractive incident surface and a diffractive exit surface which are opposed, and the transparent conductive film is disposed on the diffractive incident surface or on the diffractive exit surface;
  wherein the plurality of conductive electrodes comprises a plurality of first diffraction conductive electrodes arranged in parallel, a plurality of second diffraction conductive electrodes arranged in parallel, and a plurality of bridging diffraction conductive electrodes,
  each of the plurality of first diffraction conductive electrodes is continuous without interruption,
  each of the plurality of second diffraction conductive electrodes is interrupted with the plurality of first diffraction conductive electrodes at crisscross points, and insulated from the plurality of first diffraction conductive electrodes;
  each of the plurality of bridging diffraction conductive electrodes is coupled to a corresponding and interrupted second diffraction conductive electrode at breakpoints;
  a diffraction insulator is provided at a crisscross position between the bridging diffraction conductive electrode and the first diffraction conductive electrode; and both ends of each of the plurality of first diffraction conductive electrodes are coupled to a processor to form a conductive loop, and both ends of each of the plurality of second diffraction conductive electrodes are coupled to the processor to form a conductive loop,
the method comprises:
- obtaining a plurality of electrical signal outputs by the conductive electrodes after being energized;
- determining whether each of the plurality of electrical signals is within a preset range; and
- determining the fracture of the diffractive element in response to at least one of the plurality of electrical signals being not within the preset range;

wherein in response to two or more of the plurality of electrical signals being not within the preset range, determining whether the conductive electrodes corresponding to the two or more of the plurality of electrical signals are crisscrossed;

wherein in response to that the conductive electrodes corresponding to the two or more of the plurality of electrical signals are crisscrossed, determining a position of the fracture based on the conductive electrodes corresponding to the two or more of the plurality of electrical signals.

* * * * *